(12) United States Patent
Tang et al.

(10) Patent No.: US 10,587,247 B2
(45) Date of Patent: Mar. 10, 2020

(54) DUTY CYCLE AND VOX CORRECTION FOR COMPLEMENTARY SIGNALS

(71) Applicant: SanDisk Technologies LLC, Plano, TX (US)

(72) Inventors: Tianyu Tang, Milpitas, CA (US); Venkatesh Ramachandra, San Jose, CA (US); Srinivas Rajendra, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/875,519

(22) Filed: Jan. 19, 2018

(65) Prior Publication Data

US 2019/0109585 A1  Apr. 11, 2019

Related U.S. Application Data

(60) Provisional application No. 62/571,109, filed on Oct. 11, 2017.

(51) Int. Cl.
*H03K 3/017* (2006.01)
*H03K 17/687* (2006.01)
*H03M 1/66* (2006.01)

(52) U.S. Cl.
CPC ........... *H03K 3/017* (2013.01); *H03K 17/687* (2013.01); *H03K 17/6871* (2013.01); *H03M 1/66* (2013.01)

(58) Field of Classification Search
CPC ........ H03K 3/017; H03K 17/687; H03M 1/66
USPC .......................................................... 327/109
See application file for complete search history.

(56) References Cited

U.S. PATENT DOCUMENTS

| 6,798,248 | B2 | 9/2004 | Hazucha et al. |
| 7,570,094 | B2 * | 8/2009 | Mnich .................. H03K 5/1565 327/175 |
| 8,513,997 | B2 | 8/2013 | Hesen et al. |
| 8,773,186 | B1 * | 7/2014 | Liou .................... H03K 5/1565 327/172 |
| 9,054,578 | B2 | 6/2015 | Hsieh |
| 9,099,990 | B2 | 8/2015 | Hsu et al. |
| 9,154,148 | B2 * | 10/2015 | Schafferer ............... H03M 1/06 |
| 9,236,853 | B2 | 1/2016 | Walker |
| 9,275,706 | B2 | 3/2016 | Tam |
| 9,673,793 | B2 | 6/2017 | Ma |

(Continued)

OTHER PUBLICATIONS

International Search Report and Written Opinion for corresponding application No. PCT/US2018/053090 dated Jan. 31, 2019 (16 pages).

*Primary Examiner* — Dinh T Le
(74) *Attorney, Agent, or Firm* — Foley & Lardner LLP

(57) ABSTRACT

A correction system is configured to correct for duty cycle distortion and/or cross-point distortion in a pair of sample signals. A slope adjustment circuit is configured to generate a plurality of pairs of intermediate signals according to a plurality of drive strengths. A measurement circuit is configured to measure for duty cycle distortion and/or cross-point distortion, and the slope adjustment circuit is configured to set the plurality of drive strengths based on the measurement. The setting of the drive strengths may reduce certain rising and falling slopes of certain transitions of the plurality of intermediate signals, which in turn may reduce duty cycle distortion and/or cross-point distortion in the sample signals.

21 Claims, 21 Drawing Sheets

(56) References Cited

U.S. PATENT DOCUMENTS

| | | | |
|---|---|---|---|
| 9,805,773 B1* | 10/2017 | Shi | G11C 7/10 |
| 2003/0111705 A1 | 6/2003 | Seo | |
| 2004/0135608 A1 | 7/2004 | Pillay et al. | |
| 2005/0174156 A1 | 8/2005 | Wu et al. | |
| 2008/0315929 A1 | 12/2008 | Mnich | |
| 2010/0301913 A1 | 12/2010 | Li et al. | |
| 2012/0081163 A1 | 4/2012 | Hesen et al. | |
| 2013/0076395 A1 | 3/2013 | Kim | |
| 2014/0002158 A1 | 1/2014 | Shi et al. | |
| 2017/0179956 A1 | 6/2017 | Lee et al. | |
| 2019/0109584 A1* | 4/2019 | Tang | H03K 3/017 |

* cited by examiner

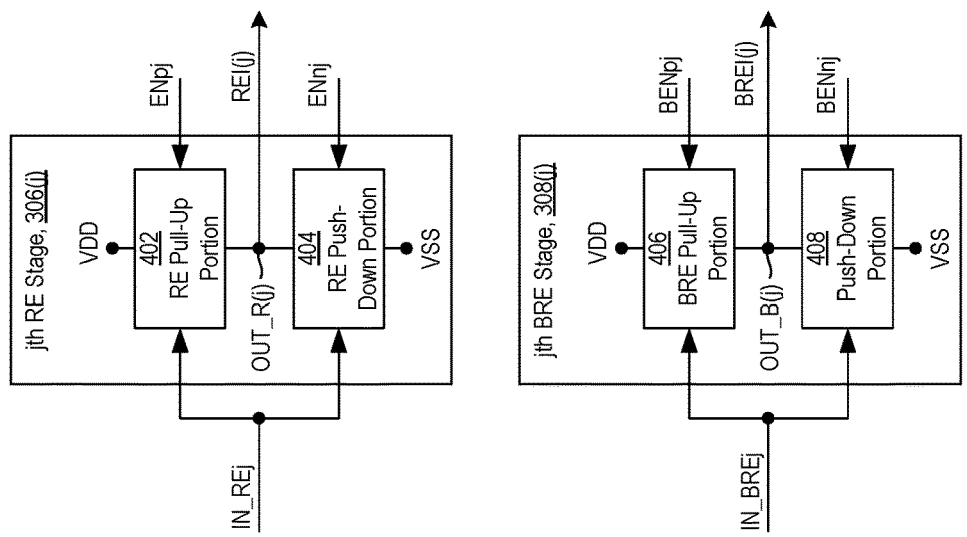
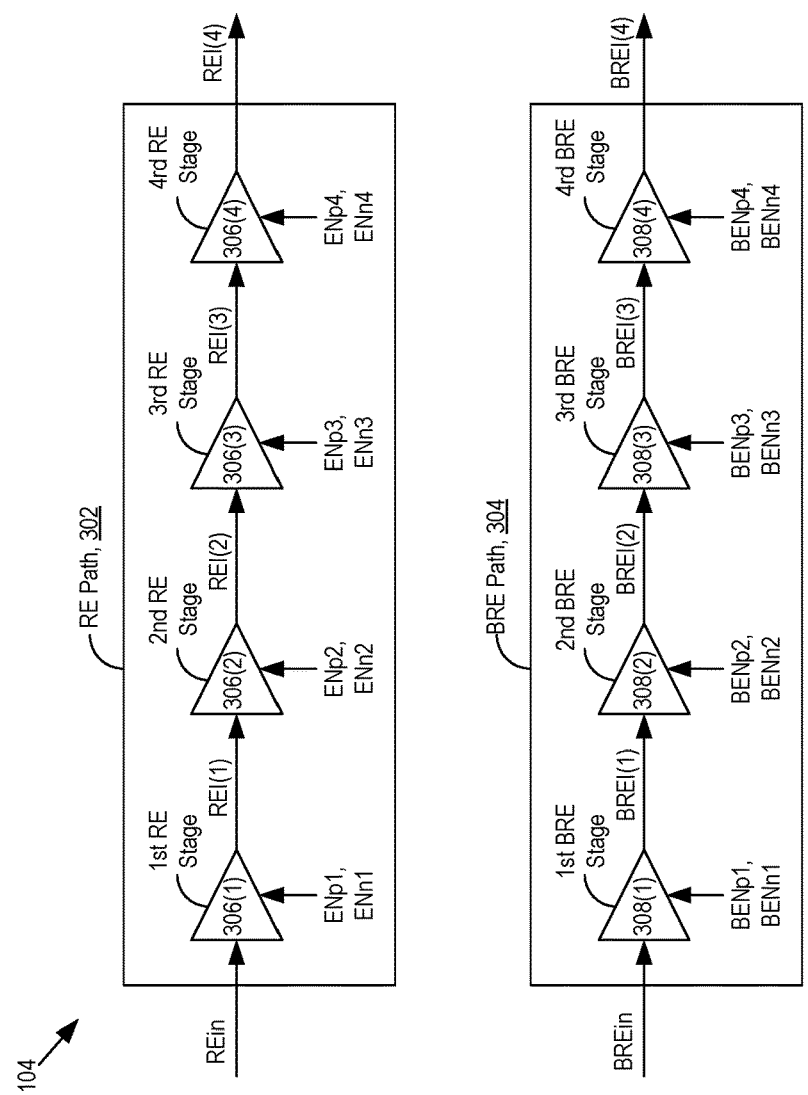
FIG. 4
FIG. 3

Duty cycle distortion before slope reduction

Slope reduction performed generating the intermediate signals REI, BREI

Duty cycle distortion eliminated after slope reduction

US 10,587,247 B2

DUTY CYCLE AND VOX CORRECTION FOR COMPLEMENTARY SIGNALS

CROSS-REFERENCE TO RELATED APPLICATIONS

This application claims the benefit of U.S. Provisional Application No. 62/571,109, filed Oct. 11, 2017. The contents of U.S. Provisional Application No. 62/571,109 are incorporated by reference in their entirety.

BACKGROUND

In memory applications, a storage device may include a controller that sends a complementary pair of clock signals to a memory die in order to read data from the memory die. In response to the clock signals, the memory die may align data pulses of data signals to the edges of the clock signals and send the aligned data signals along with clocks signals back to the controller. The controller may then process the data signals using the clock signals.

Typically, the clocks signals have a 50% duty cycle. In an ideal situation, the controller generates the clock signals with the 50% duty cycle, and the duty cycle remains at 50% throughout the read process. That is, the memory die retrieving the data for the controller receives the clock signals with the 50% duty cycle, maintains the duty cycle at 50% while aligning the data, and transmits the clocks signals with a 50% duty cycle back to the controller.

However, in actual implementation, due to process-voltage-temperature (PVT) variations and silicon interface impact between the controller die and the memory die, the controller may not generate the clock signals with a 50% duty cycle and/or the duty cycle of clocks signals may shift away from the 50% duty cycle when the memory die aligns the data with the clock signals. Consequently, data valid window generated by these non-50% duty clock signals may shrink such that when the controller receives the data signals and the clock signals from the memory die, the controller may make errors in latching the data. For example, if the clock signals and the data signals are not properly aligned, the controller may miss sampling certain data pulses while sampling others twice. In addition or alternatively, if the duty cycle is sufficiently far from 50%, the controller's resistor-capacitor (RC) components may filter out or attenuate the edges of the clock signals. In turn, the controller may miss sampling certain data pulses because it failed to recognize a clock edge as occurring. In view of the errors that can result when the clock signals are generated away from 50% and/or when the duty cycle shifts away from 50% during data retrieval processes, duty cycle correction schemes that correct the duty cycle and move the duty cycle back to 50% are desirable for high speed data transfer.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 3 is a block diagram of an example configuration of a slope adjustment circuit of the example duty cycle correction circuit of FIG. 1.

FIG. 4 is a block diagram of an example RE stage and an example BRE stage of the configuration of FIG. 3.

DETAILED DESCRIPTION

Overview

Figure 1:
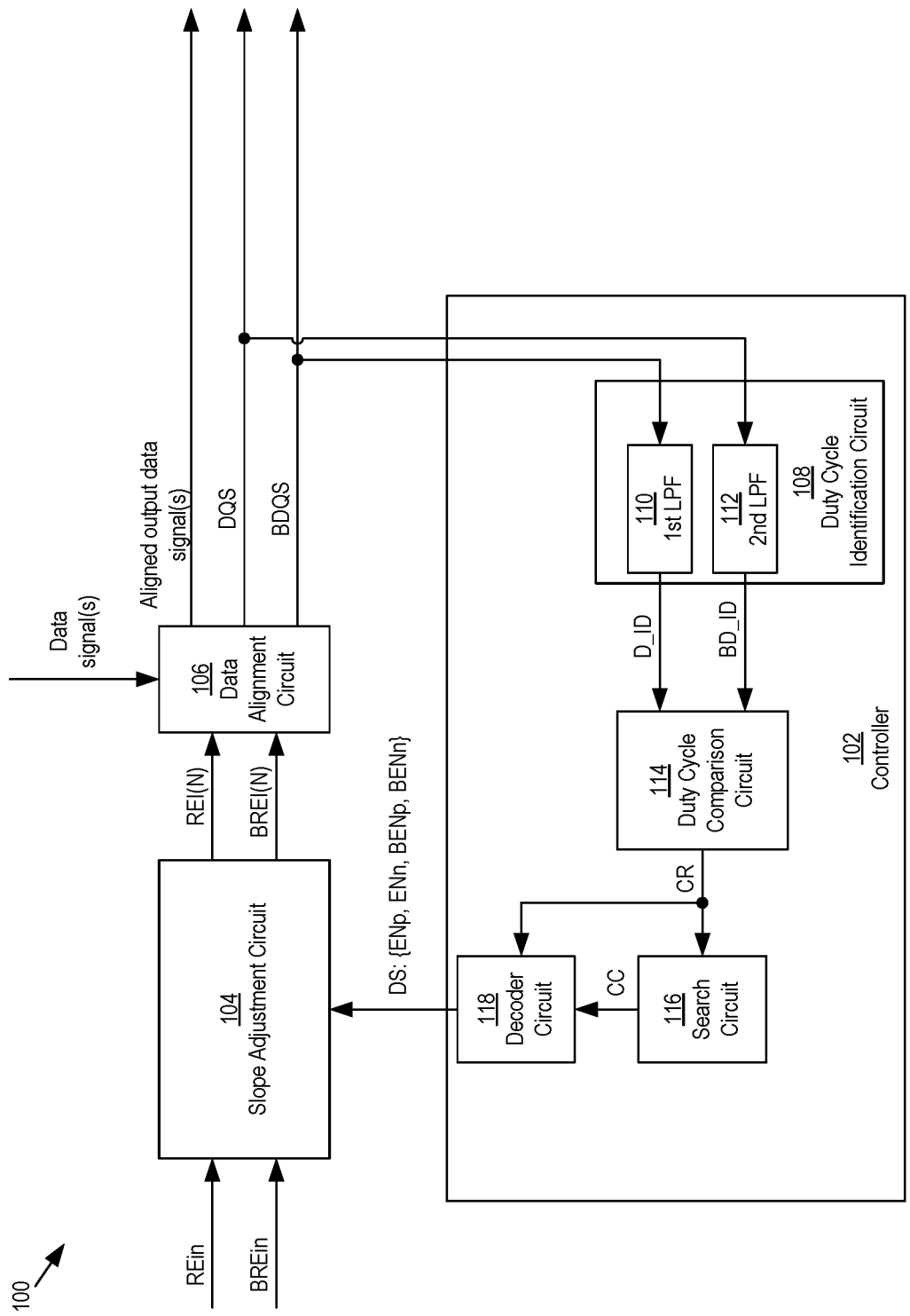
FIG. 1 is a block diagram of an example duty cycle correction circuit.

The following embodiments describe various apparatuses, devices, systems, circuits, and methods for performing duty cycle correction and/or cross-point correction. In one embodiment, a circuit includes a complementary signal path circuit and a control circuit. The complementary signal path circuit is configured to receive a pair of complementary input signals and generate a pair of complementary output signals. Additionally, the complementary signal path circuit includes: a plurality of pairs of circuit stages, wherein each pair of circuit stages is configured to generate a respective one of a plurality of pairs of complementary intermediate signals. The control circuit is configured to measure a cross-point distortion of a pair of complementary sample signals, and in response to the measurement, set drive strengths of the plurality of pairs of circuit stages.

In some embodiments, the control circuit is further configured to: in response to the measurement of the cross-point distortion, select a target drive strength value from among a plurality of drive strength values, where the target drive strength value indicates a plurality of drive strength amounts, and set each pair of circuit stages of the plurality of pairs of circuit stages to a respective one of the plurality of drive strength amounts indicated by the drive strength value.

In some embodiments, the control circuit is further configured to: set each pair of circuit stages of the plurality of pairs of circuit stages also to an initial drive strength amount, where each of the plurality of drive strength amounts indicated by the drive strength value is lower than the initial drive strength amount.

In some embodiments, the target drive strength value corresponds to a digital-to-analog converter (DAC) code indicating whether to activate or deactivate each of a plurality of branches of the set of circuit stages.

In some embodiments, branches of the circuit stages of the plurality of pairs of circuit stages comprise a binary-weighted configuration.

In some embodiments, a circuit stage of the plurality of pairs of circuit stages comprises a plurality of drive strength sub-branches and a plurality of stability sub-branches. A respective stability sub-branch is configured to bias a respective drive strength sub-branch in response to an associated drive strength sub-signal output at a level to deactivate the drive strength sub-branch.

In some embodiments, a circuit stage of the plurality of pairs of circuit stages includes: a plurality of drive strength transistors configured to set a pull-up drive strength of a pull-up portion of the circuit stage or a push-down drive strength of a push-down portion of the circuit stage; and a plurality of input transistors connected in parallel with each other, where the plurality of input transistors is configured to receive an input signal of the complementary input signals or an intermediate signal of the plurality of pairs of complementary intermediate signals, and where a length of a first physical connection that connects together terminals of the plurality of drive strength transistors is shorter than a length of a second physical connection that connects together terminals of the plurality of drive strength transistors.

In some embodiments, the pair of complementary sample signals includes the pair of complementary output signals.

In another embodiment, a system includes an output circuit, a measurement circuit, a search circuit, and a plurality of pairs of digital-to-analog converter (DAC) circuits. The output circuit is configured to generate a pair of output signals based on a plurality of intermediate signals. The measurement circuit is configured to measure a cross-point distortion of a plurality of complementary output signals during a predetermined number of iterations. The search circuit is configured to search through an array of digital-to-analog converter (DAC) codes in response to the cross-point distortion during the predetermined number of iterations. The plurality of pairs of DAC circuits is configured to: generate the plurality of intermediate signals, and during the predetermined number of iterations, adjust slopes of rising and falling transitions of the plurality of intermediate signals in response to the searching through the array of DAC codes.

In some embodiments, the measurement circuit is further configured to measure the cross-point distortion of the pair of complementary output signals a predetermined number of times over the predetermined number of iterations, and the search circuit is further configured to select a new one of a plurality of target DAC codes from the array of DAC codes in each of the predetermined number of iterations in response to a respective measurement of the cross-point distortion.

In some embodiments, the plurality of pairs of DAC circuits are configured to adjust the drive strengths in increasingly smaller amounts in response to each selection of the plurality of target DAC codes.

In some embodiments, each of the plurality of DAC codes comprises a respective plurality of portions, wherein each portion indicates a drive strength amount for a corresponding pair of DAC circuits. In addition, the plurality of DAC codes comprises a first set of DAC codes and a second set of DAC codes, where each of the DAC codes of the first set comprises respective portions that all indicate the same drive strength amount, and wherein each of the DAC codes of the second set comprises at least two respective portions that indicate different drive strength amounts. Also, the search circuit is further configured to: select a first number of the plurality of target DAC codes from the first set of DAC codes in a first number of the predetermined number of iterations, and select a second number of the plurality of DAC codes from the second set of DAC codes in a second number of the predetermined number of iterations.

In some embodiments, the first number of the predetermined number of iterations is greater than the second number of the predetermined number of iterations.

In some embodiments, the search circuit is further configured to in response to an initial measurement of the cross-point distortion, begin selecting target DAC codes from among the array of DAC codes in a selection direction corresponding to decreasing drive strength amounts.

In another embodiment, a circuit includes a slope adjustment circuit that includes a plurality of portions configured to generate a plurality of pairs of intermediate signals, where each portion of the plurality of portions comprising a pull-up portion or a push-down portion. Also, the plurality of portions includes a first set of portions and a second set of portions. The first set of portions is configured to pull up and push down voltage levels of the plurality of pairs of intermediate signals with an initial drive strength amount. The second set of portions is configured to pull up and push down the voltage levels of the plurality of pairs of intermediate signals with associated reduced drive strength amounts relative to the initial drive strength amount. Further a control circuit is configured to: identify an initial polarity of a cross-point distortion in a pair of complementary sample signals, identify a configuration of the first set of portions and the second set of portions dependent on the initial polarity of the cross-point distortion, and output drive strength signals to set drive strengths of the portions of the first set to the initial drive strength amount, and to set drive strengths of the portions of the second set to the associated reduced drive strength amounts.

In some embodiments, the control circuit is further configured to: in response to an identification that the initial polarity of the cross-point distortion includes a negative polarity: identify the second set of portions as comprising: pull-up portions that are part of a first set of circuit stages, where each circuit stage of the first set of circuit stages is configured to generate an associated one of a first set of intermediate signals with an initially positive cross-point distortion; and push-down portions that are part of a second set of circuit stages, where each circuit stage of the second set of circuit stages is configured to generate an associated one of a second set of intermediate signals with an initially negative cross-point distortion.

In some embodiments, the control circuit is further configured to: in response to an identification that the initial polarity of the cross-point distortion comprises a positive polarity: identify the second set of portions as comprising: push-down portions that are part of first set of circuit stages, where each circuit stage of the first set of circuit stages is configured to generate an associated one of a first set of intermediate signals with an initially negative cross-point distortion; and pull-up portions that are part of a second set of circuit stages, where each circuit stage of the second set of circuit stages is configured to generate an associated one of a second set of intermediate signals with an initially positive cross-point distortion.

In some embodiments, a plurality of pairs of circuit stages includes the plurality of portions. The control circuit is configured to identify the first set of portions and the second set of portions further based on an identification of circuit stages configured to generate intermediate signals with cross-point distortion having a same initial polarity as the initial polarity of the cross-point distortion of the pair of complementary sample signals, and an identification of circuit stages configured to generate intermediate signals with cross-point distortion having an opposite initial polarity from the initial polarity of the cross-point distortion of the pair of complementary sample signals.

In some embodiments, each pair of circuit stages of the plurality of pairs of circuit stages includes a pair of pull-up portions and a pair of push-down portions, and the control circuit is configured to identify, for each pair of circuit stages, that an associated pair of pull-up portions is part of the first set of portions and an associated pair of push-down portions is part of the second set of portions, or an associated pair of push-down portions is part of the first set of portions and an associated set of pull-up portions is part of the second set of portions.

In some embodiments, the plurality of pairs of circuit stages includes two consecutive circuit stages of a path, where one of the consecutive circuit stages includes a pull-up portion that is part of the first set of portions and a push-down portion that is part of the second set of portions, and the other of the consecutive stages includes a push-down portion that is part of the first set of portions and a pull-up portion that is part of the second set of portions.

In some embodiments, a circuit includes: means for receiving a pair of complementary input signals; means for generating a plurality of pairs of complementary intermediate signals according to drive strengths; means for measuring cross-point distortion of a pair of complementary sample signals; and means for setting the drive strengths in response to the means for measuring the cross-point cycle distortion.

Other embodiments are possible, and each of the embodiments can be used alone or together in combination. Accordingly, various embodiments will now be described with reference to the attached drawings.

Embodiments

The present description describes various embodiments of apparatuses, devices, systems, circuits, and methods for performing duty cycle correction and/or cross-point correction. The embodiments may include or utilize a slope adjustment circuit that is configured to adjust one or more slopes of complementary signals generated in a complementary signal path. In some examples, the slope adjustment circuit is configured to adjust slopes by adjusting drive strengths of branches it uses to generate the complementary signals.

A control circuit may be configured to measure duty cycle distortion or cross-point distortion in a pair of complementary sample signals of interest. Based on the measurement, the control circuit may set drive strengths in the slope adjustment circuit. The control circuit may measure the duty cycle distortion and/or cross-point distortion, and set the drive strengths over a plurality of iterations of a duty cycle correction process and/or a cross-point correction process. Over the course of the iterations, the control circuit may set and/or adjust the drive strengths within the slope adjustment circuit, which in turn, may have the effect of reducing duty cycle distortion and/or cross-point distortion in the signal or complementary signals of interest.

As used herein, two signals of a pair are complementary in that when one of the signals is at an associated high level the other is at an associated low level. The waveforms of two complementary signals are considered to inversely track each other in that when one signal performs a rising transition, the other signal performs a falling transition. In addition or alternatively, two signals that are complementary are 180-degrees out of phase with each other or have waveforms representative of two signals that are 180-degrees out of phase with each other.

Also, as used herein, a level of a signal at a given point in time is a magnitude value, such as a voltage magnitude value or a current magnitude value. In general, a high level and a low level are both magnitude values where the high level is higher in magnitude than the low level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

In addition or alternatively, a given signal may transition between a high level and a low level according to a swing requirement that sets or identifies a minimum high level and a maximum low level. A signal that transitions according to the swing requirement may transition to a high level that is at or above the minimum high level of the swing requirement, and may transition to a low level that is at or below the maximum low level of the swing requirement.

In addition or alternatively, for a given voltage that is applied to a gate terminal of a p-channel metal-oxide-semiconductor field-effect transistor (PMOS transistor), the high level of the given voltage is a level that turns off or is capable of turning off the PMOS transistor, and the low level of the given voltage is a level that turns on or is capable of turning on the PMOS transistor. Similarly, for a given voltage that is applied to a gate terminal of an n-channel metal-oxide-semiconductor field-effect transistor (NMOS transistor), the high level of the given voltage is a level that turns on or is capable of turning on the NMOS transistor, and the low level of the given voltage is a level that turns off or is capable of turning off the NMOS transistor.

In addition, a signal may perform a rising transition when the signal transitions from its low level to its high level, and may perform a falling transition when the signal transitions from its high level to its low level. For a pair of complementary signals, when a first signal of the pair is performing a rising transition, a second signal of the pair is performing a falling transition, or in the event that the rising and falling transitions are not occurring concurrently, then the transition of the second signal that is occurring closest in time to the rising transition of the first signal is a falling transition. Similarly, when the first signal of the pair is performing a falling transition, the second signal is performing a rising transition, or in the event that the rising and falling transitions are not occurring concurrently, then the transition of the second signal that is occurring closest in time to the falling transition of the first signal is a rising transition. A rising edge of a signal's waveform denotes a rising transition, and a falling edge of a signal's waveform denotes a falling transition.

In addition, each signal may include pulses that are formed or defined by the rising and falling transitions of the signal. In particular example configurations, the pulses of a signal may correspond to the high level of a signal, in that each pulse is defined by a rising transition followed by a period where the signal is maintained at its high level, and then followed by a falling transition.

Additionally, a pair of complementary signals may perform their respective rising and falling transitions according to an associated frequency or rate. The pulses of the signals may occur according to the frequency of the signal. Each period or cycle of the signals may include a first portion and a second portion. During the first portion, a first signal of the pair is at the high level and a second signal of the pair is at the low level. During the second portion, the first signal is at the low level and the second signal is at the high level. In addition, each signal of the pair may have an associated duty cycle. As used herein, a duty cycle of a signal is the percentage or fraction of one period that the signal is at its high level. In addition or alternatively, the duty cycle of a signal is the ratio of a pulse width of a pulse in a single period of the signal to a total duration of the period.

Also, in at least some example configurations, a pair of complementary signals is a pair of clock signals. A clock signal has repetitive cycles. Within each period, the first portion occurs first in time and the second portion occurs second in time—i.e., after the first portion. After the second portion of one cycle occurs, the first portion of a next cycle occurs. As clock signals, the rising and falling edges of the signals may be used for timing purposes, such as for temporarily aligning data pulses of data signals and/or for indicating when to sample or otherwise identify levels of the data pulses, as described in further detail below.

FIG. 1 is a block diagram of an example of duty cycle correction circuit 100 may include a controller or control circuit 102 and a slope adjustment circuit (alternatively referred to as an adjustable drive strength circuit) 104. The duty cycle correction circuit 100 may further include, or alternatively be in communication with, a data alignment circuit 106. The data alignment circuit 106 may be configured to receive one or more data signals and output one or more aligned output data signals that correspond to the one or more data signals it receives. A data signal may include a series of data pulses, with each data pulse corresponding to a bit of a bit sequence. The level, such as a voltage level, of each data pulse, may correspond to and/or indicate a single bit logic value, such as a logic 1 value or a logic 0 value. Accordingly, each data pulse of the data signal may indicate whether a corresponding bit of the bit sequence represented by the data signal has a logic 1 value or a logic 0 value. Other configurations, such as those where the levels of the data pulses indicate multi-bit logic values, may be possible.

The slope adjustment circuit 104 may be configured to receive a pair of complementary input signals REin, BREin, and in response, generate one or more pairs of complementary intermediate signals REI, BREI, including a last or Nth pair of complementary intermediate signals REI(N), BREI(N). The data alignment circuit 106 may be configured to receive the Nth pair of intermediate REI(N), BREI(N), and in response, generate and output a pair of complementary output signals DQS, BDQS. In this context, the slope adjustment circuit 104 and the data alignment circuit 106 may form a complementary signal path circuit extending from the input of the slope adjustment circuit 104 to the output of the data alignment circuit 106. As a whole, the complementary signal path circuit is configured to receive the pair of complementary input signals REin, BREin, and generate the pair of complementary output signals DQS, BDQS in response to receipt of the pair of complementary input signals REin, BREin and according to a plurality of drive strengths of circuit stages of the complementary signal path circuit. In the complementary signal path, the adjustable drive strength circuit 104 generates the one or more pairs of complementary intermediate signals REI, BREI, including a last pair of intermediate signals REI(N), BREI(N), according to the drive strengths. The data alignment circuit 106 aligns the data signal(s) with the last intermediate signals REI(N), BREI(N), and outputs the output signals DQS, BDQS in response to the alignment process.

The data alignment circuit 106 may be configured to generate and output the output signals DQS, BDQS each with a respective target or predetermined duty cycle or a duty cycle that is within an acceptable range of duty cycles. The acceptable range may include and/or be centered around the predetermined duty cycle. For example, the acceptable range may be a set of duty cycles defined by the predetermined duty cycle plus-or-minus a predetermined error amount or plus-or-minus a certain percentage of the predetermined duty cycle. A duty cycle that is away from the predetermined duty cycle and/or outside of the acceptable range of duty cycles is referred to as a distorted duty cycle. Conversely, a duty cycle that is at the predetermined duty cycle or within the acceptable range of duty cycles is referred to as an undistorted duty cycle. For a given signal, an amount of duty cycle distortion of the signal is a difference between an actual duty cycle of the signal and the predetermined duty cycle.

Additionally, two complementary signals of a pair may have an amount of duty cycle mismatch, which is the difference between a duty cycle of one signal and the duty cycle of the other. A pair of complementary signals may have a target or predetermined amount of duty cycle mismatch. Where the duty cycles of the two complementary signals are the same, then the amount of duty cycle mismatch is zero. Similarly, where the predetermined duty cycles of the two complementary signals are the same, then the amount of predetermined duty cycle mismatch is zero. Two complementary signals of a pair have undistorted duty cycles when their duty cycle mismatch is at the predetermined amount of duty cycle mismatch, or within an acceptable range of duty cycle mismatch values. The acceptable range may be centered around the predetermined amount of duty cycle mismatch. For example, the acceptable range may be a set of duty cycles mismatch values defined by the predetermined duty cycle mismatch amount plus-or-minus a predetermined error amount or plus-or-minus a certain percentage of the predetermined duty cycle mismatch amount. A pair of complementary signals has undistorted duty cycles when their duty cycle mismatch is at the predetermined duty cycle mismatch amount or within the acceptable range of duty cycle mismatch. Alternatively, a pair of complementary signals has distorted duty cycles when their duty cycle mismatch deviates from the predetermined duty cycle mismatch amount or outside of the range of acceptable duty cycle mismatch values. For a given pair of complementary signals, an amount of duty cycle distortion is a difference between an actual duty cycle mismatch of the complementary signals and the predetermined duty cycle mismatch amount.

An amount of duty cycle mismatch may be an instantaneous value that indicates a difference of the instantaneous duty cycle of one signal and the instantaneous duty cycle of another signal for a single period or cycle of the signals. Alternatively, the duty cycle mismatch may be an average value that indicates a difference of an average duty cycle of one signal and the average duty cycle of another signal for a predetermined number of cycles or periods and/or over a plurality of periods or cycles occurring over a predetermined period of time.

Similarly, an amount of duty cycle distortion for a single signal may be an instantaneous value that indicates a difference of the instantaneous duty cycle of the signal for a single period or cycle and the predetermined duty cycle of the signal. Alternatively, the amount of duty cycle distortion for a single signal may be an average value that indicates a difference of the average duty cycle of the signal for a predetermined number of cycles or periods and/or over a plurality of periods or cycles occurring over a predetermined period of time. Likewise, the amount of duty cycle distortion for a pair of complementary signals may be an instantaneous value that indicates a difference of an instantaneous amount of duty cycle mismatch between the two signals and a predetermined duty cycle mismatch amount, or an average value that indicates a difference of an average amount of duty cycle mismatch between the two signals for a predetermined number of cycles or a plurality of periods or cycles occurring over a predetermined period and the predetermined duty cycle mismatch amount.

In the event that the pair of input signals REin, BREin or any of the pairs of intermediate signals REI, BREI have duty cycles that cause the pair of complementary output signals DQS, BDQS to have distorted duty cycles, the duty cycle correction circuit 100 may be configured to perform a duty cycle correction process that adjusts or modifies one or more characteristics of the complementary intermediate signals REI, BREI so that the pair of output signals DQS, BDQS are output with undistorted duty cycles. As described in further detail below, non-limiting example characteristics of the intermediate signals that are adjusted or modified may include the slopes of rising and/or falling transitions, crosspoint, or duty cycle. In some example configurations, the predetermined duty cycle is 50%, although other predetermined duty cycle percentages may be possible.

Figure 2A:
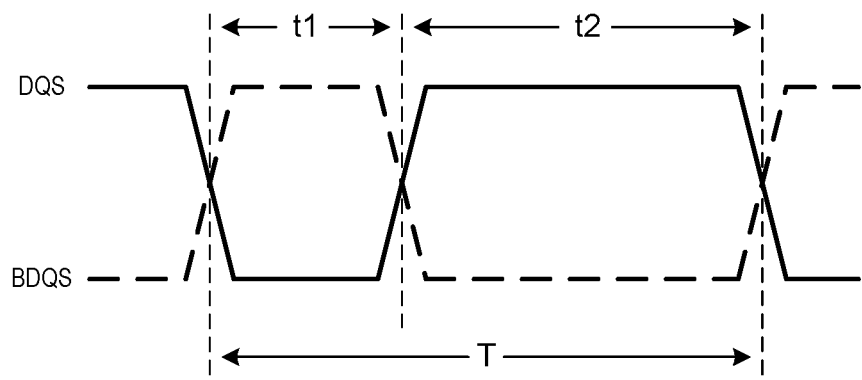
FIG. 2A shows a timing diagram of a pair of complementary output signals having duty cycle distortion.
Figure 2B:
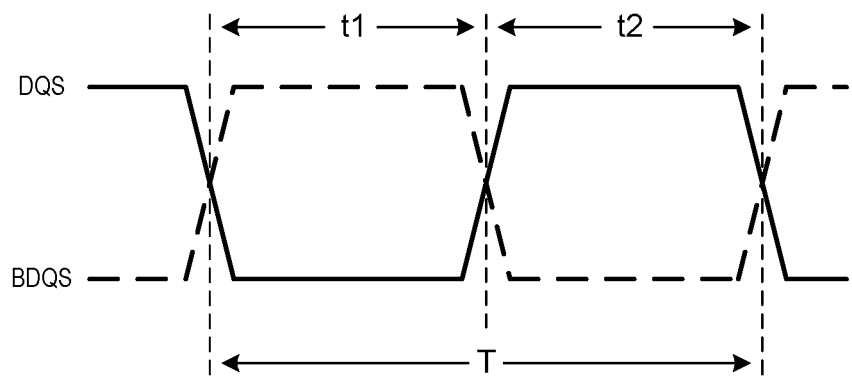
FIG. 2B shows a timing diagram of the pair of complementary output signals having no duty cycle distortion.

FIG. 2A shows a timing diagram of the pair of complementary output signals DQS, BDQS having duty cycle distortion. FIG. 2B shows a timing diagram of the pair of complementary output signals DQS, BDQS having no duty cycle distortion. The waveforms in FIG. 2A represent example waveforms of output signals DQS, BDQS at the start of an example duty cycle correction process, and the waveforms in FIG. 2B represent example waveforms of the output signals DQS, BDQS at the end of an example duty cycle correction process.

FIGS. 2A and 2B show a cycle of the output signals DQS, BDQS occurring during a total time period T, which includes a first time period portion t1 followed by a second time period portion t2. During the first time period portion t1, a first output signal DQS of the pair DQS, BDQS may be at a low level, and a second output signal BDQS of the pair DQS, BDQS may be at a high level. During the second time period portion t2, the first output signal DQS may be at a high level and the second output signal BDQS may be at a low level during a second time period t2.

FIG. 2A shows duty cycle distortion between the output signals DQS, BDQS in that the first output signal DQS is at its high voltage level for a longer time period than it is at its low voltage level, and the second output signal BDQS is at its low voltage level for a longer time period than it is at its high voltage level, which corresponds to the first output signal DQS having a higher duty cycle than the second output signal BDQS, and which corresponds to the second time period portion t2 being longer than the first time period portion t1.

In contrast, FIG. 2B shows no duty cycle distortion or duty cycle distortion having been minimized or eliminated in that for both output signals DQS, BDQS, the durations at which they are at their respective high and low levels are the same, which corresponds to each output signal DQS, BDQS having the same 50% duty cycles, and which corresponds to the first time period portion t1 and the second time period portion t2 having the same durations.

Referring back to FIG. 1, the data alignment circuit 106 may be configured to receive the last pair of intermediate signals REI(N), BREI(N) from the slope adjustment circuit 104. The data alignment circuit 106 may be configured to perform an alignment process with the last pair of intermediate signals REI(N), BREI(N) and the data signal(s) it receives such that the output data signal(s) are aligned with the pair of output signals DQS, BDQS. By being aligned, the data pulses of the output data signal(s), such as the rising and falling transitions of the data pulses, occur at certain times relative to the rising and falling transitions or edges of the pair of complementary output signals DQS, BDQS. In some example configurations, the output data signal(s) may be aligned with the pair of complementary output signals DQS, BDQS in that their rising and falling transitions occur at the same time or about the same time that the complementary output signals DQS, BDQS perform their respective rising and falling transitions. In other example configurations, the output data signal(s) may be aligned with the pair of complementary output signals DQS, BDQS in that their rising and falling transitions occur at a certain, predetermined offset relative to the times that the pair of complementary output signals DQS, BDQS perform their respective rising and falling transitions. For example, the rising and falling transitions of the data signal(s) may occur at midpoints between consecutive rising and falling transitions of the pair of complementary output signals DQS, BDQS. In other words, the data signal(s) may be delayed or phase shifted 90-degrees relative to the pulses of the pair of complementary output signals DQS, BDQS. In addition or alternatively, the data signals and the complementary output signals DQS, BDQS may be aligned in accordance with a signaling or communication scheme, such as a single data rate (SDR) or a double data rate (DDR) communication scheme. The data alignment circuit 106 may include any of various types of circuits to perform the alignment process, including logic circuitry, combinational logic circuitry, flip-flops, and multiplexers, as non-limiting examples.

The controller 102 may be a feedback circuit that forms a feedback path for the slope adjustment circuit 104 and the data alignment circuit 106. As shown in FIG. 1, the controller 102 may be coupled to the output of the data alignment circuit 106 and be configured to receive the complementary output signals DQS, BDQS. In response to receipt of the complementary output signals DQS, BDQS, the controller 102 may be configured to perform a duty cycle correction process, which includes determining or measuring duty cycle distortion in the pair of output signals DQS, BDQS by measuring or detecting a duty cycle mismatch between the complementary output signals DQS, BDQS. Based on or in response to the measured or detected duty cycle distortion or mismatch, the controller 102 may be configured to set, control, and/or adjust drive strengths of stages of the slope adjustment circuit 104, as described in further detail below. The controller 102 may set, control, and/or adjust the drive strengths of the stages by determining a control code CC and outputting drive strength signals ENp, ENn, BENp, BENn, collectively referred to as drive strength signals DS, to the slope adjustment circuit 104 according to and/or at levels corresponding to the control code CC. In response to receipt of the drive strength signals DS, the slope adjustment circuit 104 may set, maintain, and/or adjust drive strengths of its internal circuit components used to generate the intermediate signals REI, BREI. As described in further detail below, the slope adjustment circuit 104, in response to adjusting its drive strength(s), may cause corresponding adjustments in the duty cycles, duty cycle mismatch, and/or duty cycle distortion of or between one or more of the intermediate signals REI, BREI and/or of or between the output signals DQS, BDQS.

For some example configurations, the slope adjustment circuit 104 is configured to include a plurality of paths, including a first or RE path and a second or BRE path. The RE path may be configured to receive the RE input signal REin, and in response, generate a plurality of RE intermediate signals REI. Collectively, the RE input signal REin and the RE intermediate signals REI may referred to as RE path signals. The BRE path may be configured to receive the BRE input signal BREin, and in response, generate a plurality of BRE intermediate signals BREI. The BRE input signal BREin and the BRE intermediate signals may be collectively referred to as BRE path signals. Additionally, each ith pair of intermediate complementary signals includes an associated RE intermediate signal REI(i) generated with the RE path and an associated BRE intermediate signal BREI(i) generated with the BRE path.

FIG. 3 shows a block diagram of an example configuration of the slope adjustment circuit 104. In the example configuration, the slope adjustment circuit 104 includes two circuit paths, including a first or RE path 302 and a second or BRE path 304. The RE signal path 302 is configured to receive the RE input signal REin, and in response, generate the RE intermediate signals REI. Similarly, the BRE signal path 304 is configured to receive the BRE input signal, and in response, generate the BRE intermediate signals BREI.

In addition, the RE path 302 and the BRE 304 path may each include a plurality or an N-number of circuit stages (or simply stages). The stages of the RE path 302 are referred to as RE stages 306, and the stages of the BRE path 304 are referred to as BRE stages 308. Additionally, in the example configuration shown in FIG. 3, the RE path 302 and the BRE path 304 each include four stages (i.e., N=4). Accordingly, the Nth pair of intermediate signals is shown in FIG. 3 as a fourth pair of intermediate signals REI(4), BREI(4). In other example configurations, numbers other than four may be possible, and in general, the number of stages in each of the RE path 302 and the BRE path 304 may be two or more. Hereafter, for clarity, the terms "last pair of intermediate signals," "Nth pair of intermediate signals," "output pair of intermediate signals" and "fourth pair of intermediate signals" are used interchangeably to refer to the pair of complementary signals output from the slope adjustment circuit 104 (or specifically the RE path 302 and the BRE path 304) to the data alignment circuit 106.

In the example configuration shown in FIG. 3, the RE stages 306 of the RE path 302 and the BRE stages 308 of the BRE path 304 are each configured as a chain of stages. Herein, the terms "path" and "chain" are interchangeably. In a given path, each of the stages has a relative or respective position with respect to the other stages in the given path, starting with a first stage that receives the input signal to the path and a last stage that outputs the output signal of the path. An input of the first stage that receives the input signal to the path may be considered an input of the path as whole, and an output of the last stage that outputs the output signal of the path may be considered an output of the path as a whole.

Also, herein, the stages in a given path are consecutively numbered—e.g., first stage, second stage, third stage, etc.— corresponding to their relative positions in a respective path. In general, the lower a stage is numbered, the closer it is positioned to the input of the path, and the higher a stage is numbered, the closer it is positioned to the output of the path. Also, the stages are numbered such that an ith stage in a given path indicates that the path includes an (i−1)-number of stages between the ith stage and the input of the path. For a given ith stage, stages that are closer to the input of a path—i.e., the (i−1)th stage and lower—are referred to as prior or upstream stages of the ith stage. Likewise, for a given ith stage, stages that are closer to the output of the path—i.e., the (i+1)th stage and higher—are referred to as subsequent or downstream stages of the ith stage. The (i−1)th stage is referred to as the immediately prior stage of the ith stage, and the (i+1)th stage is referred to as the next or immediately subsequent stage of the ith stage.

Additionally, an ith stage in a path indicates that it is the ith stage in the path to generate an intermediate signal based on the input signal to the path. Otherwise stated, for a given ith stage in a path, an (i−1)-number of stages generated and outputted respective intermediate signals based on the input signal to the path before the ith stage generated and outputted its respective ith intermediate signal. Further, except for the first stage of the given path, each ith stage has an input coupled to an output of a prior (i−1)th stage, and is configured to receive an immediately prior, (i−1)th intermediate signal of the immediately prior (i−1)th stage as its input signal, and generate an ith intermediate signal in response to receipt of the immediately prior (i−1)th intermediate signal. Also, except for the last or Nth stage of a given chain, each ith stage has an output coupled to an input of a next (i+1)th stage, and is configured to output an ith intermediate signal to the input of the next or immediately subsequent (i+1)th stage.

Accordingly, with respect to the RE path 302, a first RE stage 306(1) is configured to receive the RE input signal REin; generate a first RE intermediate signal REI(1) in response to receipt of the RE input signal REin; and output the first RE intermediate signal REI(1) to a next, second RE stage 306(2). The second RE stage 306(2) is configured to receive the first RE intermediate signal REI(1) from the first RE stage 306(1); generate a second RE intermediate signal REI(2) in response to receipt of the first RE intermediate signal REI(1); and output the second RE intermediate signal REI(2) to a third RE stage 306(3). The third RE stage 306(3) is configured to receive the second RE intermediate signal REI(2) from the second RE stage 306(2); generate a third RE intermediate signal REI(3) in response to receipt of the second RE intermediate signal REI(2); and output the third RE intermediate signal REI(3) to a fourth RE stage 306(4). The fourth RE stage 306(4) is configured to receive the third RE intermediate signal REI(3) from the third RE stage 306(3); generate a fourth RE intermediate signal REI(4) in response to receipt of the third RE intermediate signal REI(3); and output the fourth RE intermediate signal REI(4) to the data alignment circuit 106.

Similarly, with respect to the BRE path 304, a first BRE stage 308(1) is configured to receive the BRE input signal BREin; generate a first BRE intermediate signal BREI(1) in response to receipt of the BRE input signal BREin; and output the first BRE intermediate signal BREI(1) to a next, second BRE stage 308(2). The second BRE stage 308(2) is configured to receive the first BRE intermediate signal BREI(1) from the first BRE stage 308(1); generate a second BRE intermediate signal BREI(2) in response to receipt of the first BRE intermediate signal BREI(1); and output the second BRE intermediate signal BREI(2) to a third BRE stage 308(3). The third BRE stage 308(3) is configured to receive the second BRE intermediate signal BREI(2) from the second BRE stage 308(2); generate a third BRE intermediate signal BREI(3) in response to receipt of the second BRE intermediate signal BREI(2); and output the third BRE intermediate signal BREI(3) to a fourth BRE stage 308(4). The fourth RE stage 308(4) is configured to receive the third BRE intermediate signal BREI(3) from the third BRE stage 308(3); generate a fourth BRE intermediate signal BREI(4) in response to receipt of the third BRE intermediate signal BREI(3); and output the fourth BRE intermediate signal BREI(4) to the data alignment circuit 106.

Also, the stages 306, 308 in the RE and BRE paths 302, 304, respectively, are numbered such that a given ith RE stage 306(i) in the RE path 302 and a given ith BRE stage 308(i) in the BRE path 304 have the same relative position within their respective paths 302, 304. Accordingly, a given ith RE stage 306(i) and a given ith BRE stage 308(i) as an ith pair of circuits stages (or simply stages) 306(i), 308(i), and in combination, the ith pair of RE and BRE circuit stages 306(i), 308(i) may be configured to generate and output an ith pair of intermediate signals REI(i), BREI(i). In this context, the RE path 302 and the BRE path 304, in combination, include a plurality of pairs of circuit stages, where each of the pairs of circuit stages is configured to generate a respective one of a plurality of pairs of complementary intermediate signals.

Also, for some example configurations, each RE stage 306 of the RE path 302 and each BRE stage 308 of the BRE path 304 may be configured as an inverter circuit that is configured to invert its input signal to generate its associated intermediate signal. In other words, each stage may be configured to generate and output its associated intermediate signal as an inverted version of its input signal. In general, two signals generated by an inverter, where a second signal generated with the inverter is an inverted version of a first signal received with the inverter, have the same or similar waveforms as those of a pair of complementary signals. The inverter responds to the first signal at an associated high level by generating and outputting the second signal at an associated low level, and responds to the first signal at an associated low level by generating and outputting the second signal at an associated high level. Likewise, the inverter generates and outputs the second signal to have transitions that inversely track the transitions of the first signal. Accordingly, in response to receipt of the first signal performing a rising transition, the inverter generates the second signal with a falling transition. In addition, in response to receipt of the first signal performing a falling transition, the inverter generates the second signal with a rising transition. Accordingly, the second signal generated by the inverter is 180-degrees out of phase with the first signal, plus any time delay associated with the inverter.

For other example configurations, at least some of the stages are non-inverter circuits in that they generate their respective intermediate signals to directly track their respective input signals. Accordingly, in response to a receipt of a first signal at an associated high level, a non-inverter generates and outputs a second signal at an associated high level, and in response to receipt of the first signal at an associated low level, the non-inverter generates and outputs the second signal at an associated high level. Likewise, the non-inverter generates and outputs the second signal to have transitions that directly track the transitions of the first signal. Accordingly, in response to receipt of the first signal performing a rising transition, the non-inverter generates the second signal with a rising transition. In addition, in response to receipt of the first signal performing a falling transition, the non-inverter generates the second signal with a falling transition. Accordingly, the second signal generated by the non-inverter is time-shifted relative to the first signal by a time delay associated with the non-inverter, but otherwise has a phase that matches the phase of the first signal.

In addition, each RE path signal and each BRE path signal may have an associated correspondence to one of the output signals DQS, BDQS. As described in further detail below, the controller 102 may be configured to control the adjustment of the duty cycles of the RE and BRE intermediate signals REI, BREI to reduce the duty cycle distortion in the output signals DQS, BDQS based on the correspondences between the output signals DQS, BDQS and the RE and BRE path signals. The correspondences may allow the controller 102 to control the duty cycle adjustments of the RE and BRE intermediate signals REI, BREI so that the higher duty cycle of the output signals DQS, BDQS is decreased, the lower duty cycle of the output signals DQS, BDQS is increased, and duty cycle distortion is reduced. For example, in the event that the first output signal DQS has a higher duty cycle than the second output signal BDQS, the correspondences may allow the controller 102 to determine how to control the adjustment of the duty cycles of the RE and BRE intermediate signals REI, BREI so that the duty cycle of the first output signal DQS is decreased and the duty cycle of the second output signal BDQS is increased to reduce their duty cycle distortion. Similarly, in the event that the first output signal DQS has a lower duty cycle than the second output signal BDQS, the correspondences may allow the controller 102 to determine how to control the adjustment of the duty cycles of the RE and BRE intermediate signals REI, BREI so that the duty cycle of the first output signal DQS is increased and the duty cycle of the second output signal BDQS is decreased to reduce their duty cycle distortion.

The correspondences between the output signals DQS, BDQS and the RE path and BRE path signals may be based on relative duty cycle levels between given pairs of complementary signals. That is, for a given pair of complementary signals that has duty cycle distortion, a duty cycle of one of the signals of the pair may be higher than the duty cycle of the other signal of the pair. Between two given pairs of complementary signals received by or generated with the complementary signal path, the signal of a first pair having the higher duty cycle of the first pair may correspond to the signal of a second pair that has the higher duty cycle of the second pair, and the signal of the first pair having the lower duty cycle of the first pair corresponds to the signal of the second pair that has the lower duty cycle of the second pair.

For simplicity herein as a default correspondence, the RE input signal REin is considered to correspond to the first output signal DQS and the BRE input signal BREin is considered to correspond to the second output signal BDQS. Accordingly, in the event that RE input signal REin has a higher duty cycle than the BRE input signal BREin, absent duty cycle correction, the first output signal DQS would have correspondingly larger duty cycle than the second output signal BDQS. Likewise, in the event that RE input signal REin has a lower duty cycle than the BRE input signal BREin, absent duty cycle correction, the first output signal DQS would have correspondingly lower duty cycle than the second output signal BDQS. Thereafter, in the slope adjustment circuit 104, the RE and BRE intermediate signals REI, BREI may correspond to output signals DQS, BDQS based on whether the stages generating the RE and BRE intermediate signals REI, BREI are configured as inverter circuits or non-inverter circuits, and whether the prior signals received by the stages correspond to the first output signal DQS or the second output signal BDQS.

In further detail, for example configurations where a given jth stage is configured as an inverter, and where the jth stage receives a given RE or BRE path signal and generates an jth intermediate signal in response to receipt of the given RE or BRE path signal, the jth intermediate signal that the jth stage generates may correspond to the other of the output signals DQS, BDQS compared to the output signal to which the given RE or BRE path signal corresponds. For example, suppose the first RE stage 306(1) and the first BRE stage 308(1) are both configured as inverters. Given that the RE input signal REin corresponds to the first output signal DQS, the first RE intermediate signal REI(1) that the first RE stage 306(1) generates corresponds to the second output signal BDQS. Likewise, given that the BRE input signal BREin corresponds to the second output signal BDQS, the first BRE intermediate signal BREI(1) that the first BRE stage 308(1) generates corresponds to the first output signal DQS. Such a correspondence maintains the direct relationship between relative duty cycle levels of the pairs of complementary signals. For example, suppose the duty cycle of the first output signal DQS is higher than the duty cycle of the second output signal BDQS. Based on the default correspondence, the RE input signal REin would have a higher duty cycle than the duty cycle of the BRE input signal BREin. Then, based on the inverter configuration of the first RE and BRE stages 306(1), 308(1), the first RE and BRE stage 306(1), 308(1) would generate the first pair of intermediate signals REI(1), BREI(1) such that the first BRE intermediate signal BREI(1) would have the higher duty cycle, thus corresponding to the first output signal DQS, and the first RE intermediate signal REI(1) would have the lower duty cycle, thus corresponding to the second output signal BDQS.

In addition, for example configurations where a given jth stage is configured as a non-inverter, and where the jth stage receives a given RE or BRE path signal and generates a jth intermediate signal in response to receipt of the given RE or BRE path signal, the jth intermediate signal that the jth stage generates may correspond to the same output signal as the output signal to which the given RE or BRE path signal corresponds. For example, suppose the first RE stage 306(1) and the first BRE stage 308(1) are both configured as non-inverters. Given that the RE input signal REin corresponds to the first output signal DQS, the first RE intermediate signal REI(1) that the first RE stage 306(1) generates also corresponds to the first output signal DQS. Likewise, given that the BRE input signal BREin corresponds to the second output signal BDQS, the first BRE intermediate signal BREI(1) that the first BRE stage 308(1) generates also corresponds to the second output signal BDQS. Such a correspondence maintains the direct relationship between relative duty cycle levels of the pairs of complementary signals. For example, suppose the duty cycle of the first output signal DQS is higher than the duty cycle of the second output signal BDQS. Based on the default correspondence, the RE input signal REin would have a higher duty cycle than the duty cycle of the BRE input signal BREin. Then, based on the non-inverter configuration of the first RE and BRE stages 306(1), 308(1), the first RE and BRE stage 306(1), 308(1) would generate the first pair of intermediate signals REI(1), BREI(1) such that the first RE intermediate signal REI(1) would have the higher duty cycle, thus corresponding to the first output signal DQS, and the first BRE intermediate signal BREI(1) would have the lower duty cycle, thus corresponding to the second output signal BDQS.

In addition, for some example configurations, at least some of the RE stages 306 and/or the BRE stages 308 may be configured as push-pull circuits to generate their respective intermediate signals. In general, a push-pull circuit is a circuit that includes a pull-up portion configured to pull up a level (e.g., a voltage level) of its output signal to an associated high level and a push-down portion configured to push down the level of its output signal to an associated low level. The push-pull circuit may pull up the level of its output signal to generate the rising transitions of the output signal and may push down the level of its output signal to generate the falling transitions of the output signal. Push-pull circuits may be inverter circuits or non-inverter circuits. As an inverter circuit, a push-pull circuit may pull up the level of its output signal in response to a falling transition of its input signal, and may push down the level of its output signal in response to a rising transition of its input signal. As a non-inverter circuit, a push-pull circuit may pull up the level of its output signal in response to a rising transition of its input signal, and may push down the level of its output signal in response to a falling transition of its input signal.

In addition, a push-pull circuit may pull up the level of its output signal with an associated pull-up drive strength, and may push down the level of its output signal with an associated push-down drive strength. As used herein, a pull-up drive strength is a measure of an ability or a strength that a push-pull circuit has to pull up a level, such as a voltage level, of its output signal to an associated high level. Similarly, a push-down drive strength is a measure of an ability or a strength that a push-pull circuit has to push down a level, such as a voltage level, of its output signal to an associated low level.

For some example configurations, drive strength may correspond to current draw. In particular, a push-pull circuit may be configured to generate an associated pull-up current to pull up a level of its output signal to an associated high voltage level. The larger the level or amount of the pull-up current the push-pull circuit can generate, the greater the pull-up drive strength of the push-pull circuit. Alternatively, the smaller the level or amount of the pull-up current the push-pull circuit can generate, the smaller the pull-up drive strength of the push-pull circuit. Similarly, a push-pull circuit may be configured to generate an associated push-down current to push down a level of its output signal to an associated low voltage level. The larger the level or amount of the push-down current the push-pull circuit can generate the greater the push-down drive strength of the push-pull circuit. Alternatively, the smaller the level or amount of the push-down current the push-pull circuit can generate, the smaller the push-down drive strength of the push-pull circuit.

In general, the stronger the pull-up drive strength, the faster the rate at which the push-pull circuit can pull up the level of its output signal, and the weaker the pull-up drive strength, the slower the rate at which the push-pull circuit can pull up the level of its output signal. Likewise, the stronger the push-down drive strength, the faster the rate at which the push-pull circuit can push down the level of its output signal, and the weaker the push-down drive strength, the slower the rate at which the push-pull circuit can push down the level of its output signal.

Also, when the push-pull circuit pulls up the level of the output signal to generate a rising transition, the rising transition may have an associated slope, referred to as a rising slope. Accordingly, the push-pull circuit may generate the rising transition with an associated rising slope. Likewise, when the push-pull circuit pulls down the level of the output signal to generate a falling transition, the falling transition may have an associated slope. Accordingly, the push-pull circuit may generate the falling transition with an associated slope, referred to as a falling slope. From a graphical perspective, if a magnitude waveform of the output signal is plotted as a function of time, the slope of a given transition (rising or falling) is the slope of the magnitude as a function of time over a period of time during which the output signal is performing the transition.

Mathematically, slope is a measure of a steepness of a line. The steeper a slope, the higher the magnitude value of the slope, and the more gradual the slope, the lower the magnitude value of the slope. Also, an increasing slope has a positive polarity and a decreasing slope has a negative polarity. With respect to the rising and falling transitions of signals, a rising slope is an increasing slope and a falling slope is a decreasing slope.

Also, slopes may have an associated direction corresponding to whether it is an increasing slope or a decreasing slope. A rising (increasing) transition has a rising direction in that over the rising transition, the magnitude of the signal (or the signal's waveform) increases. A falling (decreasing) transition has a falling direction in that over the falling transition, the magnitude of the signal (or the signal's waveform) decreases. The rising direction and the falling direction are opposite directions to each other.

With respect to a push-pull circuit generating an output signal, the greater or stronger the pull-up drive strength of the push-pull circuit, the faster the push-pull circuit pulls up the voltage level to generate a rising transition of the output voltage, and the greater or steeper the slope of the rising transition. Alternatively, the lesser or weaker the pull-up drive strength of the push-pull circuit, the slower the push-pull circuit pulls up the voltage level to generate a rising transition of the output voltage, and the smaller or more gradual the slope of the rising transition. Similarly, the greater or stronger the push-down drive strength of the push-pull circuit, the faster the push-pull circuit pushes down the voltage level to generate a falling transition of the output voltage, and the greater or steeper the slope of the falling transition. Alternatively, the lesser or weaker the push-down drive strength of the push-pull circuit, the slower the push-pull circuit pushes down the voltage level to generate a falling transition of the output voltage, and the smaller or more gradual the slope of the falling transition.

A given ith stage of the RE path 302 or the BRE path 304 may be configured to pull up and push down the voltage level of the ith intermediate signal that the ith stage generates. In addition, the given ith stage may be configured to pull up the voltage level of the ith intermediate signal with an associated pull-up drive strength, and push down the voltage level of the ith intermediate signal with an associated push-down drive strength. At a given point in time, the associated pull-up and push-down drive strengths for the given ith stage may the same or different from each other. Also, the pull-up drive strength or push-down drive strength for the given ith stage may be the same or different at different points in time. For example, the ith stage may generate rising transitions of the ith intermediate signal with the same or different pull-up drive strengths at different points in time, and/or may generate falling transitions of the ith intermediate signal with the same different push-down drive strengths at different points in time.

Also, at a given point in time, different RE stages 306 of the RE path 302 may have the same or different pull-up drive strengths and/or may have the same or different push-down drive strengths. Similarly, at a given point in time, different BRE stages 308 of the BRE path 304 may have the same or different pull-up drive strengths and/or may have the same or different push-down drive strengths.

FIG. 4 shows a block diagram of example configurations of a jth RE stage 306(*j*) of the RE path 302 and a jth BRE stage 308(*j*) of the BRE path 304. The jth RE stage 306(*j*) and the jth BRE stage 308(*j*) shown in FIG. 4 may be representative of push-pull circuit configurations of any or all of the RE stages 306 and BRE stages 308, respectively, shown in FIG. 3.

As shown in FIG. 4, the jth RE stage 306(*j*) is configured to receive an input signal IN_REj, and generate a jth RE intermediate signal REI(j) at a jth RE output node OUT_R(j) in response to the input signal IN_REj. Similarly, the jth BRE stage 308(*j*) is configured to receive an input signal IN_BREj, and generate a jth BRE intermediate signal BREI(j) at a jth BRE output node OUT_B(j) in response to the input signal IN_BREj.

The jth RE stage 306(*j*) may include a RE pull-up portion 402 and a RE push-down portion 404. The RE pull-up portion 402 is configured to pull-up the voltage level of the jth RE intermediate signal REI(j) to an associated high voltage level VDD and/or maintain the voltage level of the jth RE intermediate signal REI(j) at the associated high voltage level VDD. The RE push-down portion 404 is configured to push-down the voltage level of the jth RE intermediate signal REI(j) to an associated low voltage level VSS and/or maintain the voltage level of the jth RE intermediate signal REI(j) at the associated low voltage level VSS.

The RE pull-up portion 402 and the RE push-down portion 404 may each be configured to be activated and deactivated. When activated, the RE pull-up portion 402 may operate to pull-up and/or maintain the voltage level of the jth RE intermediate signal REI(j) at the associated high voltage level VDD at the jth RE output node OUT_R(j). Alternatively, when deactivated, the RE pull-up portion 402 is floating with respect to (i.e., is electrically disconnected from) the jth RE output node OUT_R(j) and is unable to influence the voltage level of the jth RE intermediate signal REI(j) at the jth RE output node OUT_R(j). Similarly, when activated, the RE push-down portion 404 may operate to push-down and/or maintain the voltage level of the jth RE intermediate signal REI(j) at the associated low voltage level VSS at the jth RE output node OUT_R(j). Alternatively, when deactivated, the RE push-down portion 404 is floating with respect to the jth RE output node OUT_R(j) and is unable to influence the voltage level of the jth RE intermediate signal REI(j) at the jth RE output node OUT_R(j).

In addition, the RE pull-up and push-down portions 402, 404 may each be configured to receive the input signal IN_REj, and operate in activated and deactivated modes of operation dependent on the voltage waveform of the input signal IN_REj and on whether the jth RE stage 306(*j*) is configured as an inverter or a non-inverter. As an inverter, when the voltage of the input signal IN_REj performs a rising transition, the jth RE stage 306(*j*) may respond in that the RE pull-up portion 402 may deactivate, and the RE push-down portion 404 may activate to push down the voltage level of the jth RE intermediate signal REI(j) at the jth RE output node OUT_R(j) to the associated low voltage level VSS. If the input signal IN_REj stays at the high voltage level VDD, the RE push-down portion 404 may stay activated to maintain the jth RE intermediate signal REI(j) at the associated low voltage level VSS. In addition, when the voltage of the input signal IN_REj performs a falling transition, the jth RE stage 306(*j*) may respond in that the RE push-down portion 404 may deactivate, and the RE pull-up portion 402 may activate to pull up the voltage level of the jth RE intermediate signal REI(j) at the jth RE output node OUT_R(j) to the associated high voltage level VDD. If the input signal IN_REj stays at the low voltage level VSS, the RE pull-up portion 402 may stay activated to maintain the jth RE intermediate signal REI(j) at the associated high voltage level VDD.

On the other hand, as a non-inverter, when the voltage of the input signal IN_REj performs a rising transition, the jth RE stage 306(*j*) may respond in that the RE push-down portion 404 may deactivate, and the RE pull-up portion 402 may activate to pull up the voltage level of the jth RE intermediate signal REI(j) at the jth RE output node OUT_R (j) to the associated high voltage level VDD. If the input signal IN_REj stays at the high voltage level VDD, the RE pull-up portion 402 may stay activated to maintain the jth RE intermediate signal REI(j) at the associated high voltage level VDD. In addition, when the voltage of the input signal IN_REj performs a falling transition, the jth RE stage 306(*j*) may respond in that the RE pull-up portion 402 may deactivate, and the RE push-down portion 404 may activate to push down the voltage level of the jth RE intermediate signal REI(j) at the jth RE output node OUT_R(j) to the associated low voltage level VSS. If the input signal IN_REj stays at the low voltage level VSS, the RE push-down portion 404 may stay activated to maintain the jth RE intermediate signal REI(j) at the associated low voltage level VSS.

Similarly, the jth BRE stage 308(*j*) may include a BRE pull-up portion 406 and a BRE push-down portion 408. The BRE pull-up portion 406 is configured to pull-up the voltage level of the jth BRE intermediate signal BREI(j) to an associated high voltage level VDD and/or maintain the voltage level of the jth BRE intermediate signal BREI(j) at the associated high voltage level VDD. The BRE push-down portion 408 is configured to push-down the voltage level of the jth BRE intermediate signal BREI(j) to an associated low voltage level VSS and/or maintain the voltage level of the jth BRE intermediate signal BREI(j) at the associated low voltage level VSS.

The BRE pull-up portion 406 and the BRE push-down portion 408 may each be configured to be activated and deactivated. When activated, the BRE pull-up portion 406 may operate to pull-up and/or maintain the voltage level of the jth BRE intermediate signal BREI(j) at the associated high voltage level VDD at the jth BRE output node OUT_B (j). Alternatively, when deactivated, the BRE pull-up portion 406 is floating with respect to the jth BRE output node OUT_B(j) and is unable to influence the voltage level of the jth BRE intermediate signal BREI(j) at the jth BRE output node OUT_B(j). Similarly, when activated, the BRE push-down portion 408 may operate to push down and/or maintain the voltage level of the jth BRE intermediate signal BREI(j) at the associated low voltage level VSS at the jth BRE output node OUT_B(j). Alternatively, when deactivated, the BRE push-down portion 408 is floating with respect to the jth BRE output node OUT_B(j) and is unable to influence the voltage level of the jth BRE intermediate signal BREI(j) at the jth BRE output node OUT_B(j).

In addition, the BRE pull-up and push-down portions 406, 408 may each be configured to receive the input signal IN_BREj, and operate in activated and deactivated modes of operation dependent on the voltage waveform of the input signal IN_REj and on whether the jth BRE stage 308(*j*) is configured as an inverter or a non-inverter. As an inverter, when the voltage of the input signal IN_BREj performs a rising transition, the jth BRE stage 308(*j*) may respond in that the BRE pull-up portion 406 may deactivate, and the BRE push-down portion 408 may activate to push down the voltage level of the jth BRE intermediate signal BREI(j) at the jth BRE output node OUT_B(j) to the associated low voltage level VSS. If the input signal IN_BREj stays at the high voltage level VDD, the BRE push-down portion 408 may stay activated to maintain the jth BRE intermediate signal BREI(j) at the associated low voltage level VSS. In addition, when the voltage of the input signal IN_BREj performs a falling transition, the jth BRE stage 308(*j*) may respond in that the BRE push-down portion 408 may deactivate, and the BRE pull-up portion 406 may activate to pull up the voltage level of the jth BRE intermediate signal BREI(j) at the jth BRE output node OUT_B(j) to the associated high voltage level VDD. If the input signal IN_BREj stays at the low voltage level VSS, the BRE pull-up portion 406 may stay activated to maintain the jth BRE intermediate signal BREI(j) at the associated high voltage level VDD.

On the other hand, as a non-inverter, when the voltage of the input signal IN_BREj performs a rising transition, the jth BRE stage 308(*j*) may respond in that the BRE push-down portion 408 may deactivate, and the BRE pull-up portion 406 may activate to pull up the voltage level of the jth BRE intermediate signal BREI(j) at the jth BRE output node OUT_B(j) to the associated high voltage level VDD. If the input signal IN_BREj stays at the high voltage level VDD, the BRE pull-up portion 406 may stay activated to maintain the jth BRE intermediate signal BREI(j) at the associated high voltage level VDD. In addition, when the voltage of the input signal IN_BREj performs a falling transition, the jth BRE stage 308(*j*) may respond in that the BRE pull-up portion 406 may deactivate, and the BRE push-down portion 408 may activate to push down the voltage level of the jth BRE intermediate signal BREI(j) at the jth BRE output node OUT_B(j) to the associated low voltage level VSS. If the input signal IN_BREj stays at the low voltage level VSS, the BRE push-down portion 408 may stay activated to maintain the jth BRE intermediate signal BREI(j) at the associated low voltage level VSS.

In addition, RE and BRE pull-up and push down portions 402, 404, 406, 408 may be configured to perform respective pull-up and push-down operations with associated pull-up or push-down drive strengths. The drive strengths may be set and/or adjusted in response to receipt of drive strength control signals ENpj, ENnj, BENpj, BENnj output from the controller 102 (FIG. 1).

In further detail, the RE pull-up portion 402 may be configured to pull up the voltage level of the jth RE intermediate signal REI(j) with an associated pull-up drive strength. The controller 102 may be configured to set and/or adjust the pull-up drive strength of the RE pull-up portion 402 through output of a jth RE pull-up drive strength signal ENpj. The amount of the pull-up drive strength may depend on a level of the jth RE pull-up drive strength signal ENpj and/or a corresponding n-bit digital value indicated by the jth RE pull-up drive strength signal ENpj. Otherwise stated, the controller 102 may be configured to determine an amount of pull-up drive strength for the RE pull-up portion 402 and output the jth RE pull-up drive strength signal ENpj at a level or value corresponding to the amount of the pull-up drive strength. In response, the RE pull-up portion 402 may pull up the voltage level of the jth RE intermediate signal REI(j) with the corresponding amount of pull-up drive strength. For example configurations where the pull-up drive strength corresponds to an amount of pull-up current, the RE pull-up portion 402 may be configured to draw an amount of pull-up current corresponding to the level or value of the jth RE pull-up drive strength signal ENpj.

In addition, the RE push-down portion 402 may be configured to push down the voltage level of the jth RE intermediate signal REI(j) with an associated push-down drive strength. The controller 102 may be configured to set and/or adjust the push-down drive strength of the push-down portion 404 through output of a jth RE push-down drive strength signal ENnj. The amount of the push-down drive strength may depend on a level of the jth RE push-down drive strength signal ENnj and/or a corresponding n-bit digital value indicated by the jth RE push-down drive strength signal ENnj. Otherwise stated, the controller 102 may be configured to determine an amount of the push-down drive strength for the RE push-down portion 404 and output the jth RE push-down drive strength signal ENnj at a level or value corresponding to the amount of the push-down drive strength. In response, the RE push-down portion 404 may push down the voltage level of the jth RE intermediate signal REI(j) with the corresponding amount of push-down drive strength. For example configurations where the push-down drive strength corresponds to an amount of push-down current, the RE push-down portion 404 may be configured to draw an amount of push-down current corresponding to the level or value of the jth RE push-down drive strength signal ENnj.

Similarly, the BRE pull-up portion 406 may be configured to pull up the voltage level of the jth BRE intermediate signal BREI(j) with an associated pull-up drive strength. The controller 102 may be configured to set and/or adjust the pull-up drive strength of the BRE pull-up portion 406 through output of a jth BRE pull-up drive strength signal BENpj. The amount of the pull-up drive strength may depend on a level of the jth BRE pull-up drive strength signal BENpj and/or a corresponding n-bit digital value indicated by the jth BRE pull-up drive strength signal BENpj. Otherwise stated, the controller 102 may be configured to determine an amount of pull-up drive strength for the BRE pull-up portion 406 and output the jth BRE pull-up drive strength signal BENpj at a level or value corresponding to the amount of the pull-up drive strength. In response, the BRE pull-up portion 406 may pull up the voltage level of the jth BRE intermediate signal BREI(j) with the corresponding amount of pull-up drive strength. For example configurations where the pull-up drive strength corresponds to an amount of pull-up current, the BRE pull-up portion 406 may be configured to draw an amount of pull-up current corresponding to the level or value of the jth BRE pull-up drive strength signal BENpj.

In addition, the BRE push-down portion 408 may be configured to push down the voltage level of the jth BRE intermediate signal BREI(j) with an associated push-down drive strength. The controller 102 may be configured to set and/or adjust the push-down drive strength of the push-down portion 408 through output of a jth BRE push-down drive strength signal BENnj. The amount of the push-down drive strength may depend on a level of the jth BRE push-down drive strength signal BENnj and/or a corresponding n-bit digital value indicated by the jth BRE push-down drive strength signal BENnj. Otherwise stated, the controller 102 may be configured to determine an amount of the push-down drive strength for the BRE push-down portion 408 and output the jth BRE push-down drive strength signal BENnj at a level or value corresponding to the amount of the push-down drive strength. In response, the BRE push-down portion 408 may push down the voltage level of the jth BRE intermediate signal BREI(j) with the corresponding amount of push-down drive strength. For example configurations where the push-down drive strength corresponds to an amount of push-down current, the BRE push-down portion 408 may be configured to draw an amount of push-down current corresponding to the level or value of the jth BRE push-down drive strength signal BENnj.

In addition, in the event that the controller 102 wants the jth RE intermediate signal REI(j) to have more gradual rising transitions, the controller 102 may output the jth RE pull-up drive strength signal ENpj to the RE pull-up portion 402 of the jth RE stage 306(j) creating the rising transitions to reduce or decrease the drive strength of the RE pull-up portion 402. Similarly, in the event that the controller 102 wants the jth RE intermediate signal REI(j) to have steeper rising transitions, the controller 102 may output the jth RE pull-up drive strength signal ENpj to the pull-up portion 402 of the jth RE stage 306(j) creating the rising transitions to increase the drive strength of the pull-up portion 402.

Similarly, in the event that the controller 102 wants the jth RE intermediate signal REI(j) to have more gradual falling transitions, the controller 102 may output the jth RE push-down drive strength signal ENnj to the RE push-down portion 404 of the jth RE stage 306(j) creating the falling transitions to reduce or decrease the drive strength of the RE push-down portion 404. Similarly, in the event that the controller 102 wants the jth RE intermediate signal REI(j) to have steeper falling transitions, the controller 102 may output the jth RE push-down drive strength signal ENnj to the push-down portion 404 of the jth RE stage 306(j) creating the falling transitions to increase the drive strength of the push-down portion 404.

In addition, in the event that the controller 102 wants the jth BRE intermediate signal BREI(j) to have more gradual rising transitions, the controller 102 may output the jth BRE pull-up drive strength signal BENpj to the BRE pull-up portion 402 of the jth BRE stage 308(j) creating the rising transitions to reduce or decrease the drive strength of the BRE pull-up portion 406. Similarly, in the event that the controller 102 wants the jth BRE intermediate signal BREI (j) to have steeper rising transitions, the controller 102 may output the jth BRE pull-up drive strength signal BENpj to the pull-up portion 406 of the jth BRE stage 308(j) creating the rising transitions to increase the drive strength of the pull-up portion 406.

Similarly, in the event that the controller 102 wants the jth BRE intermediate signal BREI(j) to have more gradual falling transitions, the controller 102 may output the jth BRE push-down drive strength signal BENnj to the BRE push-down portion 408 of the jth BRE stage 308(j) creating the falling transitions to reduce or decrease the drive strength of the BRE push-down portion 408. Similarly, in the event that the controller 102 wants the jth BRE intermediate signal BREI(j) to have steeper falling transitions, the controller 102 may output the jth BRE push-down drive strength signal BENnj to the push-down portion 408 of the jth BRE stage 308(j) creating the falling transitions to increase the drive strength of the push-down portion 408.

As described in further detail below, the controller 102 may be configured to output a drive strength signal to a given pull-up or push-down portion of a given jth stage at varying levels over a plurality of iterations. The varying levels of the drive strength signal may cause the pull-up or push-down portion to change or adjust a level or magnitude value of a slope of rising or falling transitions of a jth intermediate signal that the pull-up or push-down portion is creating. For a given period of time or for a given number of the iterations, the slope may have a direction of adjustment, which may be either an increasing direction of adjustment or a decreasing direction of adjustment. When the change in the level of the drive strength signal causes the slope to adjust by increasing in magnitude value and thus become steeper, the slope may be considered to be changing or adjusting in an increasing direction or have an increasing direction of adjustment. In addition, when the change in the level of the drive strength signal causes the slope to change or adjust by decreasing in magnitude value to become more gradual, the slope may be considered to be changing or adjusting in a decreasing direction or have a decreasing direction of adjustment.

Also, a slope that changes in the increasing direction of adjustment over a given time period or a plurality of iterations may continuously increase in magnitude value or continuously become steeper over the given time period or plurality of iterations. In addition, a slope that changes in the decreasing direction of adjustment over a given time period or a plurality of iterations may continuously decrease in magnitude value or continuously become more gradual over the given time period or plurality of iterations. Further, a slope may reverse its direction of adjustment when it changes from having an increasing direction of adjustment to a decreasing direction of adjustment, or when it changes from having a decreasing direction of adjustment to an increasing direction of adjustment.

Accordingly, to have a slope of rising transitions or falling transitions continuously increase or become steeper (i.e., continuously change in the increasing direction of adjustment) over a plurality of iterations, the controller 102 may output drive strength signals to the pull-up or push-down portion creating the rising or falling transitions to continuously increase the drive strength of the pull-up or push-down portion over the plurality of iterations. In addition, to have a slope of rising transitions or falling transitions continuously decrease or become more gradual (i.e., continuously change in the decreasing direction of adjustment) over a plurality of iterations, the controller 102 may output drive strength signals to the pull-up or push-down portion creating the rising or falling transitions to continuously decrease the drive strength of the pull-up or push-down portion over the plurality of iterations.

Referring back to FIG. 3, the each ith RE stage 306(i) of the RE path 302 may be configured to receive an associated drive strength signal EN in the form of or as a pair of an ith RE pull-up drive strength signal ENpi and an ith RE pull-down drive strength signal ENni, and set or adjust its associated pull-up and pull-down drive strengths in response to receipt of the ith pair of RE pull-up and pull-down drive strength signals ENpi, ENni. Specifically, the first RE stage 306(1) may be configured to set and/or adjust its associated pull-up drive strength in response receipt of a first RE pull-up drive strength signal ENp1, and to set and/or adjust its associated push-down drive strength in response to receipt of a first RE push-down drive strength signal ENn1. The second RE stage 306(2) may be configured to set and/or adjust its associated pull-up drive strength in response receipt of a second RE pull-up drive strength signal ENp2, and to set and/or adjust its associated push-down drive strength in response to receipt of a second RE push-down drive strength signal ENn2. The third RE stage 306(3) may be configured to set and/or adjust its associated pull-up drive strength in response receipt of a third RE pull-up drive strength signal ENp3, and to set and/or adjust its associated push-down drive strength in response to receipt of a third RE push-down drive strength signal ENn3. The fourth RE stage 306(4) may be configured to set and/or adjust its associated pull-up drive strength in response receipt of a fourth RE pull-up drive strength signal ENp4, and to set and/or adjust its associated push-down drive strength in response to receipt of a fourth RE push-down drive strength signal ENn4.

Similarly, the first BRE stage 308(1) may be configured to set and/or adjust its associated pull-up drive strength in response receipt of a first BRE pull-up drive strength signal BENp1, and to set and/or adjust its associated push-down drive strength in response to receipt of a first BRE push-down drive strength signal BENn1. The second BRE stage 308(2) may be configured to set and/or adjust its associated pull-up drive strength in response receipt of a second BRE pull-up drive strength signal BENp2, and to set and/or adjust its associated push-down drive strength in response to receipt of a second BRE push-down drive strength signal BENn2. The third BRE stage 306(3) may be configured to set and/or adjust its associated pull-up drive strength in response receipt of a third BRE pull-up drive strength signal BENp3, and to set and/or adjust its associated push-down drive strength in response to receipt of a third BRE push-down drive strength signal BENn3. The fourth BRE stage 306(4) may be configured to set and/or adjust its associated pull-up drive strength in response receipt of a fourth BRE pull-up drive strength signal BENp4, and to set and/or adjust its associated push-down drive strength in response to receipt of a fourth BRE push-down drive strength signal BENn4.

In some example configurations, the pull-up and push-down portions of a push-pull circuit may each include an adjustable or controllable portion that is configured adjust its associated drive strength. A given pull-up or push-down portion may be configured to adjust its associated drive strength by increasing its associated drive strength or decreasing its associated drive strength. In particular example configurations, a given pull-up or push-down portion is configured to adjust its drive strength by adjusting an amount or level of current it is configured to draw. For example, a given pull-up or push-down portion may be configured to increase its drive strength by increasing an amount or level of current it is configured to draw, and may be configured to decrease its drive strength by decreasing an amount or level of current it is configured to draw.

In particular example configurations, each pull-up portion or push-down portion may include a plurality of an M-number of branches (or current branches) for current adjustment. Each branch may be configured to draw an associated amount of current. A given pull-up or push-down portion may be configured to draw an associated or total current, and at a given point in time, the amount of the total current may be based on a combination of the currents the current branches of the given pull-up or push-down portion are configured to draw at that point in time. In particular example configurations, the branches of a given pull-up or push-down portion are connected in parallel with each other, and at a given point in time, the level or amount of the total current that the given pull-up or push-down portion is configured to draw is equal to a sum of the amounts or levels of the currents that the branches of the given pull-up or push-down portion are configured to draw that that given point in time. Accordingly, a given pull-up or push-down portion is configured to increase its amount of drive strength by increasing the amount of current its branches are configured to draw, and decrease its drive strength by decreasing the amount of current its branches are configured to draw.

In some example configurations, for a given pull-up or push-down portion that includes a plurality branches, each of the branches may include an associated drive strength corresponding to a level or amount of current that the branch is configured to draw. In the given pull-up or push-down portion, the drive strengths of the branches may all be the same, or at least two drive strengths of at least two of the branches may be different from each other.

Also, in at least some configurations where a given pull-up or push-down portion includes multiple branches, at least one of the branches may include multiple sub-branches, with each sub-branch configured to draw a respective current. At a given point in time, an amount of current a given branch is configured to draw may be based on a combination of currents the sub-branches are configured to draw at that given point in time. In particular example configurations, the sub-branches of a branch are connected in parallel with each other, and at a given point in time, the amount of current the branch is configured to draw is equal to the sum of the amounts of currents the sub-branches are configured to draw at a given point in time.

Additionally, in some example configurations where at least one branch includes multiple sub-branches, different branches may have different associated drive strengths by having different numbers of sub-branches. As an example, a first branch may include eight sub-branches, a second branch may include four sub-branches, a third branch may include two sub-branches, and a fourth may include a single sub-branch. The greater the number sub-branches of a given branch, the larger the drive strength of the given branch. In a given pull-up or push-down portion, configuring the branches to have different numbers of sub-branches may allow for a finer granularity in varying a total amount of current the given pull-up or push-down portion is configured to draw at given point in time, which in turn may allow for finer granularity in adjusting the drive strength of the given pull-up or push-down portion.

For example configurations where a given pull-up or push-down portion has a plurality of branches for current adjustment, the controller 102 (FIG. 1) may be configured to control, set, and/or adjust a drive strength of the given pull-up or push-down portion by controlling current flow through the branches of the given pull-up or push-down portion. For example, when the controller 102 outputs a drive strength signal to a given pull-up or push-down portion, a level or value of the drive strength signal may determine whether each branch of the given pull-up or push-down portion draws current and/or an amount of current that each branch draws.

In particular example configurations, the controller 102 may be configured to output a drive signal strength signal to a given pull-up or push-down portion as a plurality or an M-number of drive strength sub-signals. The controller 102 may be configured to output each drive strength sub-signal to a respective one of the branches of the given pull-up or push-down portion. The branches may be configured to draw current based on the levels of the drive strength sub-signals.

In further particular example configurations, the branches of a given pull-up or push-down portion configured for current adjustment may be configured as a digital-to-analog converter (DAC). In this context, the RE and BRE stages 306, 308 may each include or referred to as a DAC circuit, and a given jth pair of RE and BRE stages 306(j), 308(j) may be configured to generate an associated jth pair of intermediate signals REI(j), BREI(j). Additionally, the branches of the given pull-up or push-down portion used configured for current adjustment may be referred to as a DAC portion of the given pull-up or push-down portion. The branches of the DAC portion may each be configured to activate or turn on to draw an associated current, and deactivate or turn off to be prevented from drawing an associated current. The M-number of drive strength sub-signals sent to the M-number of branches of the given pull-up or pull-down portion may each be at a first level (e.g. a first voltage level) that activates a respective branch to which it is sent or at a second level (e.g., a second voltage level) that deactivates the respective branch to which it is sent. In this context, at a given point in time, the drive strength sub-signals at respective first and second levels may represent and/or correspond to an M-bit digital code in the form of a M-bit binary value that includes an M-number of bits or binary digits, and where each bit or binary digit is a logic 1 value or a logic 0 value. For a given drive strength sub-signal, the first level may correspond to the logic 1 value and the second level may correspond to the logic 0 value, or vice versa.

As described in further detail below, the controller 102 may output an M-number of drive strength sub-signals at respective first and second levels corresponding to an M-bit binary value, which in turn corresponds to a drive strength amount. An M-number of branches of a given pull-up or push-down portion receiving the M-number of drive strength sub-signals may each activate to draw current or deactivate to not draw current according to the drive strength sub-signals at their respective first and second levels. A total amount of current drawn by the given pull-up or push-down portion may be equal to a combination, such as a sum, of the amounts of the currents drawn by the M-number of branches. By drawing current at the total amount, the given pull-up or push-down portion pulls up or pushes down a voltage level of an intermediate signal generated at an output node to which it is coupled with the drive strength amount corresponding to the M-bit binary value.

Figure 5:
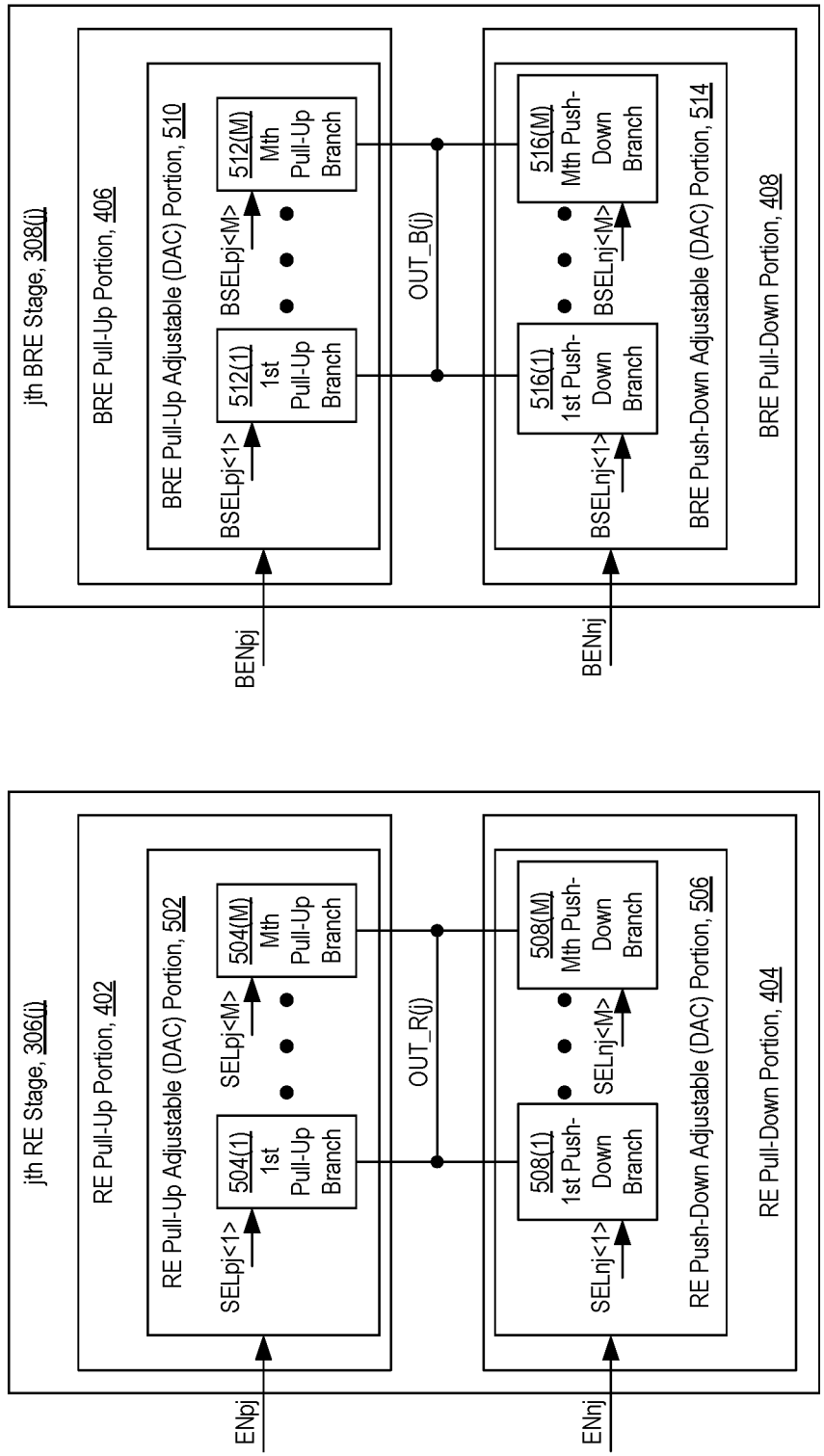
FIG. 5 is a block diagram of example configurations of pull-up and push-down portions of the RE and BRE stages of FIG. 4.

FIG. 5 shows a block diagram of example configurations of pull-up and push-down portions of the jth RE stage 306(j) and the jth BRE stage 308(j) of FIG. 4. Each pull-up and push-down portion includes an adjustable or DAC portion that includes an M-number of branches. In particular example configurations, the integer M is the same for the pull-up and pull-down portions in each of the RE and BRE stages 306, 308 of each of the RE and BRE paths 302, 304, although other example configurations where M is different for different RE stages 306 and/or for different BRE stages 308 may be possible.

In further detail, the RE pull-up portion 402 may include an RE pull-up adjustable or DAC portion 502 that includes a plurality or an M-number of pull-up branches 504(1) to 504(M), with each branch 504 coupled to the jth RE output node OUT_R(j) and configured to draw an associated current. The controller 102 may be configured to control, set, and/or adjust a pull-up drive strength of the pull-up portion 402 of the jth RE stage 306(j) by outputting the jth RE pull-up drive strength signal ENpj to the RE pull-up adjustable portion 502. In particular, the controller 102 may be configured to output the jth RE pull-up drive strength signal ENpj in the form of a plurality or an M-number of jth RE pull-up drive strength sub-signals SELpj<1> to SELpj<M>, each to a respective one of the M-number of pull-up branches 504(1) to 504(M). Each of the jth RE pull-up drive strength sub-signals SELpj<1> to SELpj<M> may be at a first level or at a second level to activate or deactivate the particular branch 504 to which it is sent.

At a given point in time or for a given time period, the controller 102 may be configured to output the M-number of jth RE pull-up drive strength sub-signals SELpj<1> to SELpj<M> at first and second levels according to an M-bit digital code corresponding to a particular pull-up drive strength amount. In response to receipt of the jth RE pull-up drive strength sub-signals SELpj<1> to SELpj<M> at the first and second levels, the pull-up branches 504(1) to 504(M) may each be configured to activate and draw current or deactivate and be prevented from drawing current according to the first and second levels at the given point in time and/or for the given time period. The RE pull-up adjustable portion 502 may be configured to draw a total amount of current that is equal to a combination, such as a sum, of the amounts of the currents drawn by the pull-up branches 504(1) to 504(M) at the given point in time and/or for the given time period. In response to and/or as a result of the pull-up branches 504(1) to 504(M) drawing the total amount of current, the RE pull-up portion 402 may be configured to pull-up the voltage level of the jth intermediate signal REI(j) generated at the jth RE output node OUT_R(j) with a pull-up drive strength amount corresponding to the M-bit digital code.

In the event that the controller 102 wants to adjust the pull-up drive strength of the jth RE pull-up portion 402, the controller 102 may be configured to change at least one level of at least one of the jth RE pull-up drive strength sub-signals SELpj<1> to SELpj<M> (e.g., from a first level to a second level, or vice versa), which in turn may correspond to a change in binary value of the M-bit digital code. The different binary value may correspond to a different drive strength amount. The change in the at least one level may cause at least one of the pull-up branches 504(1) to 504(M) to change from being activated to deactivated, or vice versa, which in turn may change the total amount of current drawn by the M-number of pull-up branches 504(1) to 504(M), and in turn cause the RE pull-up portion 402 to pull up the voltage level of the jth RE intermediate signal REI(j) with the new drive strength amount.

In addition, the RE push-down portion 404 may include an RE push-down adjustable or DAC portion 506 that includes a plurality or an M-number of push-down branches 508(1) to 508(M), with each branch 508 coupled to the jth RE output node OUT_R(j) and configured to draw an associated current. The controller 102 may be configured to control, set, and/or adjust a push-down drive strength of the push-down portion 404 of the jth RE stage 306(j) by outputting the jth RE push-down drive strength signal ENnj to the RE push-down adjustable portion 506. In particular, the controller 102 may be configured to output the jth RE push-down drive strength signal ENnj in the form of a plurality or an M-number of jth RE push-down drive strength sub-signals SELnj<1> to SELnj<M>, each to a respective one of the M-number of push-down branches 508(1) to 508(M). Each of the jth RE push-down drive strength sub-signals SELnj<1> to SELnj<M> may be at a first level or at a second level to activate or deactivate the branch 508 to which it is sent. At a given point in time or for a given time period, the controller 102 may be configured to output the M-number of jth RE push-down drive strength sub-signals SELnj<1> to SELnj<M> at first and second levels according to an M-bit digital code corresponding to a particular push-down drive strength amount. In response to receipt of the jth RE push-down drive strength sub-signals SELnj<1> to SELnj<M> at the first and second levels, the push-down branches 508(1) to 508(M) may each be configured to activate and draw current or deactivate and be prevented from drawing current according to the first and second levels at the given point in time and/or for the given time period. The RE push-down adjustable portion 506 may be configured to draw a total amount of current that is equal to a combination, such as a sum, of the amounts of the currents drawn by the push-down branches 508(1) to 508(M) at the given point in time and/or for the given time period. In response to and/or as a result of the push-down branches 508(1) to 508(M) drawing the total amount of current, the RE push-down portion 404 may be configured to push down the voltage level of the jth intermediate signal REI(j) generated at the jth RE output node OUT_R(j) with a push-down drive strength amount corresponding to the M-bit digital code.

In the event that the controller 102 wants to adjust the push-down drive strength of the jth RE push-down portion 404, the controller 102 may be configured to change at least one level of at least one of the jth RE push-down drive strength sub-signals SELpj<1> to SELpj<M> (e.g., from a first level to a second level, or vice versa), which in turn may correspond to a change in binary value of the M-bit digital code. The different binary value may correspond to a different drive strength amount. The change in the at least one level may cause at least one of the push-down branches 508(1) to 508(M) to change from being activated to deactivated, or vice versa, which in turn may change the total amount of current drawn by the M-number of push-down branches 508(1) to 508(M), and in turn cause the RE push-down portion 404 to push down the voltage level of the jth RE intermediate signal with the new drive strength amount.

Similarly, the BRE pull-up portion 406 may include a BRE pull-up adjustable or DAC portion 510 that includes a plurality or an M-number of pull-up branches 512(1) to 512(M), with each branch 512 coupled to the jth BRE output node OUT_B(j) and configured to draw an associated current. The controller 102 may be configured to control, set, and/or adjust a pull-up drive strength of the pull-up portion 406 of the jth BRE stage 308(j) by outputting the jth BRE pull-up drive strength signal BENpj to the BRE pull-up adjustable portion 510. In particular, the controller 102 may be configured to output the jth BRE pull-up drive strength signal BENpj in the form of a plurality or an M-number of jth BRE pull-up drive strength sub-signals BSELpj<1> to BSELpj<M>, each to a respective one of the M-number of pull-up branches 512(1) to 512(M). Each of the jth BRE pull-up drive strength sub-signals BSELpj<1> to BSELpj<M> may be at a first level or at a second level to activate or deactivate the particular branch 504 to which it is sent.

At a given point in time or for a given time period, the controller 102 may be configured to output the M-number of jth BRE pull-up drive strength sub-signals BSELpj<1> to BSELpj<M> at first and second levels according to an M-bit digital code corresponding to a particular pull-up drive strength amount. In response to receipt of the jth BRE pull-up drive strength sub-signals BSELpj<1> to BSELpj<M> at the first and second levels, the pull-up branches 512(1) to 512(M) may each be configured to activate and draw current or deactivate and be prevented from drawing current according to the first and second levels at the given point in time and/or for the given time period. The BRE pull-up adjustable portion 510 may be configured to draw a total amount of current that is equal to a combination, such as a sum, of the amounts of the currents drawn by the pull-up branches 512(1) to 512(M) at the given point in time and/or for the given time period. In response to and/or as a result of the pull-up branches 512(1) to 512(M) drawing the total amount of current, the BRE pull-up portion 406 may be configured to pull-up the voltage level of the jth intermediate signal BREI(j) generated at the jth BRE output node OUT_B(j) with a pull-up drive strength amount corresponding to the M-bit digital code.

In the event that the controller 102 wants to adjust the pull-up drive strength of the jth BRE pull-up portion 406, the controller 102 may be configured to change at least one level of at least one of the jth BRE pull-up drive strength sub-signals BSELpj<1> to BSELpj<M> (e.g., from a first level to a second level, or vice versa), which in turn may correspond to a change in binary value of the M-bit digital code. The different binary value may correspond to a different drive strength amount. The change in the at least one level may cause at least one of the pull-up branches 512(1) to 512(M) to change from being activated to deactivated, or vice versa, which in turn may change the total amount of current drawn by the M-number of pull-up branches 512(1) to 512(M), and in turn cause the BRE pull-up portion 406 to pull up the voltage level of the jth BRE intermediate signal REI(j) with the new drive strength amount.

In addition, the BRE push-down portion 408 may include a BRE push-down adjustable or DAC portion 514 that includes a plurality or an M-number of push-down branches 516(1) to 516(M), with each branch 516 coupled to the jth BRE output node OUT_B(j) and configured to draw an associated current. The controller 102 may be configured to control, set, and/or adjust a push-down drive strength of the push-down portion 408 of the jth BRE stage 308(j) by outputting the jth BRE push-down drive strength signal BENnj to the BRE push-down adjustable portion 514. In particular, the controller 102 may be configured to output the jth BRE push-down drive strength signal BENnj in the form of a plurality or an M-number of jth BRE push-down drive strength sub-signals BSELnj<1> to BSELnj<M>, each to a respective one of the M-number of push-down branches 516(1) to 516(M). Each of the jth BRE push-down drive strength sub-signals BSELnj<1> to BSELnj<M> may be at a first level or at a second level to activate or deactivate the branch 516 to which it is sent. At a given point in time or for a given time period, the controller 102 may be configured to output the M-number of jth BRE push-down drive strength sub-signals BSELnj<1> to BSELnj<M> at first and second levels according to an M-bit digital code corresponding to a particular push-down drive strength amount. In response to receipt of the jth BRE push-down drive strength sub-signals BSELnj<1> to BSELnj<M> at the first and second levels, the push-down branches 516(1) to 516(M) may each be configured to activate and draw current or deactivate and be prevented from drawing current according to the first and second levels at the given point in time and/or for the given time period. The BRE push-down adjustable portion 514 may be configured to draw a total amount of current that is equal to a combination, such as a sum, of the amounts of the currents drawn by the push-down branches 516(1) to 516(M) at the given point in time and/or for the given time period. In response to and/or as a result of the push-down branches 516(1) to 516(M) drawing the total amount of current, the BRE push-down portion 408 may be configured to push down the voltage level of the jth intermediate signal BREI(j) generated at the jth BRE output node OUT_B(j) with a push-down drive strength amount corresponding to the M-bit digital code.

In the event that the controller 102 wants to adjust the push-down drive strength of the jth push-down portion 408, the controller 102 may be configured to change at least one level of at least one of the jth BRE push-down drive strength sub-signals BSELpj<1> to BSELpj<M> (e.g., from a first level to a second level, or vice versa), which in turn may correspond to a change in binary value of the M-bit digital code. The different binary value may correspond to a different drive strength amount. The change in the at least one level may cause at least one of the push-down branches 516(1) to 516(M) to change from being activated to deactivated, or vice versa, which in turn may change the total amount of current drawn by the M-number of push-down branches 516(1) to 516(M), and in turn cause the BRE push-down portion 408 to push down the voltage level of the jth BRE intermediate signal with the new drive strength amount.

Figure 6:
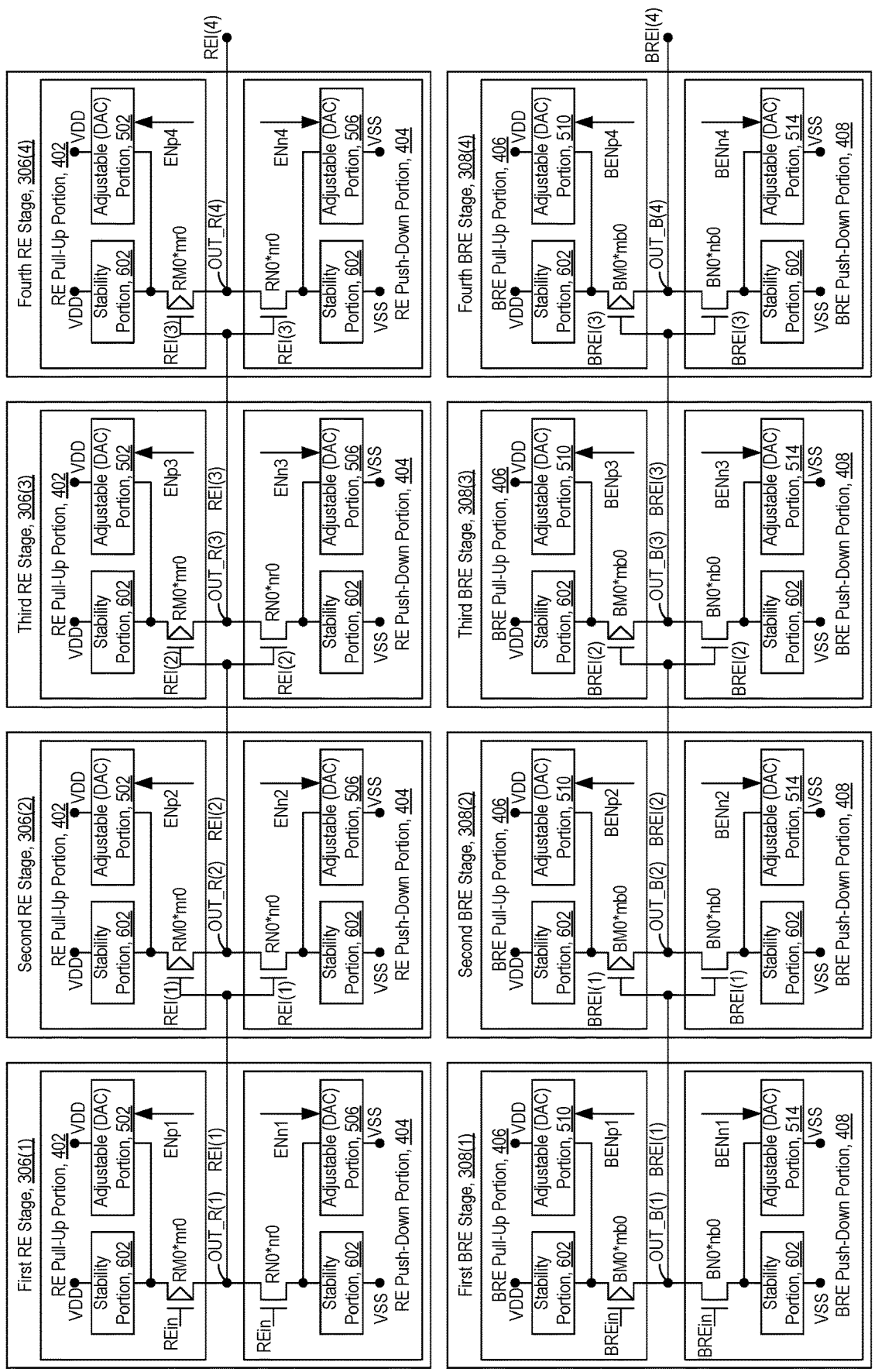
FIG. 6 is a partial circuit schematic diagram of example configurations of the RE and BRE stages of FIG. 3.

FIG. 6 shows a partial circuit schematic diagram of example configurations of the four RE stages 306(1) to 306(4) of the RE path 302 and the four BRE stages 308(1) to 308(4) of the BRE path 304. In the example configuration shown in FIG. 6, each of the RE and BRE pull-up and push-down portions 402, 404, 406, 408 may include an input transistor, an adjustable or DAC portion, and a stability portion 602.

The input transistor is configured to receive one of the RE or BRE path signals as its input signal. The input transistors in the RE and BRE pull-up portions 402, 406 are respectively referred to as RE and BRE pull-up input transistors. In some example configurations, as shown in FIG. 6, the RE and BRE pull-up transistors are configured as p-channel metal-oxide-semiconductor field-effect transistors (PMOS transistors). When a given RE or BRE pull-up input transistors M0 is activated or turned on in response to respective receipt of a RE or BRE path signal, the given RE or BRE pull-up transistor is configured to pull-up a voltage level of a respective RE or BRE intermediate signal REI, BREI toward the high voltage VDD. Additionally, the input transistors in the RE and BRE push-down portions 404, 408 are respectively referred to as RE and BRE push-down input transistors. In some example configurations, as shown in FIG. 6, the RE and BRE push-down transistors are configured as n-channel metal-oxide-semiconductor field-effect transistors (NMOS transistors). When a given RE or BRE push-down input transistor is activated or turned on in response to respective receipt of a RE or BRE path signal, the given RE or BRE push-down transistor is configured to push-down a voltage level of a respective RE or BRE intermediate signal REI, BREI toward the low voltage VSS.

The adjustable or DAC portion 502 may correspond to the adjustable or DAC portion 502 shown and described with reference to FIG. 5. Additionally, the stability portions 602 may couple or bias terminals (e.g., source terminals or drain terminals) of RE and BRE input transistors receiving RE and BRE path signals to the high voltage VDD or to the low voltage VSS, where such terminals would otherwise be floating in the absence of the stability portions 602.

In further detail with respect to the RE stages 306, each ith RE stage 306(i) may include an RE pull-up portion 402, which may correspond to the RE pull-up portion 402 shown and described with reference to FIGS. 4 and 5, and each RE pull-up portion 402 may include an adjustable or DAC portion 502, which may correspond to the adjustable or DAC portion 502 shown and described with reference to FIG. 5. In addition, each RE pull-up portion 402 may include an RE pull-up input transistor RM0 configured to receive one of the RE path signals. In particular, the RE pull-up input transistor M0 of the first RE stage 306(1) is configured to receive the RE input signal REin, the RE pull-up input transistor RM0 of the second RE stage 306(2) is configured to receive the first RE intermediate signal REI(1) from the first RE stage 306(1), the RE pull-up input transistor RM0 of the third RE stage 306(1) is configured to receive the second RE intermediate signal REI(2) from the second RE stage 306(2), and the RE pull-up input transistor RM0 of the fourth RE stage 306(4) is configured to receive the third RE intermediate signal REI(3) from the third RE stage 306(3).

As indicated by the label "*mr0" in FIG. 6, each RE pull-up input transistor RM0 may include an mr0-number of parallel-connected transistors, where "mr0" is an integer of one or more. The value of mr0 may be the same or different among the multiple RE stages 306 of the RE path 302.

In the RE pull-up portions 402, the adjustable portion 502 may be coupled to respective RE output nodes OUT_R via a respective RE pull-up input transistor RM0. In some example configurations, in a given RE pull-up portion 402, where the RE pull-up input transistor RM0 includes multiple transistors, at least one of the RE pull-up input transistors RM0 may be part of, such as part of a branch of, the associated adjustable portion 502. Also, in the RE pull-up portions 402, the stability portions 602 may ensure that, at any given point in time, terminals (e.g., source terminals or drain terminals) of the RE pull-up input transistor(s) RM0 in the respective RE pull-up portions 402 are not floating, and instead are coupled or biased to the high voltage VDD, in the event that respective adjustable portions 502 are configured to float the terminals. By preventing terminals of the RE pull-up input transistors RM0 from floating, such as by coupling such terminals to the high voltage VDD, the stability portions 602 may enhance stability and/or signal integrity (e.g., by minimizing the influence of noise in the RE pull-up portions 402) as the RE pull-up portions 402 participate in generating the RE intermediate signals REI.

In addition, each ith RE stage 306(i) may include an RE push-down portion 404, which may correspond to the RE push-down portion 404 shown and described with reference to FIGS. 4 and 5, and each RE push-down portion 404 may include an adjustable or DAC portion 506, which may correspond to the adjustable or DAC portion 506 shown and described with reference to FIG. 5. In addition, each RE push-down portion 404 may include an RE push-down input transistor RN0 configured to receive one of the RE path signals. In particular, the RE push-down input transistor RN0 of the first RE stage 306(1) is configured to receive the RE input signal REin, the RE push-down input transistor RN0 of the second RE stage 306(2) is configured to receive the first RE intermediate signal REI(1) from the first RE stage 306(1), the RE push-down input transistor RN0 of the third RE stage 306(1) is configured to receive the second RE intermediate signal REI(2) from the second RE stage 306(2), and the RE push-down input transistor RN0 of the fourth RE stage 306(4) is configured to receive the third RE intermediate signal REI(3) from the third RE stage 306(3).

As indicated by the label "*nr0" in FIG. 6, each RE push-down input transistor RN0 may include an nr0-number of parallel-connected transistors, where "nr0" is an integer of one or more. The value of n0 may be the same or different among the multiple RE stages 306 of the RE path 302. Also, in at least some example configurations, the values of mr0 and nr0 are the same, although other configurations where mr0 and nr0 have different values are possible. Example values for mr0 and nr0 are described below with respect to FIGS. 7-9.

In the RE push-down portions 404, the adjustable portion 506 may be coupled to respective RE output nodes OUT_R via a respective RE push-down input transistor RN0. In some example configurations, in a given RE push-down portion 404, where the RE push-down input transistor RN0 includes multiple transistors, at least one of the RE push-down input transistors RN0 may be part of, such as part of a branch of, the associated adjustable portion 506. Also, in the RE push-down portions 404, the stability portions 602 may ensure that, at any given point in time, terminals (e.g., source terminals or drain terminals) of the RE push-down input transistor(s) RN0 in the respective RE push-down portions 404 are not floating, and instead are coupled or biased to the low voltage VSS, in the event that respective adjustable portions 506 are configured to float the source terminals. By preventing terminals of the RE push-down input transistors RN0 from floating, such as by coupling such terminals to the low voltage VSS, the stability portions 602 may enhance stability and/or signal integrity (e.g., by minimizing the influence of noise in the RE push-down portions 404) as the RE push-down portions 404 participate in generating the RE intermediate signals REI.

With respect to the BRE stages 308, each ith BRE stage 308(i) may include a BRE pull-up portion 406, which may correspond to the BRE pull-up portion 406 shown and described with reference to FIGS. 4 and 5, and each BRE pull-up portion 406 may include an adjustable or DAC portion 510, which may correspond to the adjustable or DAC portion 510 shown and described with reference to FIG. 5. In addition, each BRE pull-up portion 406 may include a BRE pull-up input transistor BM0 configured to receive one of the BRE path signals. In particular, the BRE pull-up input transistor BM0 of the first BRE stage 308(1) is configured to receive the BRE input signal BREin, the BRE pull-up input transistor BM0 of the second BRE stage 308(2) is configured to receive the first BRE intermediate signal BREI(1) from the first BRE stage 308(1), the BRE pull-up input transistor BM0 of the third BRE stage 308(1) is configured to receive the second BRE intermediate signal BREI(2) from the second BRE stage 308(2), and the BRE pull-up input transistor BM0 of the fourth BRE stage 308(4) is configured to receive the third BRE intermediate signal BREI(3) from the third BRE stage 306(3).

As indicated by the label "*mb0" in FIG. 6, each BRE pull-up input transistor BM0 may include an mb0-number of parallel-connected transistors, where mb0 is an integer of one or more. The value of mb0 may be the same or different among the multiple BRE stages 308 of the RE path 302. Also, the value of mb0 for the BRE stages 308 may be the same or different compared to the value of mr0 for the RE stages 306.

In the BRE pull-up portions 406, the adjustable portion 510 may be coupled to respective BRE output nodes OUT_B via a respective BRE pull-up input transistor BM0. In some example configurations, in a given BRE pull-up portion 406, where the BRE pull-up input transistor BM0 includes multiple transistors, at least one of the BRE pull-up input transistors BM0 may be part of, such as part of a branch of, the associated adjustable portion 510. Also, in the BRE pull-up portions 406, the stability portions 602 may ensure that, at any given point in time, terminals (e.g., source terminals or drain terminals) of the BRE pull-up input transistor(s) BM0 in the respective BRE pull-up portions 406 are not floating, and instead are coupled to the high voltage VDD, in the event that respective adjustable portions 510 are configured to float the terminals. By preventing terminals (e.g., source terminals or drain terminals) of the BRE pull-up input transistors BM0 from floating, such as by coupling such terminals to the high voltage VDD, the stability portions 602 may enhance stability and/or signal integrity (e.g., by minimizing the influence of noise in the BRE pull-down portions 408) as the BRE pull-up portions 406 participate in generating the BRE intermediate signals BREI.

In addition, each ith BRE stage 308(i) may include a BRE push-down portion 408, which may correspond to the BRE push-down portion 408 shown and described with reference to FIGS. 4 and 5, and each BRE push-down portion 408 may include an adjustable or DAC portion 514, which may correspond to the adjustable or DAC portion 514 shown and described with reference to FIG. 5. In addition, each BRE push-down portion 408 may include a BRE push-down input transistor BN0 configured to receive one of the BRE path signals. In particular, the BRE push-down input transistor BN0 of the first RE stage 308(1) is configured to receive the BRE input signal BREin, the BRE push-down input transistor BN0 of the second BRE stage 306(2) is configured to receive the first BRE intermediate signal BREI(1) from the first BRE stage 308(1), the BRE push-down input transistor BN0 of the third BRE stage 308(1) is configured to receive the second BRE intermediate signal BREI(2) from the second BRE stage 308(2), and the BRE push-down input transistor BN0 of the fourth BRE stage 306(4) is configured to receive the third BRE intermediate signal BREI(3) from the third BRE stage 306(3).

As indicated by the label "*nb0" in FIG. 6, each BRE push-down input transistor BN0 may include an nb0-number of parallel-connected transistors, where "nb0" is an integer of one or more. The value of nb0 may be the same or different among the multiple BRE stages 308 of the RE path 302. In addition, the value of nb0 for the BRE stages 308 may be the same or different compared to the value of nr0 for the RE stages 306. Also, in at least some example configurations, the values of mb0 and nb0 in the BRE stages 308 are the same, although other configurations are possible. Example values for mb0 and nb0 are described below with respect to FIGS. 7-9.

In the BRE push-down portions 408, the adjustable portion 514 may be coupled to respective BRE output nodes OUT_B via a respective BRE push-down input transistor BN0. In some example configurations, in a given BRE push-down portion 408, where the BRE push-down input transistor BN0 includes multiple transistors, at least one of the BRE push-down input transistors BN0 may be part of, such as part of a branch of, the associated adjustable portion 514. Also, in the BRE push-down portions 408, the stability portions 602 may ensure that, at any given point in time, terminals (e.g., source terminals or drain terminals) of the BRE push-down input transistor(s) BN0 in the respective BRE push-down portions 408 are not floating, and instead are coupled to the low voltage VSS, in the event that respective adjustable portions 502 are configured to float the terminals. By preventing terminals (e.g., source terminals or drain terminals) of the BRE push-down input transistors BN0 from floating, such as by coupling such terminals to the low voltage VSS, the stability portions 602 may enhance stability and/or signal integrity (e.g., by minimizing the influence of noise in the BRE push-down portions 406) as the BRE push-down portions 408 participate in generating the BRE intermediate signals REI.

Figure 7:
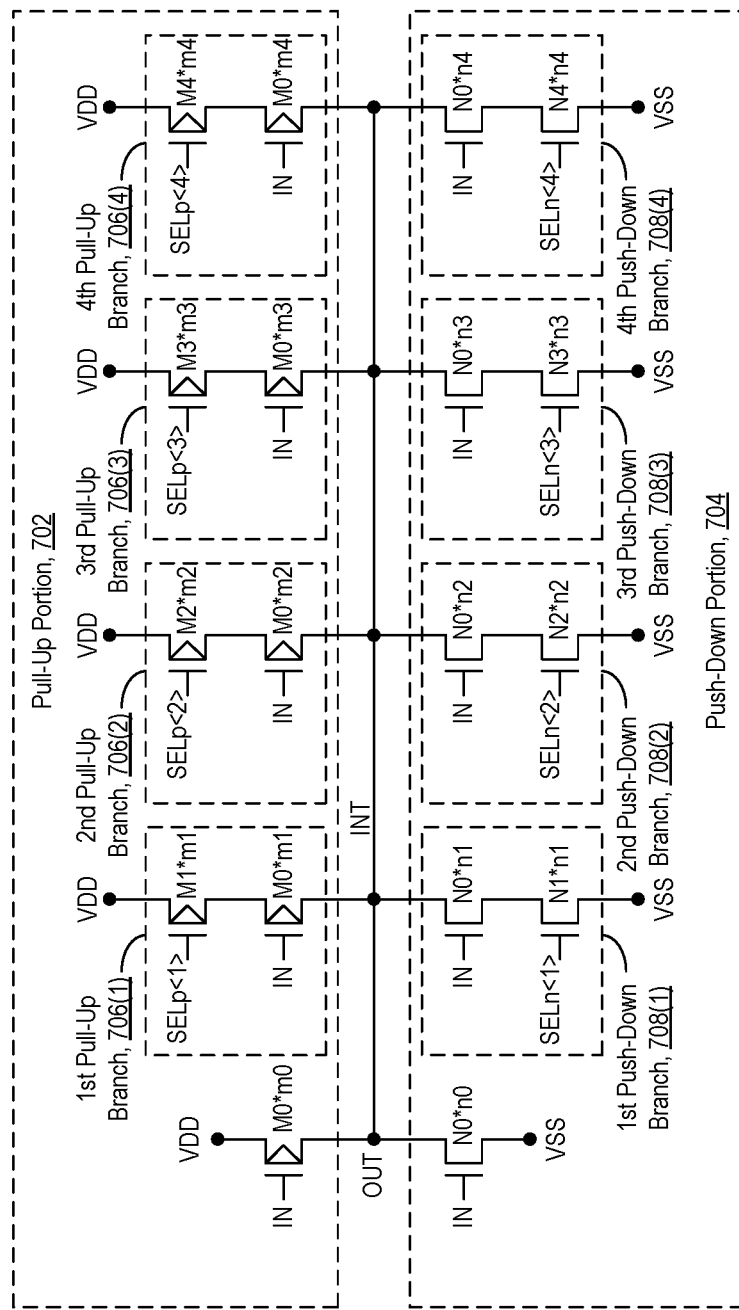
FIG. 7 is a circuit diagram of an example configuration of a pull-up portion and a push-down portion for the RE and BRE stages of FIG. 3.

FIG. 7 shows a circuit diagram of an example configuration of a pull-up portion 702 and a push-down portion 704 of an example push-pull circuit. The example configuration of the pull-up portion 702 may be an example configuration for the RE pull-up portions 402 and/or the BRE pull-up portions 406 of FIGS. 4-6. Similarly, the example configuration of the push-down portion 704 may be an example configuration for the RE push-down portions 404 and/or the BRE push-down portions 408 of FIGS. 4-6. Additionally, the example configuration shown in FIG. 7 includes four pull-up branches 706(1), 706(2), 706(3), 706(4), and four push-down branches 708(1), 708(2), 708(3), 708(4), although numbers other than four may be possible for other example configurations.

Also, the pull-up portion 702 and the push-down portion 704 may be coupled to an output node OUT, which may be representative of a given RE output node OUT_R or of a given BRE output node OUT_B in the example configurations of FIGS. 4-6. The pull-up portion 702 and the push-down portion 704 may be configured to perform respective pull-up and push-down operations to generate, at the output node OUT, an intermediate signal INT, which may be representative of a given RE intermediate signal REI generated with a given RE stage 306 or a given BRE intermediate signal BREI generated with a given BRE stage 308.

Additionally, the pull-up portion 702 may include a plurality of pull-up input transistors M0. Each pull-up input transistor M0 may be representative of an RE pull-up transistor RM0 in an RE pull-up portion 402 or of a BRE pull-up transistor BM0 in a BRE pull-up portion 406. In the example shown in FIG. 7. Each pull-up input transistor M0 may be configured to receive at an input terminal, such as a gate terminal, an input signal IN, which may be representative of an RE path signal that a given one of the RE stages 306 is configured to receive or a BRE path signal that a given one of the BRE stages 308 is configured to receive. Also, in the example configuration shown in FIG. 7, an m0-number of pull-up input transistors M0 may be configured separate from the pull-up branches 706, where "m0" is an integer value of one or more. The other pull-up input transistors M0 may be configured as part of the pull-up branches 706.

In further detail, each ith pull-up branch 706(i) may include a pull-up drive strength transistor Mi connected in series with a pull-up input transistor M0. In particular example configurations, each pull-up drive strength transistor Mi may include an mi-number of parallel-connected transistors, and each pull-up input transistor M0 of the ith pull-up branch 706(i) may include an mi-number of parallel connected transistors, where mi is an integer of one or more. Accordingly, the first pull-up branch 706(1) may include an m1-number of parallel-connected first pull-up drive strength transistors M1 connected in series with an m1-number of pull-up input transistors M0; the second pull-up branch 706(2) may include an m2-number of parallel-connected second pull-up drive strength transistors M2 connected in series with an m2-number of pull-up input transistors M0; the third pull-up branch 706(3) may include an m3-number of parallel-connected third pull-up drive strength transistors M3 connected in series with an m3-number of pull-up input transistors M0; and the fourth pull-up branch 706(4) may include an m4-number of parallel-connected fourth pull-up drive strength transistors M4 connected in series with an m4-number of pull-up input transistors M0. As shown in FIG. 7, in some example configurations, the pull-up drive strength transistors and the pull-up input transistors may be configured as PMOS transistors, although other configurations may be possible.

In a given ith pull-up branch 706(i) of a given jth RE stage 306(j) or BRE stage 308(j), the ith pull-up drive strength transistor Mi may have an input terminal, such as a gate terminal, configured to receive an ith pull-up drive strength sub-signal SELp<i>, which may be representative of an ith RE pull-up drive strength sub-signal SELpj<i> output from the controller 102 (FIG. 1). Also, in the example configuration shown in FIG. 7, the ith pull-up drive strength transistor Mi may include a first terminal, such as a source terminal, coupled to the high voltage VDD and a second terminal, such as a drain terminal, coupled to a first terminal, such as a source terminal, of the pull-up input transistor M0 of the ith pull-up branch 706(i). The pull-up input transistor M0 of the ith pull-up branch 706(i) may further include a second terminal, such as a drain terminal, coupled to the output node OUT.

The controller 102 may output the ith pull-up drive strength sub-signal SELp<i> at a first voltage level (e.g., a low voltage level) to activate or turn on the ith pull-up drive strength transistor Mi, and may output the ith pull-up drive strength sub-signal SELp<i> at a second voltage level (e.g., a high voltage level) to turn off the ith pull-up drive strength transistor Mi. When turned on, the ith pull-up drive strength transistor Mi may be configured to allow an associated current to conduct or be drawn through the ith pull-up branch 706(i). Alternatively, when turned off, the ith pull-up drive strength transistor Mi may be configured to prevent or disallow an associated current to conduct or be drawn through the ith pull-up branch 706(i). Accordingly, when the ith pull-up drive strength transistor Mi is turned on, and when the input signal IN is at a level that turns on the pull-up input transistor M0 of the ith pull-up branch 706(i) (i.e., when both the ith pull-up drive strength transistor Mi and the pull-up input transistor M0 of the ith pull-up branch 706(i) are turned on), the ith pull-up branch 706(i) is configured to draw an associated current, which in turn causes the ith pull-up branch 706(i) to participate in pulling up the voltage level of the intermediate signal INT toward the high voltage level VDD. Alternatively, when one or both of the ith pull-up drive strength transistor Mi and the pull-up input transistor M0 of the ith pull-up branch 706(i) are turned off, the ith pull-up branch 706(i) may not draw an associated current, and in turn, may not participate in pulling up the voltage level of the intermediate signal INT toward the high voltage level VDD.

Accordingly, when the controller 102 wants a given ith pull-up branch 706(i) to participate in pulling up the voltage level of the intermediate signal INT, the controller 102 may output the ith pull-up drive strength sub-signal SELp<i> at the first level to activate or turn on the ith pull-up drive strength transistor Mi. Outputting the ith pull-up drive strength signal SELp<i> to turn on the ith pull-up drive strength transistor Mi may alternatively or otherwise be referred to as turning on or activating the ith pull-up branch 706(i). Otherwise stated, the controller 102 may activate the ith pull-up branch 706(i) to participate in the pulling up of the voltage level of the intermediate signal INT by outputting the ith pull-up drive strength sub-signal SELp<i> at the first level to turn on the ith pull-up drive strength transistor Mi. Alternatively, when the controller 102 does not want the given ith pull-up branch 706(i) to participate or to be involved in pulling up the voltage level of the intermediate signal INT, the controller 102 may output the ith pull-up drive strength sub-signal SELp<i> at the second level to deactivate or turn off the ith pull-up drive strength transistor Mi. Outputting the ith pull-up drive strength signal SELp<i> to turn off the ith pull-up drive strength transistor Mi may alternatively or otherwise be referred to as turning off or deactivating the ith pull-up branch 706(i). Otherwise stated, the controller 102 may deactivate the ith pull-up branch 706(i) to be involved in the pulling up of the voltage level of the intermediate signal INT by outputting the ith pull-up drive strength sub-signal SELp<i> at the second level to turn off the ith pull-up drive strength transistor Mi.

At a minimum, the pull-up input transistor M0 separate from the pull-up branches 706 may be configured to pull-up the voltage level of the intermediate signal INT independent of whether the controller 102 has activated or deactivated the pull-up branches 706. Accordingly, the pull-up portion 702 may be configured to pull up the voltage level of the intermediate signal INT with a minimum pull-up drive strength when the controller 102 outputs the drive strength sub-signals SELp<1> to SELp<4> to deactivate all of the pull-up branches 706 such that none of the pull-up branches 706 are participating in pulling up the voltage level of the intermediate signal INT—i.e., only the pull-up input transistor M0 separate from the pull-up branches 706 is turning on to pull up the voltage level of the intermediate signal INT. Alternatively, the pull-up portion 702 may be configured to pull up the voltage level of the intermediate signal INT with a maximum pull-up drive strength when the controller 102 outputs the drive strength sub-signals SELp<1> to SELp<4> to activate all of the pull-up branches 706 such that all of the pull-up branches 706 are participating in pulling up the voltage level of the intermediate signal INT.

Accordingly, the controller 102 may be configured to set, control, and/or adjust the pull-up drive strength of the pull-up portion by outputting the pull-up drive strength sub-signals SELp<1> to SELp<4> at certain first and second levels to activate and deactivate the pull-up branches 706. When the controller 102 wants the pull-up portion 702 to pull-up the voltage level of the intermediate signal INT with an associated minimum pull-up drive strength, the controller 102 may output the pull-up drive strength sub-signals SELp<1> to SELp<4> to deactivate all of the pull-up branches 706 so that none of the pull-up branches 706 are configured to draw current and participate in pulling up the voltage level of the intermediate signal INT. Alternatively, when the controller 102 wants the pull-up portion 702 to pull-up the voltage level of the intermediate signal INT with an associated maximum pull-up drive strength, the controller 102 may output the pull-up drive strength sub-signals SELp<1> to SELp<4> to activate all of the pull-up branches 706 so that all of the pull-up branches 706 are configured to draw current and participate in pulling up the voltage level of the intermediate signal INT. Still alternatively, when the controller 102 wants the pull-up portion 702 to pull-up the voltage level of the intermediate signal INT with an associated pull-up drive strength in between the minimum pull-up drive strength and the maximum pull-up drive strength, the controller 102 may output the pull-up drive strength sub-signals SELp<1> to SELp<4> so that some of the pull-up branches 706 are activated to draw current and some of the pull-up branches 706 are deactivated to be prevented from drawing current. As previously described with respect to FIG. 5, the more current the pull-up branches 706 are configured to draw, the greater the pull-up drive strength that the pull-up portion 702 has to pull-up the voltage level of the intermediate signal INT. Similarly, the less current the pull-up branches 706 are configured to draw, the lower the pull-up drive strength that the pull-up portion 702 has to pull up the voltage level of the intermediate signal INT.

In addition, the push-down portion 704 may include a plurality of push-down input transistors N0. Each push-down input transistor N0 may be representative of an RE push-down transistor RN0 in an RE push-down portion 404 or of a BRE push-down transistor BN0 in a BRE push-down portion 408. In the example shown in FIG. 7, each push-down input transistor N0 may be configured to receive at an input terminal, such as a gate terminal, the input signal IN. Also, in the example configuration shown in FIG. 7, an n0-number of push-down input transistors N0 may be configured separate from the push-down branches 708, where "n0" is an integer value of one or more. The other push-down input transistors N0 may be configured as part of the push-down branches 708.

Also, each ith push-down branch 708(i) may include a push-down drive strength transistor Ni connected in series with a push-down input transistor N0. In particular example configurations, each push-down drive strength transistor Ni may include an ni-number of parallel-connected transistors, and each push-down input transistor N0 of the ith push-down branch 708(i) may include an ni-number of parallel connected transistors, where "ni" is an integer of one or more. Accordingly, the first push-down branch 708(1) may include an n1-number of parallel-connected first push-down drive strength transistors N1 connected in series with an n1-number of push-down input transistors N0; the second push-down branch 708(2) may include an n2-number of parallel-connected second push-down drive strength transistors N2 connected in series with an n2-number of push-down input transistors N0; the third push-down branch 708(3) may include an n3-number of parallel-connected third push-down drive strength transistors N3 connected in series with an n3-number of push-down input transistors N0; and the fourth push-down branch 708(4) may include an n4-number of parallel-connected fourth push-down drive strength transistors N4 connected in series with an n4-number of push-down input transistors N0. As shown in FIG. 7, in some example configurations, the push-down drive strength transistors and the push-down input transistors may be configured as NMOS transistors, although other configurations may be possible.

In a given ith push-down branch 708(i) of a given jth RE stage 306(j) or BRE stage 308(j), the ith push-down drive strength transistor Ni may have an input terminal, such as a gate terminal, configured to receive an ith push-down drive strength sub-signal SELn<i>, which may be representative of an ith RE push-down drive strength sub-signal SELnj<i> output from the controller 102 (FIG. 1). Also, in the example configuration shown in FIG. 7, the ith push-down drive strength transistor Ni may include a first terminal, such as a source terminal, coupled to the low voltage VSS and a second terminal, such as a drain terminal, coupled to a first terminal, such as a source terminal, of the push-down input transistor N0 of the ith push-down branch 708(i). The push-down input transistor N0 of the ith push-down branch 708(i) may further include a second terminal, such as a drain terminal, coupled to the output node OUT.

The controller 102 may output the ith push-down drive strength sub-signal SELn<i> at a first voltage level (e.g., a high voltage level) to activate or turn on the ith push-down drive strength transistor Ni, and may output the ith push-down drive strength sub-signal SELn<i> at a second voltage level (e.g., a low voltage level) to turn off the ith push-dpwn drive strength transistor Ni. When turned on, the ith pull-up drive strength transistor Ni may be configured to allow an associated current to conduct or be drawn through the ith push-down branch 708(i). Alternatively, when turned off, the ith push-down drive strength transistor Ni may be configured to prevent or disallow an associated current to conduct or be drawn through the ith push-down branch 708(i). Accordingly, when the ith push-down drive strength transistor Ni is turned on, and when the input signal IN is at a level that turns on the push-down input transistor N0 of the ith push-down branch 708(i) (i.e., when both the ith push-down drive strength transistor Ni and the push-down input transistor N0 of the ith push-down branch 708(i) are turned on), the ith push-down branch 708(*i*) is configured to draw an associated current, which in turn causes the ith push-down branch 708(*i*) to participate in pushing down the voltage level of the intermediate signal INT toward the low voltage level VSS. Alternatively, when one or both of the ith push-down drive strength transistor Ni and the push-down input transistor N0 of the ith push-down branch 708(*i*) are turned off, the ith push-down branch 708(*i*) may not draw an associated current, and in turn, may not participate in pushing down the voltage level of the intermediate signal INT toward the low voltage level VSS.

Accordingly, when the controller 102 wants a given ith push-down branch 706(*i*) to participate in pushing down the voltage level of the intermediate signal INT, the controller 102 may output the ith push-down drive strength sub-signal SELn<i> at the first level to activate or turn on the ith push-down drive strength transistor Ni. Outputting the ith push-down drive strength signal SELn<i> to turn on the ith push-down drive strength transistor Ni may alternatively or otherwise be referred to as turning on or activating the ith push-down branch 708(*i*). Otherwise stated, the controller 102 may activate the ith push-down branch 708(*i*) to participate in the pushing down of the voltage level of the intermediate signal INT by outputting the ith push-down drive strength sub-signal SELn<i> at the first level to turn on the ith push-down drive strength transistor Ni. Alternatively, when the controller 102 does not want the given ith push-down branch 706(*i*) to participate or to be involved in pushing down the voltage level of the intermediate signal INT, the controller 102 may output the ith push-down drive strength sub-signal SELn<i> at the second level to deactivate or turn off the ith push-down drive strength transistor Ni. Outputting the ith push-down drive strength signal SELn<i> to turn off the ith push-down drive strength transistor Ni may alternatively or otherwise be referred to as turning off or deactivating the ith push-down branch 708(*i*). Otherwise stated, the controller 102 may deactivate the ith push-down branch 708(*i*) to be involved in the pushing down of the voltage level of the intermediate signal INT by outputting the ith push-down drive strength sub-signal SELn<i> at the second level to turn off the ith push-down drive strength transistor Ni.

At a minimum, the push-down input transistor N0 separate from the push-down branches 708 may be configured to push-down the voltage level of the intermediate signal INT independent of whether the controller 102 has activated or deactivated the push-down branches 708. Accordingly, the push-down portion 704 may be configured to push down the voltage level of the intermediate signal INT with a minimum push-down drive strength when the controller 102 outputs the drive strength sub-signals SELn<1> to SELn<4> to deactivate all of the push-down branches 708 such that none of the push-down branches 708 are participating in pushing down the voltage level of the intermediate signal INT—i.e., only the push-down input transistor N0 separate from the push-down branches 708 is turning on to push down the voltage level of the intermediate signal INT. Alternatively, the push-down portion 704 may be configured to push down the voltage level of the intermediate signal INT with a maximum push-down drive strength when the controller 102 outputs the drive strength sub-signals SELn<1> to SELn<4> to activate all of the push-down branches 708 such that all of the push-down branches 708 are participating in pushing down the voltage level of the intermediate signal INT.

Accordingly, the controller 102 may be configured to set, control, and/or adjust the push-down drive strength of the push-down portion 704 by outputting the push-down drive strength sub-signals SELn<1> to SELn<4> at certain first and second levels to activate and deactivate the push-down branches 708. When the controller 102 wants the push-down portion 704 to push-down the voltage level of the intermediate signal INT with an associated minimum push-down drive strength, the controller 102 may output the push-down drive strength sub-signals SELn<1> to SELn<4> to deactivate all of the push-down branches 708 so that none of the push-down branches 708 are configured to draw current and participate in pushing down the voltage level of the intermediate signal INT. Alternatively, when the controller 102 wants the push-down portion 704 to push-down the voltage level of the intermediate signal INT with an associated maximum push-down drive strength, the controller 102 may output the push-down drive strength sub-signals SELn<1> to SELn<4> to activate all of the push-down branches 708 so that all of the push-down branches 708 are configured to draw current and participate in pushing down the voltage level of the intermediate signal INT. Still alternatively, when the controller 102 wants the push-down portion 702 to push down the voltage level of the intermediate signal INT with an associated push-down drive strength in between the minimum push-down drive strength and the maximum push-down drive strength, the controller 102 may output the push-down drive strength sub-signals SELn<1> to SELn<4> so that some of the push-down branches 708 are activated to draw current and some of the push-down branches 708 are deactivated to be prevented from drawing current. As previously described with respect to FIG. 5, the more current the push-down branches 708 are configured to draw, the greater the push-down drive strength that the push-down portion 704 has to push-down the voltage level of the intermediate signal INT. Similarly, the less current the push-down branches 708 are configured to draw, the lower the push-down drive strength that the push-down portion 704 has to push down the voltage level of the intermediate signal INT.

The numbers of parallel-connected transistors making up the pull-up input transistors M0, the pull-up drive strength transistors M1, M2, M3, M4, the push-down input transistors N0, and the push-down drive strength transistors N1, N2, N3, N4, may be the same or different from each other for various example configurations. For example, within a single ith pull-up branch 706(*i*), the integer "mi" may be the same or different for the ith pull-up drive strength transistors Mi and the pull-up input transistors M0 of the ith pull-up branch 706(*i*). Similarly, within a single ith push-down branch 708(*i*), the integer "ni" may be the same or different for the ith push-down drive strength transistors Ni and the push-down input transistors N0 of the ith push-down branch 708(*i*). In addition or alternatively, within the pull-up portion 702, the integers m1, m2, m3, and m4 may be the same or different from each other. In one example configuration, branches of an ith pull-up branch 706(*i*) or an ith push-down branch 708(*j*) have a binary-weighted configuration, in that the integers m1, m2, m3, and m4 are binary weighted with respect to each other such that a give ith integer mi is equal to or is proportionate to the quantity $2^{i-1}$—i.e., m1=1, m2=2, m3=4, m4=8. Similarly, within the push-down portion 704, the integers n1, n2, n3, n4 may be the same or different from each other, and in some configurations, they may be binary weighted with respect to each other. In addition or alternatively, for particular example configurations, for a specific index i, the integer values of mi and ni are the same. Various ways of setting the numbers of parallel connected transistors in the pull-up and push-down portions 702, 704 may be possible.

As previously described with respect to FIG. 6, some example configurations of the RE and BRE pull-up and push-down portions 402, 404, 406, 408 may include a stability portion 602 that is configured to prevent terminals (e.g., source terminals or drain terminals) of the pull-up input transistors from floating by coupling or biasing them to the high voltage VDD, or to prevent terminals (e.g., source terminals or drain terminals) of the push-down input transistors from floating by coupling or biasing them to the low voltage VSS as the RE and BRE pull-up and push-down portions 402, 404, 406, 408 perform their respective pull-up and push-down operations. However, the pull-up and push-down portions 702, 704 of the example configuration of FIG. 7 do not include respective stability portions.

In further detail, for a given ith pull-up branch 706($i$), in the event that the controller 102 outputs the ith pull-up drive strength sub-signal SELp<$i$> to turn off the ith pull-up drive strength transistor Mi, the source terminal(s) of the pull-up input transistor(s) M0 of the ith pull-up branch 706($i$) will float since the source terminal(s) is/are electrically disconnected from the point or node where the ith pull-up branch 706($i$) receives or is biased with the high voltage VDD. Similarly, for a given ith push-down branch 708($i$), in the event that the controller 102 outputs the ith push-down drive strength sub-signal SELn<$i$> to turn off the ith push-down drive strength transistor Ni, the source terminal(s) of the push-down input transistor(s) N0 of the ith push-down branch 708($i$) will float since the source terminal(s) is/are electrically disconnected from the point or node where the ith push-down 708($i$) receives or is biased with the low voltage VSS.

Figure 8:
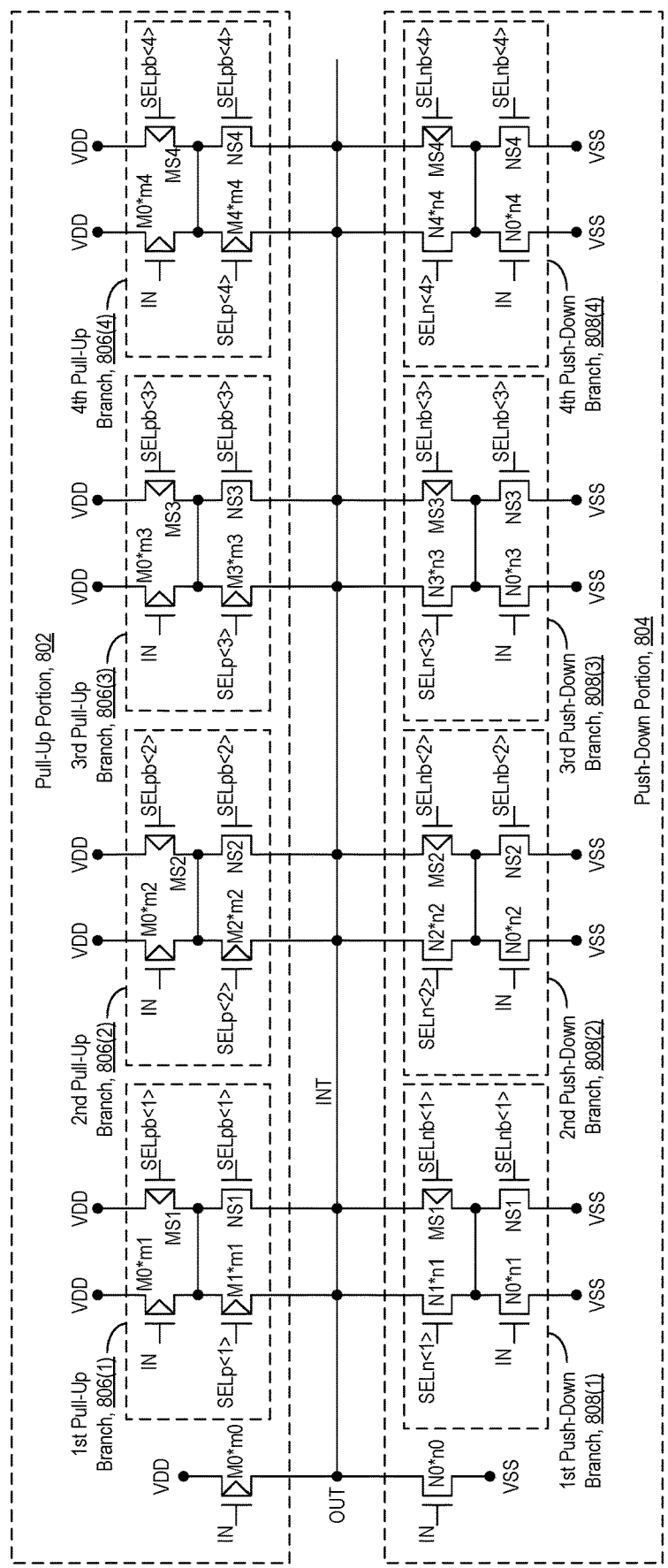
FIG. 8 is a circuit diagram of another example configuration of a pull-up portion and a push-down portion for the RE and BRE stages of FIG. 3.

FIG. 8 shows a circuit diagram of another example circuit configuration of a pull-up portion 802 and a push-down portion 804 of an example push-pull circuit. The example configuration of the pull-up portion 802 may be an example configuration for the RE pull-up portions 402 and/or the BRE pull-up portions 406 of FIGS. 4-6. Similarly, the example configuration of the push-down portion 804 may be an example configuration for the RE push-down portions 404 and/or the BRE push-down portions 408 of FIGS. 4-6.

The example configurations of the pull-up portion 802 and the push-down portion 804 of FIG. 8 are similar to the example configurations of the pull-up portion 702 and the push-down portion 704 of FIG. 7, except that pull-up branches 806 and push-down branches 808 in the example configurations of FIG. 8 may be configured to include a drive strength sub-branch and a stability sub-branch. The stability sub-branch of a pull-up or push-down branch may ensure that at all times during operation, a terminal (e.g., a source terminal or a drain terminal) is not floating due to a drive strength transistor being turned off. In particular, in the event that a drive strength sub-signal is output at a level to deactivate the drive strength sub-branch, an associated stability sub-branch may be configured to bias the drive strength sub-branch, such as with the high voltage VDD or the low voltage VSS.

In further detail, a given ith pull-up branch 806($i$) may include a pull-up stability sub-branch that includes one or more high voltage stability transistors MSi and one or more output node stability transistors NSi, in addition to a drive strength sub-branch that includes an mi-number of pull-up input transistors M0 connected in series with an mi-number of pull-up drive strength transistors Mi. In the event that the controller 102 outputs the ith pull-up drive strength sub-signal SELp<$i$> to turn off the ith pull-up drive strength transistor Mi, the drain terminal of the pull-up input transistor M0 may be floating with respect to the output node OUT since the ith pull-up drive strength transistor Mi will have electrically disconnected the drain terminal from the output node OUT. However, the high voltage stability transistor MSi may be configured to turn on to electrically connect or bias the drain terminal of the pull-up input transistor M0 of the ith pull-up branch 806($i$) to the high voltage VDD. This way, the drain terminal of the pull-up input transistor is not floating when the ith pull-up drive strength transistor Mi is turned off.

In the example configuration shown in FIG. 8, in a given ith pull-up branch 806($i$), the high voltage stability transistor MSi may be configured as a PMOS transistor and the output node stability transistor NSi may be configured as a NMOS transistor. Also, the high voltage stability transistor MSi and the output node stability transistor NSi may both include an input terminal, such as a gate terminal, that is configured to receive an inverse ith pull-up drive strength sub-signal SELpb<$i$> from the controller 102. The inverse ith pull-up drive strength sub-signal SELpb<$i$> may be the inverse or an inverted version of the ith pull-up drive strength sub-signal SELp<$i$>. That is, when the controller 102 outputs the ith pull-up drive strength sub-signal SELp<$i$> at the first level, the controller 102 may output the inverse ith pull-up drive strength sub-signal SELpb<$i$> at the second level. Additionally, when the controller 102 outputs the ith pull-up drive strength sub-signal SELp<$i$> at the second level, the controller 102 may output the inverse ith pull-up drive strength sub-signal SELpb<$i$> at the first level. The high voltage stability transistor MSi may also include a first terminal, such as a source terminal, configured to receive the high voltage VDD and a second terminal, such as a drain terminal, coupled to a drain terminal of the output node stability transistor NSi. Also, as shown in FIG. 8, a node where the high voltage and output node stability transistors MSi, NSi are connected to each other may also be connected to a node where the pull-up input transistor M0 of the ith pull-up branch 806($i$) and the ith pull-up drive strength transistor Mi are connected to each other.

Accordingly, when the controller 102 outputs the ith pull-up drive strength sub-signal SELp<$i$> at the second level to turn off the ith pull-up drive strength transistor Mi, the controller 102 may output the inverse ith pull-up drive strength sub-signal SELpb<$i$> at the first level to turn on the high voltage stability transistor MSi. The inverse ith pull-up drive strength sub-signal SELpb<$i$> at the first level may also turn off the output node stability transistor NSi. This way, in the event that the controller 102 outputs the ith pull-up drive strength sub-signal SELp<$i$> to turn off the ith pull-up drive strength transistor Mi, the controller 102 will also output the inverse ith pull-up drive strength sub-signal SELpb<$i$> to turn on the high voltage stability transistor MSi, and in turn, bias the drain terminal of the pull-up input transistor M0 of the ith pull-up branch 806($i$) with the high voltage VDD. Also, the inverse ith pull-up drive strength sub-signal SELpb<$i$> at the first level may turn off the output node stability transistor NSi. Alternatively, when the controller 102 outputs the ith pull-up drive strength sub-signal SELp<$i$> at the first level to turn on the ith pull-up drive strength transistor Mi, the controller 102 may output the inverse ith pull-up drive strength sub-signal SELpb<$i$> at the second level to turn off the high voltage stability transistor MSi. The inverse ith pull-up drive strength sub-signal SELpb<$i$> at the second level may also turn on the output node stability transistor NSi. This way, when the controller 102 outputs the ith pull-up drive strength sub-signal SELp<$i$> to turn on the ith pull-up drive strength transistor Mi, thus coupling or electrically connecting the drain terminal of the pull-up input transistor M0 to the output node OUT, the stability sub-branch does not also bias the drain terminal to the high voltage VDD.

Additionally, a given ith push-down branch 808(i) may include a push-down stability sub-branch that includes one or more low voltage stability transistors NSi and one or more output node stability transistors MSi, in addition to a drive strength sub-branch that includes an ni-number of push-down input transistors N0 connected in series with an ni-number of push-down drive strength transistors Ni. In the event that the controller 102 outputs the ith push-down drive strength sub-signal SELn<i> to turn off the ith push-down drive strength transistor Ni, the drain terminal of the push-down input transistor N0 may be floating with respect to the output node OUT since the ith push-down drive strength transistor Ni will have electrically disconnected the drain terminal from the output node OUT. However, the low voltage stability transistor NSi may be configured to turn on to electrically connect or bias the drain terminal of the push-down input transistor N0 of the ith push-down branch 808(i) to the low voltage VSS. This way, the drain terminal of the push-down input transistor is not floating when the ith push-down drive strength transistor Ni is turned off.

In the example configuration shown in FIG. 8, in a given ith push-down branch 808(i), the low voltage stability transistor NSi may be configured as an NMOS transistor and the output node stability transistor MSi may be configured as a PMOS transistor. Also, the low voltage stability transistor NSi and the output node stability transistor MSi may both include an input terminal, such as a gate terminal, that is configured to receive an inverse ith push-down drive strength sub-signal SELnb<i> from the controller 102. The inverse ith push-down drive strength sub-signal SELnb<i> may be the inverse or an inverted version of the ith push-down drive strength sub-signal SELn<i>. That is, when the controller 102 outputs the ith push-down drive strength sub-signal SELn<i> at the first level, the controller 102 may output the inverse ith push-down drive strength sub-signal SELnb<i> at the second level. Additionally, when the controller 102 outputs the ith push-down drive strength sub-signal SELn<i> at the second level, the controller 102 may output the inverse ith push-down drive strength sub-signal SELnb<i> at the first level. The low voltage stability transistor NSi may also include a first terminal, such as a source terminal, configured to receive or be biased with the low voltage VSS and a second terminal, such as a drain terminal, coupled to a drain terminal of the output node stability transistor MSi. Also, as shown in FIG. 8, a node where the low voltage and output node stability transistors NSi, MSi are connected to each other may also be connected to a node where the push-down input transistor N0 of the ith push-down branch 808(i) and the ith push-down drive strength transistor Ni are connected to each other.

Accordingly, when the controller 102 outputs the ith push-down drive strength sub-signal SELn<i> at the second level to turn off the ith push-down drive strength transistor Ni, the controller 102 may output the inverse ith push-down drive strength sub-signal SELnb<i> at the first level to turn on the low voltage stability transistor NSi. The inverse ith push-down drive strength sub-signal SELnb<i> at the first level may also turn off the output node stability transistor MSi. This way, in the event that the controller 102 outputs the ith push-down drive strength sub-signal SELn<i> to turn off the ith push-down drive strength transistor Ni, the controller 102 will also output the inverse ith push-down drive strength sub-signal SELnb<i> to turn on the low voltage stability transistor NSi, and in turn, bias the drain terminal of the push-down input transistor N0 of the ith push-down branch 808(i) with the low voltage VSS. Also, the inverse ith push-down drive strength sub-signal SELnb<i> at the first level may turn off the output node stability transistor MSi.

Alternatively, when the controller 102 outputs the ith push-down drive strength sub-signal SELn<i> at the first level to turn on the ith push-down drive strength transistor Ni, the controller 102 may output the inverse ith push-down drive strength sub-signal SELnb<i> at the second level to turn off the low voltage stability transistor NSi. The inverse ith push-down drive strength sub-signal SELnb<i> at the second level may also turn on the output node stability transistor MSi. This way, when the controller 102 outputs the ith push-down drive strength sub-signal SELn<i> to turn on the ith push-down drive strength transistor Ni, thus coupling or electrically connecting the drain terminal of the push-down input transistor N0 to the output node OUT, the stability sub-branch does not also bias the drain terminal to the low voltage VSS.

Figure 9:
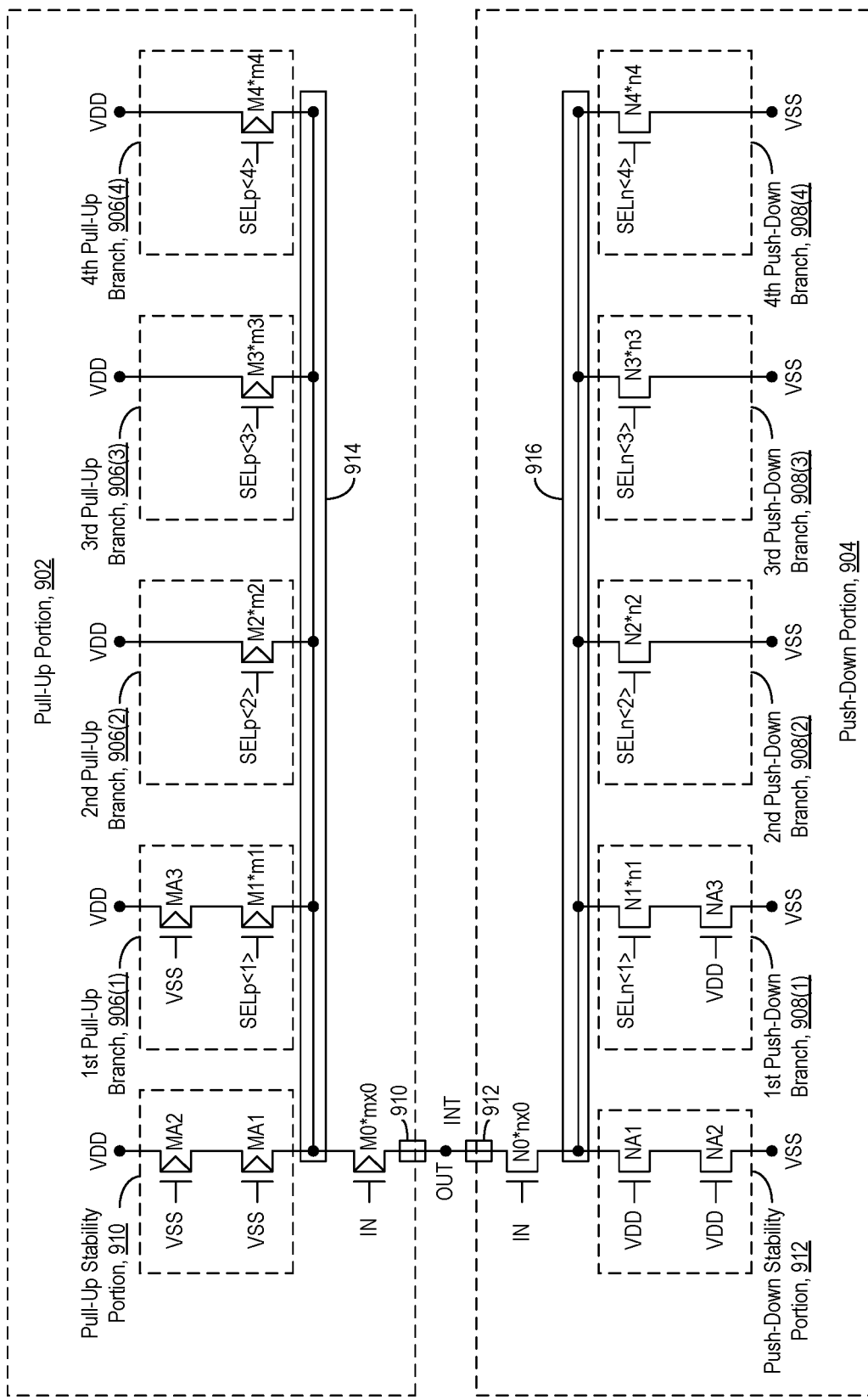
FIG. 9 is a circuit diagram of another example configuration of a pull-up portion and a push-down portion of the RE and BRE stages of FIG. 3.

FIG. 9 shows a circuit diagram of another example circuit configuration of a pull-up portion 902 and a push-down portion 904 of an example push-pull circuit. The example configuration of the pull-up portion 902 may be an example configuration for the RE pull-up portions 402 and/or the BRE pull-up portions 406 of FIGS. 4-6. Similarly, the example configuration of the push-down portion 904 may be an example configuration for the RE push-down portions 404 and/or the BRE push-down portions 408 of FIGS. 4-6.

The configurations of the pull-up and push-down portions 902, 904 of FIG. 9 may be similar to the configurations of the pull-up and push-down portions 702, 704, 802, 804 of FIGS. 7 and 8 in that each ith pull-up branch 906(i) may include an mi-number of parallel-connected pull-up drive strength transistors Mi configured to receive an ith pull-up drive strength sub-signal SELp<i> from the controller 102, and each ith push-down branch 908(i) may include an ni-number of parallel-connected push-down drive strength transistors Ni configured to receive an ith push-down drive strength sub-signal SELn<i> from the controller 102. Also, as with the configurations of FIGS. 7 and 8, the numbers of parallel-connected pull-up and push-down drive strength transistors Mi, Ni in the pull-up and push-down branches 902, 904 may be binary weighted. In some example configurations, the pull-up branch 906 with the lowest binary weight—i.e., the first pull-up branch 906(1) in the example configuration of FIG. 9—may include a pull-up transistor MA3 connected in series with the first pull-up drive strength transistor M1. The transistor MA3 may include an input terminal, such as a gate terminal, configured to receive the low voltage VSS, a first terminal configured to receive the high voltage VDD, and a second terminal connected to a terminal, such as a source terminal, of the pull-up drive strength transistor M1. Similarly, the push-down branch 908 with the lowest binary weight—i.e., the first push-down branch 908(1) in the example configuration of FIG. 9—may include a push-down transistor NA3 connected in series with the first push-down drive strength transistor N1.

The inclusion of the pull-up transistor MA3 in the first pull-up branch 906(1) and the push-down transistor NA3 in the first push-down branch 908(1) may allow for a reduction in the number parallel-connected transistors in a binary-weighted configuration for a given number of branches. That is, as previously described with reference to FIG. 7, the binary-weighted configuration may be implemented such that a given ith number $mi=2^{i-1}$. In contrast, for the example configuration in FIG. 9, the equivalent binary weight of the first pull-up and push-down branches 906(1), 908(1) may be half of the mi-number of parallel-connected first pull-up drive strength transistors M1 and half of the ni-number of parallel-connected first push-down drive strength transistors N1, respectively. This, in turn, may allow the number of parallel-connected transistors in the other pull-up branches 906(2)-906(4) and the other push-down branches 908(2)-908(4) to be cut in half while still maintaining a binary-weighted configuration. For example, the m2-number of second pull-up drive strength transistors M2 may be the same as the m1-number of first pull-up drive strength transistors M1, and the second pull-up branch 906(2) may have twice the binary weight as the first pull-up branch 906(1). Likewise, the n2-number of second push-down drive strength transistors N2 may be the same as the n1-number of first push-down drive strength transistors N1, and the second push-down branch 908(2) may have twice the binary weight as the first push-down branch 908(1). In a particular example configuration, the m1-number of first pull-up drive strength transistors M1 and the m2-number of second pull-up drive strength transistors M2 may both be one (i.e., m1=m2=1), the m3-number of third pull-up drive strength transistors M3 may be two (i.e., m3=2), and the m4-number of fourth pull-up drive strength transistors M4 may be four (i.e., m4=4). Likewise, the n1-number of first push-down drive strength transistors N1 and the n2-number of second push-down drive strength transistors N2 may both be one (i.e., n1=n2=1), the n3-number of third push-down drive strength transistors N3 may be two (i.e., n3=2), and the n4-number of fourth push-down drive strength transistors N4 may be four (i.e., n4=4).

In addition, the pull-up portion 902 may include an mx0-number of pull-up input transistors M0, and the push-down portion 904 may include an nx0-number of push-down input transistors N0. The pull-up input transistor(s) M0 and the push-down input transitor(s) N0 may each include an input terminal, such as a gate terminal, configured to receive the input signal IN. A difference between the push-pull circuit configurations of FIGS. 7 and 8, and the push-pull circuit configuration of FIG. 9 is that in the example configuration of FIG. 9, all of pull-up input transistors M0 may be implemented as components of the pull-up portion 902 that are separate from the pull-up branches 906, and all of the push-down input transistors N0 may be implemented as components of the push-down portion 904 that are separate from the push-down branches 908. For the configuration of FIG. 9, the drive strength transistors still form series connections with the input transistors. However, from a layout perspective, the focus for the configuration in FIG. 9 is on minimizing the length of the output node OUT (e.g., the length of the connection that connects the drain terminals of the pull-up input transistors M0 with each other and with the drain terminals of the push-down input transistors N0). In contrast, by configuring at least some of the pull-up input transistors M0 as components of the pull-up branches and at least some of the push-down input transistors N0 as components of the push-down branches, as in the example configurations of FIGS. 7 and 8, from a physical layout perspective, the focus is on directly connecting the drive-strength transistors to input transistors that are part of the same pull-up or push-down branch. As a result, in the example configuration of FIG. 9, physical connections connecting together terminals of the input transistors M0, N1 to the output node OUT, represented by boxes 910, 912 in FIG. 9, may have shorter lengths compared physical connections connecting together drive strength transistors of different branches, represented by boxes 914 and 916 in FIG. 9. In turn, such physical connections represented by boxes 910, 912 may be shorter compared to the physical connections connecting the input transistors to the output node OUT for the example configurations of FIGS. 7 and 8. A shorter output node length may be more advantageous in that it may reduce the load capacitance and/or the load resistance, which in turn can provide enhanced or improved performance by allowing the RE and BRE stages 306, 308 to drive the pulses of the RE and BRE intermediate signals REI, BREI to the high and low levels VDD, VSS faster.

In the example configuration of FIG. 9, the pull-up portion 902 may further include a pull-up stability portion 910 and the push-down portion 904 may further include a push-down stability portion 912. The pull-up and push-down stability portions 910, 912 may be representative of the stability portions 602 in the RE and BRE pull-up and push-down portions 402, 404, 406, 408 of FIG. 6. In addition, the pull-up stability portion 910 may ensure that the source terminal(s) of the pull-up input transistor(s) M0 is/are not floating, and instead are still biased with the high voltage VDD, in the event that all of the pull-up branches 906 are deactivated. The pull-up stability portion 910 may include at last one pull-up transistor configured to couple the source terminal(s) of the pull-up input transistor(s) M0 to the high voltage VDD. In the particular example configuration shown in FIG. 9, the pull-up stability portion 910 includes a pair of series connected PMOS transistors MA1, MA2, each configured to receive the low voltage VSS at their respective gate terminals. This way, even if all of the pull-up branches 906 are deactivated, the source terminal(s) of the pull-up input transistor(s) M0 are still biased with the high voltage VDD and the pull-up input transistor(s) M0 are still able to pull up the voltage level of the intermediate signal INT at the output node OUT. Similarly, the push-down stability portion 912 may ensure that the source terminal(s) of the push-down input transistor(s) N0 is/are not floating, and instead are still biased with the low voltage VSS, in the event that all of the push-down branches 908 are deactivated. The push-down stability portion 912 may include at last one push-down transistor configured to couple the source terminal(s) of the push-down input transistor(s) N0 to the low voltage VSS. In the particular example configuration shown in FIG. 9, the push-down stability portion 912 includes a pair of series connected NMOS transistors NA1, NA2, each configured to receive the high voltage VDD at their respective gate terminals. This way, even if all of the push-down branches 908 are deactivated, the source terminal(s) of the push-down input transistor(s) N0 are still biased with the low voltage VSS and the push-down input transistor(s) N0 are still able to push down the voltage level of the intermediate signal INT at the output node OUT.

Referring back to FIG. 1, the duty cycle correction system 100, including the controller 102 and the slope adjustment circuit 104, may be configured to correct for duty cycle distortion, such as by reducing, minimizing, and/or eliminating duty cycle distortion, in the complementary output signals DQS, BDQS by performing a duty cycle correction process in which the controller 102 measures a duty cycle distortion of a pair of complementary sample signals, and in response to the measurement, sets drive strengths of the RE and BRE stages 306, 308. As described in further detail below, the controller 102 is configured to measure the duty cycle distortion of the pair of sample signals by determining an amount of duty cycle mismatch between the duty cycles of the pair of sample signals, and/or by determining which of the duty cycles of the pair of sample signals is higher and which is lower. Additionally, herein, a pair of sample signals are the signals input to a controller (e.g., the controller 102) configured to perform a correction process. In general, the pair of sample signals may be any pair of complementary signals received by the complementary signal path (i.e., the input signals REin, BREin) or generated with circuitry of the complementary signal path (i.e., any pair of intermediate signals REI, BREI or any pair of output signals DQS, BDQS (or a second pair of output signals DQS_OUT, BDQS_OUT, as described below with reference to FIGS. 19 and 20)). In the example correction systems described herein, the pair of sample signals is the last pair of signals generated in a given complementary signal path, such as the pair of output signals DQS, BDQS in FIG. 1. However, as mentioned, the sample signals may be any of the pairs of signals received by the complementary signal path or generated with circuitry of the complementary signal path for various other example configurations. Also, the circuitry of a given complementary signal path configured to generate the last pair of complementary signals may be referred to as an output circuit of the complementary signal path.

The duty cycle correction system 100 may be configured to perform a duty cycle correction process over a plurality or predetermined number of iterations, during which the controller 102 may set drive strengths of the pull-up and push-down portions of the RE and BRE stages by outputting drive strength signals DS at certain levels to the RE stages 306 and the BRE stages 308 over the plurality of iterations. The RE and BRE stages 306, 308 may respond to the drive strength signals DS by setting and/or adjusting the drive strengths at which they generate their respective RE and BRE intermediate signals REI, BREI corresponding to the levels of the drive strength signals. The RE and BRE stages 306, 308 may set and/or adjust their drive strengths by setting and/or adjusting the amount of current their respective pull-up and push-down branches are configured to draw to pull up and push down the voltage levels of the RE and BRE intermediate signals REI, BREI, as previously described.

The RE and BRE stages 306, 308 may generate their respective RE and BRE intermediate signals REI, BREI with rising slopes and falling slopes that correspond to the drive strengths at which they pull-up and push down the voltage levels of the RE and BRE intermediate signals REI, BREI. Adjusting the rising and falling slopes of certain rising and falling transitions of the RE and BRE intermediate signals REI, BREI may cause the RE and BRE stages 306, 308 to correspondingly change the duty cycles of at least one of the pairs of intermediate signals REI, BREI compared to the duty cycles of the RE and BRE input signals REin, BREin. The change in the duty cycles of at least one of the pairs of intermediate signals REI, BREI may, in turn, correspondingly change the duty cycles of the output signals DQS, BDQS.

In a given duty cycle correction process, the controller 102 may reduce duty cycle distortion in the output signals DQS, BDQS by controlling duty cycle adjustment performed by the RE and BRE stages 306, 308. To do so, the controller 102 may output the drive strength signals DS at certain levels over a plurality of iterations to cause certain pull-up and push-down portions 402, 404, 406, 408 of the RE and BRE stages 306, 308 to set and/or adjust their drive strengths, and in turn set and/or adjust the rising and falling slopes at which the RE and BRE stages 306, 308 generate the rising and falling transitions of their respective RE and BRE intermediate signals REI, BREI. The controller 102 may output the drive strength signals DS at the certain levels over the plurality of iterations such that at least by the last of the predetermined of iterations, changes in drive strengths in the RE and BRE stages 306, 308 may in turn cause at least the last pair of RE and BRE stages 306(N), 308(N) to output the last pair of intermediate signals REI(N), BREI(N) with adjusted duty cycles that, in turn, reduce, minimize, and/or eliminate duty cycle distortion in the pair of output signals DQS, BDQS.

In addition, in a given duty cycle correction process, the duty cycle correction system 100 may be configured to reduce duty cycle distortion according to a duty cycle correction (DCC) slope adjustment scheme. Under the DCC slope adjustment scheme, the controller 102 may be configured to identify one of the output signals DQS, BDQS as the output signal to have its duty cycle increased to reduce duty cycle distortion and the other of the output signals DQS, BDQS as the output signal to have its duty cycle decreased to reduce duty cycle distortion. In addition, under the DCC slope adjustment scheme, the slope adjustment circuit 104 may be configured to reduce rising slopes of rising transitions of intermediate signals that correspond to the output signal identified to have its duty cycle decreased. Further, under the DCC slope adjustment scheme, the slope adjustment circuit 104 may be configured to reduce falling slopes of falling transitions of intermediate signals that correspond to the output signal identified to have its duty cycle increased. In addition, the controller 102 may be configured to output the drive strength signals DS to certain pull-up and push-down portions according to the DCC slope adjustment scheme. In particular, under the DCC slope adjustment scheme, the controller 102 may be configured to output the drive strength signals DS to reduce drive strengths of certain pull-up portions to cause reductions in rising slopes of rising transitions of intermediate signals that correspond to the output signal identified to have its duty cycle decreased. Additionally, under the DCC slope adjustment scheme, the controller 102 may be configured to output the drive strength signals DS to reduce drive strengths of certain push-down portions to cause a reduction in falling slopes of falling transitions that correspond to the output signal identified to have its duty cycle increased.

Figure 10A:
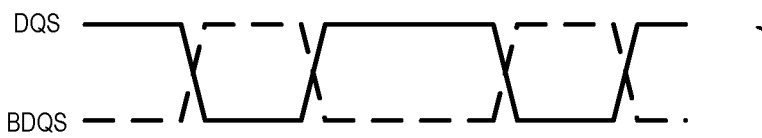
FIG. 10A is a timing diagram of output signals having duty cycle distortion before slope adjustment is performed.
Figure 10B:
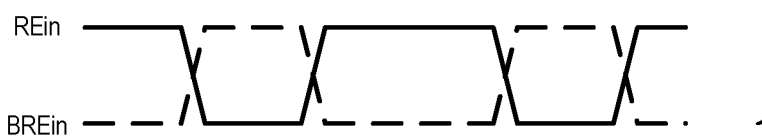
FIG. 10B is a timing diagram of input signals having duty cycle distortion before slope adjustment is performed.

FIGS. 10A-10F show timing diagrams various example complementary signals received by and generated in the complementary signal path to illustrate duty cycle correction through slope reduction in accordance with the DCC slope adjustment scheme. FIGS. 10A and 10B shows the output signals DQS, BDQS and the input signals REin, BREin, respectively, with duty cycle distortion before slope reduction is performed. FIG. 10A shows the first output signal DQS with a higher duty cycle than the duty cycle of the second output signal BDQS. As such, in order to reduce the duty cycle distortion, the first output signal DQS is the output signal to have its duty cycle reduced to reduce duty cycle distortion, and the second output signal BDQS is the output signal to have its duty cycle increased to reduce duty cycle distortion. Correspondingly, FIG. 10B shows the RE input signal REin with a higher duty cycle than the duty cycle of the BRE input signal BREin.

Figure 10C:
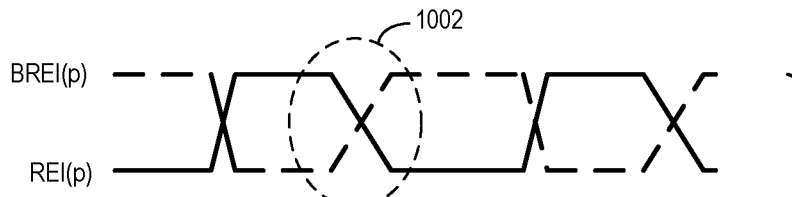
FIG. 10C is a timing diagram of a pair of complementary signals with reduced slopes that correspond to an output signal to have its duty cycle increased.
Figure 10D:
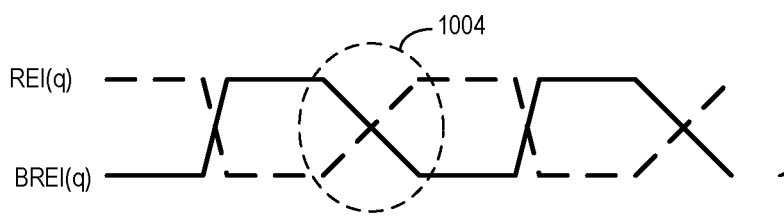
FIG. 10D is a timing diagram of a pair of complementary signals with reduced slopes that correspond to an output signal to have its duty cycle decreased.

FIGS. 10C and 10D show pth and qth pairs of intermediate signals REI(p), BREI(p) and REI(q), BREI(q), respectively, generated with slope reduction during a duty cycle correction process. Referring particularly to FIG. 10C, the pth REI intermediate signal REI(p) may correspond to the second output signal BDQS to have its duty cycle increased, and the pth BREI intermediate signal BREI(p) may correspond to the first output signal DQS to have its duty cycle decreased. Accordingly, as indicated by the dotted oval 1002, the pth RE stage 306(p) may generate the pth REI intermediate signal REI(p) with falling transitions having reduced slopes, and the pth BRE stage 308(*p*) may generate the pth BREI intermediate signal BREI(p) with rising transitions having reduced slopes.

Referring particularly to FIG. 10D, the qth REI intermediate signal REI(q) may correspond to the first output signal DQS to have its duty cycle decreased, and the qth BREI intermediate signal BREI(q) may correspond to the second output signal BDQS to have its duty cycle increased. Accordingly, as indicated by the dotted oval 1004, the qth RE stage 308(*p*) may generate the qth REI intermediate signal REI(q) with rising transitions having reduced slopes, and the qth BRE stage 308(*q*) may generate the qth BREI intermediate signal BREI(q) with falling transitions having reduced slopes.

Figure 10E:
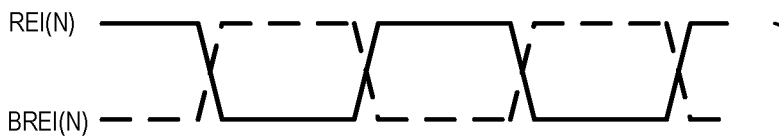
FIG. 10E is a timing diagram of a last pair of intermediate signals with duty cycle distortion eliminated.

FIG. 10E shows the last or Nth RE and BRE intermediate signals REI(N), BREI(N) output from the last RE and BRE stages 306(N), 308(N) after slope reduction is performed. The last REI and BRE intermediate REI(N), BREI(N) are shown with having no duty cycle distortion—i.e., an amount of duty cycle distortion that is lower than the duty cycle distortion in the output signals DQS, BDQS and the input signals REin, BREin of FIGS. 10A and 10B, respectively. Accordingly, through performance of slope reduction the slope adjustment circuit 104 may be configured to output the last pair of intermediate signals REI(N), BREI(N) with reduced duty cycle distortion compared to the input signals REin, BREin.

Figure 10F:
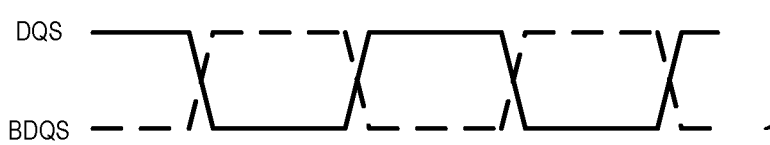
FIG. 10F is a timing diagram of the pair of output signals of FIG. 10 with duty cycle distortion eliminated.

FIG. 10F shows the output signals DQS, BDQS with no or at least reduced duty cycle distortion compared to the input signals REin, BREin. The output signals DQS, BDQS in FIG. 10F are representative of the output signals DQS, BDQS that the data alignment circuit 106 may generated in response to the last pair of intermediate signals REI(N), BREI(N), assuming that the data alignment circuit 106 itself does not add duty cycle distortion when generating the output signals DQS, BDQS. In other words, FIG. 10A represents the output signals DQS, BDQS with duty cycle distortion corresponding to the duty cycle distortion of the input signals REin, BREin if no duty cycle correction through slope adjustment is performed, and FIG. 10F represents the output signals DQS, BDQS with reduced, minimized, or eliminated duty cycle when slope adjustment is performed, where the duty cycle distortion is reduced relative to the duty cycle distortion of the input signals REin, BREin and/or output signals DQS, BDQS if no duty cycle correction were to be performed.

During a given duty cycle correction process, for a given jth stage (either a jth RE stage 306(*j*) or a jth BRE stage 308(*j*)), in the event that the controller 102 determines that the jth stage is to reduce the rising slopes of the rising transitions when generating its jth intermediate signal, the controller 102 may be configured to output the jth pull-up and push-down drive strength signals at first and second levels to cause the pull-up portion of the jth stage to pull up the voltage level of the jth intermediate signal with lower drive strength than the drive strength that the push-down portion of the jth stage 404 has to push down the voltage level of the jth intermediate signal. Similarly, in the event that the controller 102 determines that the jth stage is to reduce the falling slopes of the falling transitions when generating the jth intermediate signal, the controller 102 may be configured to output the jth pull-up and push-down drive strength signals at first and second levels to cause the push-down portion of the jth stage to push down the voltage level of the jth intermediate signal with lower drive strength than the drive strength the pull-up portion has to pull up the voltage level of the jth intermediate signal.

In some example configurations, during a given duty cycle correction process, for a given jth stage that is to generate its jth intermediate signal with reduced rising slopes of the rising transitions, the controller 102 may output the jth drive strength signals to keep or maintain the push-down drive strength of the push-down portion of the jth stage at an initial, predetermined level or amount over the plurality of iterations, while outputting the jth drive strength signals to adjust the pull-up drive strength of the pull-up portion over the plurality of iterations. In some example configurations, the initial predetermined push-down drive strength amount may be a maximum push-down drive strength amount that the push-down portion is configured to have. During a given iteration, the controller 102 may adjust the pull-up drive strength of the pull-up portion by increasing and/or decreasing the amount of the pull-up drive strength of the pull-up portion relative to the amount of the pull-up drive strength of the pull-up portion in the last or prior iteration. However, in each iteration, the amount of pull-up drive strength that the controller 102 sets for the pull-up portion may be equal to or lower than the amount of push-down drive strength that the push-down portion has.

Similarly, during a given duty cycle correction process, for a given jth stage that is to generate its jth intermediate signal with reduced falling slopes of the falling transitions, the controller 102 may output the jth drive strength signals to keep or maintain the pull-up drive strength of the pull-up portion of the jth stage at an initial, predetermined level or amount over the plurality of iterations, while outputting the jth drive strength signals to adjust the push-down drive strength of the push-down portion over the plurality of iterations. In some example configurations, the initial predetermined pull-up drive strength amount may be a maximum pull-up drive strength amount that the pull-up portion is configured to have. During a given iteration, the controller 102 may adjust the push-down drive strength of the push-down portion by increasing and/or decreasing the amount of the push-down drive strength of the push-down portion relative to the amount of the push-down drive strength of the push-down portion in the last or prior iteration. However, in each iteration, the amount of push-down drive strength that the controller 102 sets for the push-down portion may be equal to or lower than the amount of pull-up drive strength that the pull-up portion has.

In order to reduce rising slopes of rising transitions of certain intermediate signals and reduce falling slopes of falling transitions other intermediate signals, the controller 102, such as at the start of a given duty cycle correction process, may be configured to identify certain pull-up and push-down portions 402, 404, 406, 408 of the RE and BRE stages that are eligible to have their drive strengths adjusted during the course of the duty cycle correction process, and other pull-up and push down portions 402, 404, 406, 408 that are ineligible to have their drive strengths adjusted during the course of the duty cycle correction process. Those pull-up and push-down portions 402, 404, 406, 408 that the controller 102 identifies to be eligible for drive strength adjustment are referred to as eligible or selected pull-up or push-down portions. Additionally, those pull-up and push-down portions 402, 404, 406, 408 that the controller 102 identifies as being ineligible for drive strength adjustment are referred to as ineligible or unselected pull-up or push-down portions.

At the start or in the first iteration of a given duty cycle correction process, the controller 102 may be configured to identify the selected and unselected portions of the RE and BRE stages 306, 306. To do so, for a given jth stage, if the controller 102 determines that the jth intermediate signal that the jth stage generates corresponds to the output signal to have its duty cycle increase, the controller 102 may identify the push-down portion of the jth stage as a selected portion and may identify the pull-up portion as an unselected portion, since the controller 102 will want the jth stage to reduce the falling slopes of the jth intermediate signal that it generates. In addition, for a given jth stage, if the controller 102 determines that the jth intermediate signal that the jth stage generates corresponds to the output signal to have its duty cycle decrease, the controller 102 may identify the pull-up portion of the jth stage as a selected portion and may identify the push-down portion as an unselected portion, since the controller 102 will want the jth stage to reduce the rising slopes of the jth intermediate signal that it generates.

In accordance with the DCC slope adjustment scheme, the controller 102 may be configured with a correspondence mapping that maps or associates each of the RE stages 306 and the BRE stages 308 to the first output signal DQS or to the second output signal BDQS. In particular, if a given jth stage generates a jth intermediate signal that corresponds to the first output signal DQS, then the correspondence mapping may map the jth stage to the first output signal DQS, and if a given jth stage generates a jth intermediate signal that corresponds to the second output signal BDQS, then the correspondence mapping may map the jth stage to the second output signal BDQS. The correspondence mapping may be a preconfigured mapping, in that the controller 102 may be preconfigured with the correspondence mapping in order to perform duty cycle correction processes.

In addition, the controller 102 may be configured to identify the selected and unselected portions based on a combination of the correspondence mapping and a determination or identification of which of the output signals DQS, BDQS has the initially higher duty cycle which has the initially lower duty cycle. In particular, during a first iteration of a duty cycle correction process, the controller 102 may identify which of the output signals DQS, BDQS has the higher duty cycle and which has the lower duty cycle. Based on this identification, the controller 102 may determine which of the duty cycles of the output signals DQS, BDQS is to be decreased and which is to be increased to reduced duty cycle distortion in the output signals DQS, BDQS. For example, in the event that the controller 102 determines that the first output signal DQS has the initially higher duty cycle, then the controller 102 may determine that the duty cycle of the first output signal DQS is to be decreased and the duty cycle of the second output signal BDQS is to be increased to reduce duty cycle distortion. Additionally, in the event that the controller 102 determines that the second output signal BDQS has the initially higher duty cycle, then the controller 102 may determine that the duty cycle of the first outputs signal DQS is to be increased and the duty cycle of the second output signal BDQS is to be decreased to reduce duty cycle distortion.

Upon identifying which of the duty cycles is to be increased and which is to be decreased to reduce duty cycle distortion, the controller 102 may then use the correspondence mapping in combination with the identification of which duty cycle is to be increased and which is to be decreased to identify the selected and unselected portions in the RE and BRE stages 306, 308. For example, suppose in a first iteration that the controller 102 determines that the first output signal DQS has a duty cycle that is initially higher than the duty cycle of the second output signal BDQS, and in turn determines to decrease the duty cycle of the first output signal DQS and increase the duty cycle of the second output signal BDQS. In response, for each of the RE and BRE stages 306, 308, where the controller 102 identifies, through use of the correspondence mapping, that a given jth stage is mapped to the first output signal DQS, the controller 102 may identify the pull-up portion of the jth stage as a selected portion for rising slope reduction, and may identify the push-down portion of the jth stage as an unselected portion. Alternatively, where the controller 102 identifies, through use of the correspondence mapping, that a given jth stage is mapped to the second output signal BDQS, the controller 102 may identify the pull-up portion of the jth stage as an unselected portion and the push-down portion of the jth stage as a selected portion for falling slope reduction.

As another example, suppose in a first iteration that the controller 102 determines that the first output signal DQS has a duty cycle that is initially lower than the duty cycle of the second output signal BDQS, and in turn determines to increase the duty cycle of the first output signal DQS and decrease the duty cycle of the second output signal BDQS. In response, for each of the RE and BRE stages 306, 308, where the controller 102 identifies, through use of the correspondence mapping, that a given jth stage is mapped to the first output signal DQS, the controller 102 may identify the push-down portion of the jth stage as a selected portion for falling slope reduction, and may identify the pull-up portion of the jth stage as an unselected portion. Alternatively, where the controller 102 identifies, through use of the correspondence mapping, that a given jth stage is mapped to the second output signal BDQS, the controller 102 may identify the pull-up portion of the jth stage as a selected portion for rising slope reduction and the push-down portion of the jth stage as an unselected portion.

Figure 11:
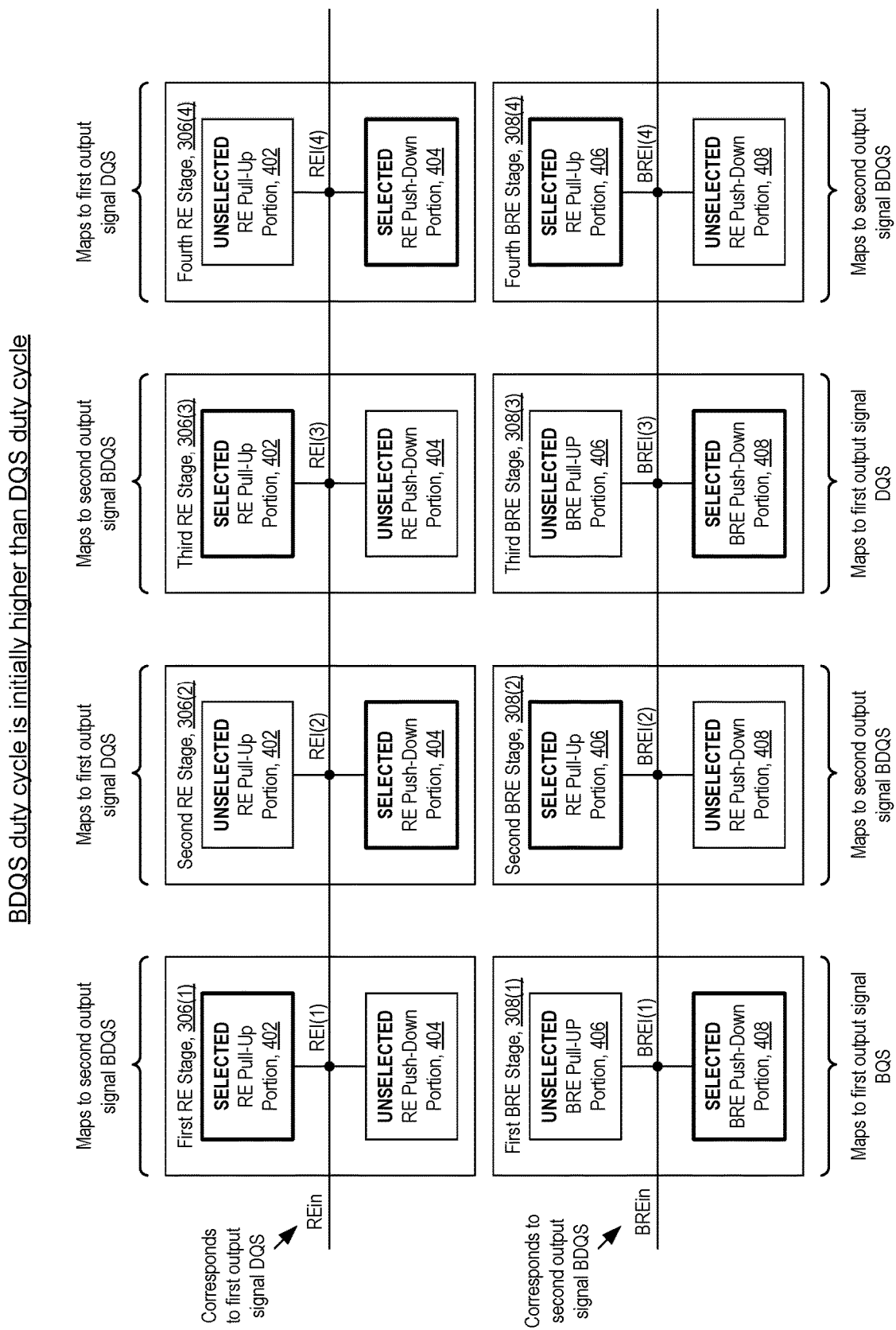
FIG. 11 is a block diagram of the RE and BRE stages of FIG. 3, with their respective pull-up and push-down portions identified as selected or unselected in response to an identification that a duty cycle of a second output signal is initially higher than a duty cycle of a first output signal.
Figure 12:
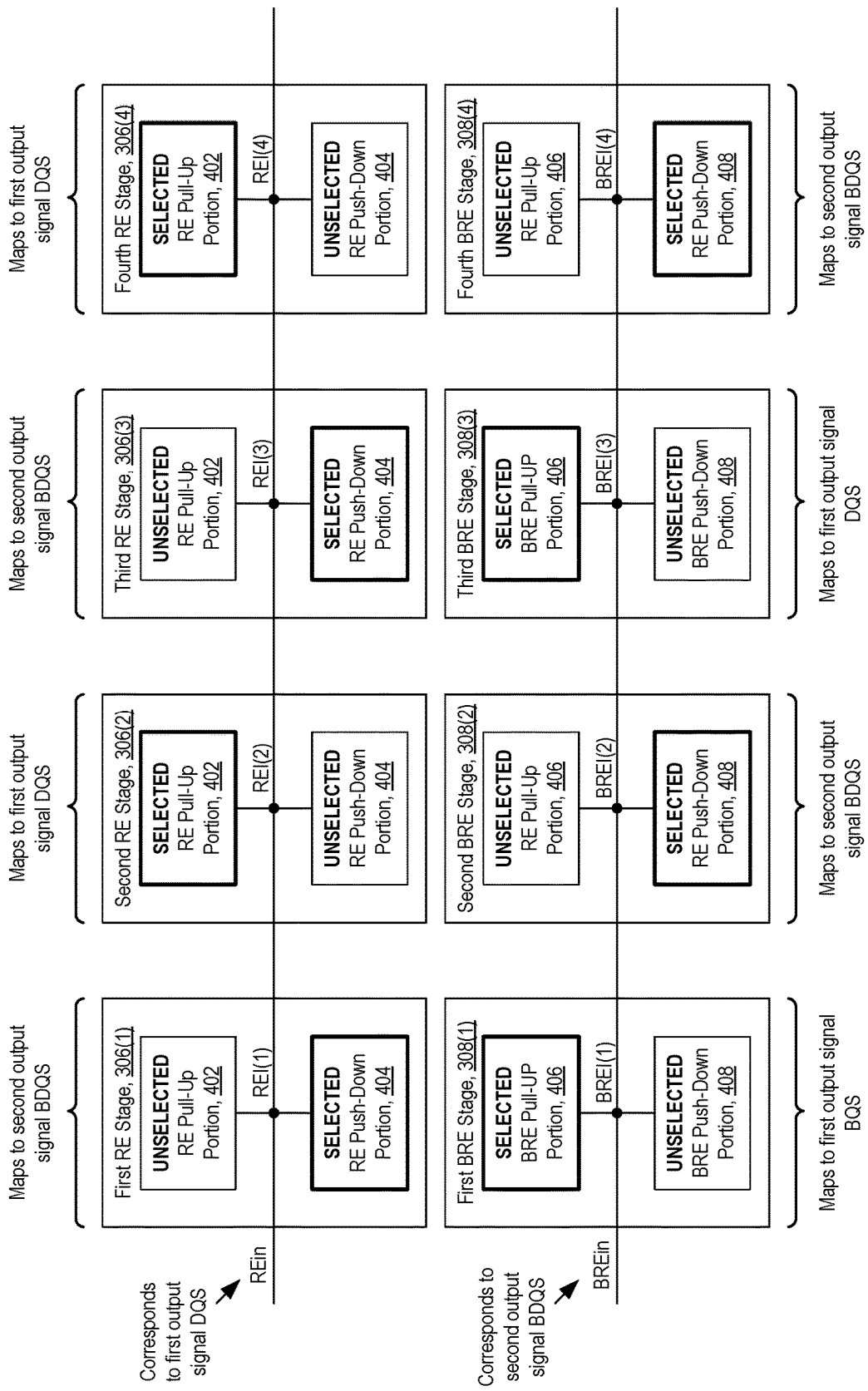
FIG. 12 is a block diagram of the RE and BRE stages of FIG. 3, with their respective pull-up and push-down portions identified as selected or unselected in response to an identification that a duty cycle of a first output signal is initially higher than a duty cycle of a second output signal.

FIGS. 11 and 12 show block diagrams of the example configuration of the four RE stages 306 and the four BRE stages 308 of FIGS. 3 and 6, and further with each of the pull-up and push-down portions being identified as selected or unselected. Those pull-up and push-down portions that the controller 102 identifies as unselected and that pull-up and push-down voltage levels of associated RE and BRE intermediate signals REI, BREI with an initial drive strength amount may be part of a first set of pull-up and push-down portions. In addition, those pull-up and push-down portions that the controller 102 identifies as selected and that pull-up and push-down voltage levels of associated RE and BRE intermediate signals with reduced drive strength amounts lower than the initial drive strength amount may be part of a second set of pull-up and push-down portions. Accordingly, the controller 102 may be configured to identify a configuration of the pull-up and push-down portions in the first set and the second set—e.g., which of the pull-up and push-down portions 402, 404, 406, 406 are as unselected and in the first set and which of the pull-up and push-down portions 402, 404, 406, 408 are identified as selected and in the second set—dependent on a measurement of an initial duty cycle distortion in the output signals DQS, BDQS, that is, which of the duty cycles of the output signals DQS, BDQS is higher. FIG. 11 shows a case where the duty cycle of the second output signal BDQS is initially higher than the duty cycle of the first output signal BQS. FIG. 12 shows a case where the duty cycle of the first output signal DQS is initially higher than the duty cycle of the second output signal BDQS. The dependency of the selected and unselected portions on which of the output signals DQS, BDQS initially has the higher duty cycle may yield different configurations of the pull-up and push-down in the first set and in the second set, as demonstrated when comparing the selected and unselected portions between FIGS. 11 and 12.

Referring particularly to FIG. 11, FIG. 11 shows a block diagram of the example configuration of the four RE stages 306 and the four BRE stages 308 of FIGS. 3 and 6, and further with each of the pull-up and push-down portions being identified as selected or unselected in response to an identification that the duty cycle of the second output signal BDQS is initially higher than the duty cycle of the first output signal DQS. In the example configuration shown in FIG. 11, each of the RE and BRE stages 306, 308 may be configured as inverters. Accordingly, the correspondence mapping may alternatingly map consecutive RE stages 306 in the RE path 302 to the first output signal DQS and the second output signal BDQS. As shown, given that the RE input signal REin corresponds to the first output signal DQS, the correspondence mapping maps the first RE stage 306(1) to the second output signal BDQS, the second RE stage 306(2) to the first output signal DQS, the third RE stage 306(3) to the second output signal BDQS, and the fourth RE stage 306(4) to the first output signal DQS. In addition, given that the BRE input signal BREin corresponds to the second output signal BDQS, the correspondence mapping maps the first BRE stage 308(1) to the first output signal DQS, the second BRE stage 308(2) to the second output signal BDQS, the third BRE stage 308(3) to the first output signal DQS, and the fourth BRE stage 308(4) to the second output signal BDQS.

In response to determining that the second output signal BDQS has an initially higher duty cycle than the first output signal DQS, and in accordance with the correspondence mapping and the DCC slope adjustment scheme as previously described, the controller 102 may be configured to identify, for each jth pair of RE and BRE stages 306(j), 308(j), one of the RE and BRE stages 306(j), 308(j) has its pull-up portion as a selected portion and its push-down portion as an unselected portion, and the other of the RE and BRE stages 306(j), 308(j) has selected and unselected portions reversed—i.e., the pull-up portion is the unselected portion and the push-down portion is the selected portion. Also, with respect to one path—either the RE path 302 or the BRE path 304, consecutive stages have alternating selected and unselected portions. That is, one of the consecutive stages of a given path has its pull-up portion as the selected portion and its push-down portion as the unselected portion, and the other of the consecutive stages of the given path has its pull-up portion as the unselected portion and its push-down portion as the selected portion.

With respect to the RE stages 306: the RE pull-up portion 402 of the first RE stage 306(1) as a selected portion and the RE push-down portion 404 of the first RE stage 306(1) as an unselected portion, the RE pull-up portion 402 of the second RE stage 306(2) as an unselected portion and the RE push-down portion 404 of the second RE stage 306(2) as a selected portion, the RE pull-up portion 402 of the third RE stage 306(3) as a selected portion and the RE push-down portion 404 of the third RE stage 306(3) as an unselected portion, and the RE pull-up portion 402 of the fourth RE stage 306(4) as an unselected portion and the RE push-down portion 404 of the fourth RE stage 306(4) as a selected portion. In addition, with respect to the BRE stages 308, the controller 102 may be configured to identify: the BRE pull-up portion 406 of the first BRE stage 308(1) as an unselected portion and the BRE push-down portion 408 of the first BRE stage 308(1) as a selected portion, the BRE pull-up portion 406 of the second BRE stage 308(2) as a selected portion and the BRE push-down portion 408 of the second BRE stage 308(2) as an unselected portion, the BRE pull-up portion 406 of the third BRE stage 308(3) as an unselected portion and the BRE push-down portion 408 of the third RE stage 308(3) as a selected portion, and the BRE pull-up portion 406 of the fourth BRE stage 308(4) as a selected portion and the BRE push-down portion 408 of the fourth BRE stage 308(4) as an unselected portion.

FIG. 12 shows a block diagram of the example configuration of the four RE stages 306 and the four BRE stages 308 of FIGS. 3 and 6, and further with each of the pull-up and push-down portions being identified as selected or unselected in response to an identification that the duty cycle of the first output signal DQS is initially higher than the duty cycle of the second output signal BDQS. In the example configuration shown in FIG. 12, each of the RE and BRE stages 306, 308 may be configured as inverters, and so the correspondence mapping may be the same as that of FIG. 11. In addition, with the higher and lower duty cycles of the output signals DQS, BDQS being switched compared to that of FIG. 11, the selected and unselected portions of the RE and BRE stages 306, 308 may be correspondingly switched compared to that of FIG. 11.

In further detail, in response to determining that the first output signal DQS has an initially higher duty cycle than the second output signal BDQS, and in accordance with the correspondence mapping and the DCC slope adjustment scheme as previously described, the controller 102 may be configured to identify, with respect to the RE stages 306: the RE pull-up portion 402 of the first RE stage 306(1) as an unselected portion and the RE push-down portion 404 of the first RE stage 306(1) as a selected portion, the RE pull-up portion 402 of the second RE stage 306(2) as a selected portion and the RE push-down portion 404 of the second RE stage 306(2) as an unselected portion, the RE pull-up portion 402 of the third RE stage 306(3) as an unselected portion and the RE push-down portion 404 of the third RE stage 306(3) as a selected portion, and the RE pull-up portion 402 of the fourth RE stage 306(4) as a selected portion and the RE push-down portion 404 of the fourth RE stage 306(4) as an unselected portion. In addition, with respect to the BRE stages 308, the controller 102 may be configured to identify: the BRE pull-up portion 406 of the first BRE stage 308(1) as a selected portion and the BRE push-down portion 408 of the first BRE stage 308(1) as an unselected portion, the BRE pull-up portion 406 of the second BRE stage 308(2) as an unselected portion and the BRE push-down portion 408 of the second BRE stage 308(2) as a selected portion, the BRE pull-up portion 406 of the third BRE stage 308(3) as a selected portion and the BRE push-down portion 408 of the third RE stage 308(3) as an unselected portion, and the BRE pull-up portion 406 of the fourth BRE stage 308(4) as an unselected portion and the BRE push-down portion 408 of the fourth BRE stage 308(4) as a selected portion.

Referring back to FIG. 1, in addition to identifying selected and unselected portions of the RE and BRE stages 306, 308, the controller 102 may be configured to set and/or adjust drive strength levels for the selected portions over a plurality of iterations of a duty cycle correction process so that by the last iteration, the controller 102 has identified optimum drive strength levels for the selected portions that yield minimum duty cycle distortion in the output signals DQS, BDQS, and has set the drive strengths of the selected portions to their respective optimum drive strength levels. To do so, the controller 102 may continually detect, measure or monitor for duty cycle mismatch of the pair of output signals DQS, BDQS over a predetermined, Q-number of iterations. In each iteration, the controller 102 may set or adjust a value of a control code CC in response to detecting the duty cycle mismatch. The controller 102 may search for and/or select control code values CC corresponding to drive strength amounts for the selected portions in the slope adjustment circuit 104 to have when generating the intermediate signals REI, BREI. The control code values the controller 102 searches for and/or selects may be to compensate or correct for the duty cycle distortion as indicated by the duty cycle mismatch between the output signals DQS, BDQS. The controller 102 may do so by identifying, in each iteration, which of the output signals DQS, BDQS has the higher duty cycle and which of the duty cycles as the lower duty cycle, and select a control code value CC to set drive strengths for the slope adjustment circuit 104 that brings the two duty cycles closer together to reduce their mismatch.

The controller 102 may include a duty cycle identification circuit 108 that is configured to receive the complementary output signals DQS, BDQS, identify the duty cycles of each of the complementary output signals DQS, BDQS, and output duty cycle identification signals D_ID, BD_ID at levels, such as voltage levels, that indicate the duty cycles of the complementary output signals DQS, BDQS. In particular, a level of a first duty cycle identification signal D_ID may indicate the duty cycle of the first output signal DQS and a level of the second duty cycle identification signal BD_ID may indicate the duty cycle of the second output signal BDQS.

For some example configurations, the duty cycle identification circuit 108 may include averaging circuitry that is configured to average the duty cycles of each of the first and second output signals DQS, BDQS over time or cycles of the output signals DQS, BDQS, and the levels of each of the first and second duty cycle identification signals represent or indicate the averaged duty cycles. The averaging circuitry may include low pass filters (LPF), such as a resistor-capacitor (RC) filters, that filter out high frequency or alternating current (AC) components of the output signals DQS, BDQS. The output of the low pass filters are a pair of direct current (DC) voltage levels that indicate averaged duty cycles of the output signals DQS, BDQS. FIG. 1 shows the duty cycle identification circuit 108 as including a first low pass filter (LPF) 110 configured to receive the first output signal DQS and generate the first duty cycle identification signal D_ID and a second low pass filter (LPF) 112 configured to receive the second output signal BDQS and generate the second duty cycle identification signal BD_ID.

The controller 102 may further include a duty cycle comparison circuit 114 that is configured to compare the duty cycles of the output signals DQS, BDQS in order to measure their duty cycle mismatch. The duty cycle comparison circuit 114 or in combination with the duty cycle identification circuit 108, may be referred to as a measurement circuit. Based on the comparison, the duty cycle comparison circuit 114 may determine or measure which of the duty cycles and is higher which is lower, and output a comparison result signal CR that indicates the determination. The duty cycle comparison circuit 114 may identify and use the levels of the duty cycle identification signals D_ID, BD_ID to in order compare the duty cycles. The duty cycle comparison circuit 114 may identify which of the duty cycle identification signals D_ID, BD_ID is higher and output the comparison result signal CR at a high level or a low level to indicate the identification and which of the output signals DQS, BDQS has a higher duty cycle.

The duty cycle comparison circuit 114 may be configured to output the comparison result signal CR to a search circuit 116 configured to search for and/or select target drive strength values in accordance with a selection scheme. In particular, in response to the level of the comparison result signal CR, the search circuit 116 may be configured to search for and/or select one or more target drive strength values that causes the data alignment circuit 106 to reduce the amount of duty cycle mismatch between the output signals DQS, BDQS. In at least some example configurations, the search circuit 116 may be configured to search through an array of drive strength values. The goal of the searching in accordance with the selection scheme is to find a target drive strength value or code for the slope adjustment circuit 104 (or a certain combination of drive strengths of the RE and BRE stages 306, 308) that causes the data alignment circuit 106 to output the complementary output signals DQS, BDQS with a minimum amount of duty cycle mismatch or distortion. In response to identifying a target drive strength value or code, the search circuit 116 may generate and output one or more control codes CC that corresponds to the target drive strength value.

As described in further detail below, the duty cycle correction circuit 100 may be configured to perform the duty cycle correction process in a predetermined, Q-number of iterations or cycles, where the controller 102 measures duty cycle distortion (or duty cycle mismatch) in the output signals DQS, BDQS a predetermined number of times over the Q-number of iterations. The search circuit 116 may be configured to search for and/or select target drive strength values, such as by searching through an array of drive strength values, in response to the measured duty cycle distortion (or duty cycle mismatch) during the predetermined, Q-number of iterations. In each iteration, the controller 102 may measure duty cycle distortion by determining which of the duty cycles of the output signals DQS, BDQS is higher, and the duty cycle comparison circuit 114 may be configured to generate its comparison result signal CR at a level indicative of which of the duty cycles of the output signals DQS, BDQS is higher. Accordingly, in each iteration of the duty cycle correction process, the search circuit 116 may be configured to search for and identify or select a new target drive strength value in response to and/or corresponding to the duty cycle distortion measurement performed and/or the level of the comparison result signal CR generated in respective iterations. At the end of the Q-number of iterations, the search circuit 116 will have searched for and identified a final target drive strength value that provides a minimum amount of duty cycle mismatch or distortion between the output signals DQS, BDQS.

The search circuit 116 may be implemented in hardware or a combination of hardware and software to perform its functions or actions. For at least some example configurations where the search circuit includes a combination of hardware and software, the search circuit 116 may include a processor configured to execute the software, which may be stored in a memory that is part of or separate from the search circuit 116.

In addition, in a given iteration, the search circuit 116 may be configured to select a target drive strength value from among a plurality of drive strength values. In some example configurations, each drive strength value may indicate a plurality of drive strength amounts, and where each selected portion sets its associate drive strength to one of the plurality of drive strength amounts indicated by the drive strength value. Otherwise stated, each of the plurality of drive strength values may indicate a drive strength for each of the selected portions. So, for example with respect to the example configurations in FIGS. 11 and 12, the RE path 302 and the BRE path 304 each include four selected portions, and so a given target drive strength value from the plurality of drive strength values that the search circuit 116 selects may indicate four drive strengths for the four selected portions in the RE path 302 and the four selected portions in the BRE path 304. In addition or alternatively, a given target drive strength value that the search circuit 116 selects may indicate which of the branches in a selected portion are to be activated and which are to be deactivated. So, for example, a given target drive strength value may indicate whether a given mth branch of a given selected portion of a given stage is to be activated or deactivated.

In general, a given target drive strength value that the search circuit 116 selects and/or a control code CC corresponding to the given target drive strength value may be represented or formatted in any of various ways to indicate whether each of the branches in the pull-up and push-down portions of the RE and BRE stages 306, 308 configured to receive drive strength sub-signals SEL is to be activated or deactivated. In this context, a given target drive strength value and/or its corresponding control code is or corresponds to a digital-to-analog converter (DAC) code that comprises digital (e.g., binary) value indicating binary states for the branches (the binary states being either that a given branch is activated or deactivated), and in response to selection of the given target drive strength value, the RE and BRE stages 306, 308 perform an analog operation—i.e., their branches draw a total current with a total current amount corresponding to the digital value. Similarly, a plurality of drive strength values in an array from which the search circuit 116 selects target drive strength values may be in the form of DAC codes, each being a digital value that, when selected, causes the RE and BRE stages 306, 308 to draw a total amount of current corresponding to the selected digital value.

In example configurations where the number of RE and BRE stages 306, 308 is four, as illustrated in FIGS. 3, 6, 11, and 12, and where the number of branches in each of the pull-up and pull-down portions is also four, as illustrated in the example circuit configurations of FIGS. 7-9, each of the plurality of drive strength values that the search circuit 116 can select from and/or the control codes corresponding to the drive strength values may by in the form of a 4-digit hexadecimal number, where each digit of the 4-digit hexadecimal number corresponds to one of the RE stages 306 and one of the BRE stages 308. In particular example configurations, for each of the digits of the hexadecimal number, a given digit corresponds to the same jth RE stage 306(j) and BRE stage 306(j). For example, a first digit of the hexadecimal number may correspond to both the first RE stage 306(1) and the first BRE stage 308(1), a second digit of the hexadecimal number may correspond to both the second RE stage 306(2) and the second BRE stage 308(2), a third digit of the hexadecimal number may correspond to both the third RE stage 306(3) and the third BRE stage 308(3), and a fourth digit of the hexadecimal number may correspond to both the fourth RE stage 306(4) and the fourth BRE stage 308(4). Under this example configuration, selected portions of RE and BRE stages 306, 308 having the same position within their respective RE or BRE paths 302, 304 may have the same drive strength level.

Further, in the particular example configurations, each hexadecimal digit may correspond to a four-digit binary number, where each digit of the binary number corresponds to a branch of a selected portion of a RE stage 306 and a branch of a selected portion of a BRE stage 308. In other words, for a given pth hexadecimal digit corresponding to a given jth RE stage 306(j) and a given jth BRE stage 308(j), a qth binary digit of a 4-digit binary number equivalent of the pth hexadecimal digit may correspond to a given mth branch of a selected portion of the jth RE stage 306(j) and a given mth branch of a selected portion of the jth BRE stage 308(j). As a binary digit may have either a "0" binary value or a "1" binary value, one of the binary values may indicate to activate the mth branches and the other binary value may indicate to deactivate the mth branches.

Various other ways of formatting the drive strength values that the search circuit 116 selects and/or the corresponding control codes CC may be possible, and may depend on the number of RE and BRE stages 306, 308 and/or the number of pull-up and push-down branches in the RE and BRE stages 306, 308.

As previously described, the duty cycle correction circuit 100 may be configured to perform the duty cycle correction process over a predetermined, Q-number of iterations. The search circuit 116 may be configured to utilize the levels of the comparison result signal CR to perform its selections over the Q-number of iterations. For example, the search circuit 116 may be configured to monitor the relative levels of the duty cycles of the output signals DQS, BDQS, as indicated by the level of the comparison result signal CR, to determine whether and/or how to select a target drive strength value. In a particular example implementation, if the search circuit 116 detects that the level of the comparison result signal CR has changed from an initial level—e.g., the comparison result signal CR previously indicated that the first output signal DQS had the higher duty cycle and now indicates that the second output signal BDQS has the higher duty cycle, or vice versa, then the search circuit 116 may determine that it has overcompensated for the duty cycle mismatch and needs to reverse how it is selecting the drive strength amounts in order to reverse the increasing or decreasing of all or some of the drive strengths.

From the perspective of adjusting slopes to reduce duty cycle distortion, the RE and BRE stages 306, 308 may be considered to adjust slopes of certain rising and falling transitions of the RE and BRE intermediate signals REI, BREI in response to the search circuit 116 searching through drive strength values and selecting target drive strength values during the predetermined, Q-number of iterations. In particular, during an initial iteration, the controller 102 may output the drive strength signals DS so that certain rising and falling slopes of the RE and BRE intermediate signals REI, BREI are reduced to initially reduced slope amounts, magnitudes, or levels in accordance with the DCC slope adjustment scheme. During subsequent iterations, the search circuit 116 may select new target drive strength values based on the levels of the comparison result signal, which in turn may cause the controller 102 to output the drive strength signals DS at levels that cause the slopes of the certain rising and falling transitions of the RE and BRE intermediate signals to increase or decrease in magnitude from their initially reduced slope magnitudes.

During the subsequent iterations, if the level of the comparison result signal CR does not change, the search circuit 116 may select drive strength values that cause the controller 102 to change the levels of the drive strength signals DS so that at least some of the certain rising and falling slopes of the RE and BRE intermediate signals REI, BREI continue to decrease in magnitude or become more gradual (e.g., continuously change in the decreasing direction of adjustment). Doing so may cause the duty cycle of the output signal that was initially higher to continue decrease and the duty cycle of the output signal that was initially lower to continue to increase.

However, a change in the level of the comparison result signal CR in a given iteration from an initial level that comparison result signal CR was at in in the first iteration may indicate that the controller 102 has overcompensated for the duty cycle distortion. Accordingly, in the event that a change in the level of the comparison result signal CR indicates that the controller 102 has overcompensated for the duty cycle distortion, the search circuit 116 may select a drive strength value that causes the controller 102 to change the levels of the drive strength signals DS so that the certain rising and falling slopes of the RE and BRE intermediate signals RE, BREI begin to increase in level or become steeper.

In general, over the plurality of the iterations, the search circuit 116, in a given iteration, may detect whether the level of the comparison result signal CR has changed compared to the level it was at in the immediately prior iteration. In the given iteration, if the search circuit 116 detects that the level of the comparison result signal CR has not changed from the level it was at in the immediately prior iteration, then the search circuit 116 may select a drive strength value that causes the controller 102 to continue to adjust the certain rising and falling slopes of the RE and BRE intermediate signals REI, BREI in their current or present directions of adjustment. Alternatively, if the search circuit 116 detects that the level of the comparison result signal CR has changed from the level it was at in the immediately prior iteration, then the search circuit 116 may select a drive strength value that causes the controller 102 to reverse the direction of adjustment in which it is adjusting the certain rising and falling slopes of the RE and BRE intermediate signals REI, BREI.

In addition or alternatively, the selection scheme that the search circuit 116 uses to select target drive strength values may be and/or in accordance with a search algorithm. The search algorithm may set forth one or more criterion, rules, or steps that the search circuit 116 is to use and/or follow in order to search for and/or select drive strength values. The search circuit 116 may be configured to execute the search algorithm to determine a final target drive strength value by the last or Qth iteration of the duty cycle correction process.

The one or more criterion or rules may instruct or indicate to the search circuit 116 where to search for the next target drive strength value to select next in response to the level of the comparison result signal CR being high or low. During a given iteration, the search circuit 116 may identify whether the level of the comparison result signal CR is high or low. In response to the identification, and according the search algorithm, the search circuit 116 may select a next target drive strength value. Upon selecting the next target drive strength value, the search circuit 116 may output the next target drive strength value—or a control code CC corresponding to the next target drive strength value—to cause selected portions of the RE and BRE stages to perform respective pull-up or push-down operations with drive strengths corresponding to the next target drive strength value.

For at least some of these configurations, the search algorithm that the search circuit 116 executes is a binary search algorithm. In accordance with a binary search algorithm, during each iteration, the search circuit 116 may be configured to access an array, such as a sorted array, of possible drive strength values, with each drive strength value corresponding to and/or indicating one of a plurality of drive strength amounts for the RE and BRE stages 306, 308 of the slope adjust circuit 104. The search circuit 116 may be configured to select one of the possible drive strength values as a target drive strength value. In each iteration, in order to make the selection, the search circuit 116 may determine an available portion of the array that includes one or more possible drive strength values that are available to be selected, and select one of the possible drive strength values in the available portion as the target drive strength value. In a particular example implementation, the search circuit 116 selects the middle value in the available portion as the target drive strength value.

In further detail, for each iteration of a given duty cycle correction process, an available portion of the array includes a maximum drive strength value and a minimum strength value, with the middle drive strength value being a middle value in between the minimum drive strength value and the maximum drive strength value. The minimum drive strength value may set a floor of the available portion and the maximum drive strength value may set a ceiling of the available portion. Accordingly, over the Q-number of iterations, the search circuit 116 may set and/or adjust the floor and ceiling drive strength values and search within the floor and ceiling drive strength value until the search circuit 116 selects a final target drive strength value in the last or Qth iteration.

In the first iteration, the available portion may be the entire array, and so the minimum drive strength value of the available portion is the minimum drive strength value of the array, the maximum drive strength value of the available portion is the maximum drive strength value of the array, and the target drive strength value that the search circuit 116 selects in a given iteration is the middle drive strength value of the array. Accordingly, in the first iteration, the search circuit 116 selects the middle drive strength value of the array as the target drive strength value, and outputs a control code CC so that the selected portions of the RE and BRE stages 306, 308 have drive strength amounts corresponding to the middle drive strength value by end of the first iteration.

When the duty cycle correction process exits a prior iteration and begins a present iteration, the search circuit 116 will have established a present available portion of the array that includes a present maximum drive strength value, a present minimum drive strength value, and a present target drive strength value. When the duty cycle correction process enters into a next iteration, which can be any of the 2nd through Qth iterations, the search circuit 116 may identify whether a present level of the comparison result signal CR is at its high level or low level, and whether the present level is different than the level of the comparison result signal CR in the immediately prior iteration. The present level is the level of the comparison result signal CR that the search circuit 116 identifies in a present or current iteration. The initial level is the level of the comparison result signal CR that the search circuit 116 identified in the first iteration. The immediately prior level is the level of the comparison result signal CR that the search circuit 116 identified in the iteration immediately prior to the present or current iteration.

In response to the determination of whether the present level is the same or different than the immediately prior level, the search circuit 116 may establish a new available portion of the array and select a new target drive strength value in the new available portion. The search circuit 116 may establish a new available portion by setting a new maximum drive strength value (ceiling) or a new minimum drive strength value (floor), while keeping the other maximum or minimum drive strength value at its present value.

In a given iteration, whether the search circuit 116 establishes a new available portion by setting a new maximum drive strength value (ceiling) or a new minimum drive strength value (floor), while keeping the other maximum or minimum drive strength value at its present value, may depend whether the present level of the comparison result signal has changed from the immediately prior level, and a current selection direction. In further detail, the search circuit 116 may be configured to select new drive strength values according to a selection direction. The selection direction may be an increasing selection direction or a decreasing selection direction. When the search circuit 116 selects a new target drive strength value in the increasing selection direction, it selects a new target drive strength value that is higher than the target drive strength value it selected in an immediately prior iteration. When the search circuit 116 selects a new target drive strength value in the decreasing selection direction, it selects a new target drive strength value that is lower than the target drive strength value it selected in an immediately prior iteration. The selection direction may correspond to a change in drive strength for at least one selected portion of a RE stage 306 or a BRE stage 308. For some example configurations, the selection direction may directly correspond to the change in drive strength and/or magnitude of the slope of corresponding transitions being changed as a result of the selection, meaning that when the search circuit 116 selects a new target drive strength value in the increasing selection direction, the selection causes an increase in drive strength for the at least one selected portion of the RE stage 306 or the BRE stage 308 and/or an increase in slope magnitude of the corresponding transitions, and when the search circuit 116 selects a new target drive strength value in the decreasing selection direction, the selection causes a decrease in drive strength for the at least one selected portion of the RE stage 306 or the BRE stage 308 and/or a decrease in slope magnitude of the corresponding transitions. Accordingly, when the controller 102 wants certain slopes to increase in magnitude or become steeper, the search circuit 116 may select a new target drive strength value in the increasing selection direction, and when the controller 102 wants the certain slopes to decrease in magnitude or become more gradual, the search circuit 116 may select a new target drive strength value in the decreasing selection direction. For other example configurations, the selection direction may inversely correspond to the change in drive strength and/or magnitude of the slope corresponding to transitions being changed as a result of the selection, meaning that when the search circuit 116 selects a new target drive strength value in the increasing selection direction, the selection causes a decrease in drive strength for the at least one selected portion of the RE stage 306 or the BRE stage 308 and/or a decrease in slope magnitude of the corresponding transitions, and when the search circuit 116 selects a new target drive strength value in the decreasing selection direction, the selection causes an increase in drive strength for the at least one selection portion of the RE stage 306 or the BRE stage 308 and/or an increase in slope magnitude of the corresponding transitions. In a given iteration, the search circuit 116 may be configured to identify and/or keep track of whether it selected a new target drive strength value in the increasing selection direction or in the decreasing selection direction, and set the increasing or decreasing selection direction that it identified as the current selection direction.

In a given iteration, in the event that the search circuit 116 identifies that the present level of the comparison result signal CR is the same as the immediately prior level, then the search circuit 116 may be configured to select a new target drive strength value in a same selection direction as the current selection direction. Accordingly, if the current selection direction is the increasing selection direction, then the search circuit 116 may select a new target drive strength value in the increasing selection direction. On the other hand, if the current selection direction is the decreasing selection direction, then the search circuit 116 may select a new target drive strength value in the decreasing selection direction. Alternatively, in the event that the search circuit 116 identifies that the present level of the comparison result signal CR is different than the immediately prior level, then the search circuit 116 may be configured to select a new target drive strength value in an opposite direction from the current selection direction. Accordingly, if the current selection direction is the increasing selection direction, then the search circuit 116 may select a new target drive strength value in the decreasing direction. On the other hand, if the current selection direction is the decreasing selection direction, then the search circuit 116 may select a new target drive strength value in the increasing direction.

As previously described, in the first iteration, the search circuit 116 may select a middle drive strength value of the array. This selection of the middle drive strength value in the first iteration may correspond to an initial reduction in magnitude value of the certain slopes of the RE and BRE intermediate signals to be adjusted. Accordingly, when the search circuit 116 initially selects the middle drive strength value of the array in the first iteration, the selection may be an initial selection in an initial selection direction that corresponds to a decreasing drive strength amount and/or a decreasing magnitude in slope. In particular configurations, the selection direction may be a decreasing selection direction. After the initial selection in the decreasing selection direction, if the current level of the comparison result signal CR does not change from the initial level, then the search circuit 116 may continue to select new target drive strength values in the decreasing selection direction to continue to have the certain slopes reduced in order to have the duty cycles of the output signals DQS, BDQS move closer to being matched. Alternatively, if the present level of the comparison result signal CR changes from the initial level, then the slope adjustment circuit 104 will have overcompensated for the duty cycle distortion, and the search circuit 116 may select a new target value in the increasing selection direction to have the certain slopes increase in magnitude or become steeper in order to correct for the overcompensation. Thereafter, the search circuit 116 may maintain or change the direction of selection when selecting new target drive strength values based on whether the current level of the comparison result signal CR has changed from the immediately prior level.

As previously described, when the search circuit 116 wants to select a new target drive strength value in a given, current iteration, the search circuit 116 may establish a new available portion of the array by setting new minimum and maximum drive strength values, and select a new target drive strength value from the new available portion. When the search circuit 116 determines to select a new target drive strength value in the increasing selection direction, the search circuit 116 may establish the new available portion by setting the present target drive strength value as the new minimum drive strength value, and setting the present maximum drive strength value as the new maximum drive strength value. In addition, when the search circuit 116 determines to select a new target drive strength value in the decreasing selection direction, the search circuit 116 may establish the new available portion by setting the present target drive strength value as the new maximum drive strength value, and setting the present minimum drive strength value as the new minimum drive strength value. The portion of the present available portion that is excluded from new available portion becomes part of an unavailable portion of the array.

Upon establishing the new available portion, the search circuit 116 may select a new target drive strength value in the new available portion. The new target drive strength amount that the search circuit 116 selects may be a middle drive strength value in between the new maximum drive strength value and the new minimum drive strength value. The search circuit 116 may proceed in this manner until it completes the Q-number of iterations.

In a given iteration, upon selecting a new drive strength value, the search circuit 116 may be configured to output, send, or pass the new target drive strength value it selects in the form of a control code CC to a decoder circuit 118. The decoder circuit 118 is configured to output the drive strength signals DS to the slope adjustment circuit 104 based on the control code CC. In a given iteration, the decoder circuit 118 may receive the control code CC, perform a decoding process in response to the control code CC, and output the drive strength signals DS at levels corresponding to the decoding process.

In a given iteration where the decoder circuit 118 receives a control code CC from the search circuit 116, the decoder circuit 118 may perform a decoding process in which the decoder circuit 118 sets the levels of each of the RE and BRE pull-up and push down drive strength signals ENp, ENn, BENp, BENn, or more particularly, in which the decoder circuit 118 sets the levels of each of the RE and BRE push-up and push-down drive strength sub-signals SELp, SELn, BSELp, BSELn that are input to the pull-up and push-down branches, as illustrated in FIGS. 5 and 7-9. In the given iteration, the decoder circuit 118 may be configured to set a level of a given drive strength sub-signal by keeping the level at a current level, or by changing the level from the current level to a new level. To do so, the decoder circuit 118 may be configured to determine whether the given drive-strength sub-signal is output to a branch of a selected portion or an unselected portion.

In the event that the decoder circuit 118 outputs the given drive strength sub-signal to a branch of an unselected portion, then in the given iteration, the decoder circuit 118 may keep the level of the given drive strength sub-signal unchanged. As described in further detail below, the decoder circuit 118, over the course of the iterations, may output the drive strength sub-signals to the branches of unselected portions at unchanging levels so that the branches of unselected portions maintain the same drive strength to generate the sub-signals with the same respective slopes over the course of the iterations.

Alternatively, in the event that the decoder circuit 118 outputs the given drive strength sub-signal to a branch of a selected portion, then in the given iteration, the decoder circuit 118 may be configured to identify a portion (e.g., a bit or digit) of the control code CC (or a portion of the target drive strength amount indicated by the control code CC) that corresponds to the given drive strength sub-signal, and in response determine whether the branch receiving the given drive strength sub-signal is to be activated or deactivated. If the portion indicates that the branch is to be activated, then the decoder circuit 118 may set the given drive strength sub-signal to a level that activates the branch. Alternatively, if the portion indicates that the branch is to be deactivated, then the decoder circuit 118 may set the given drive strength sub-signal to a level that deactivates the branch.

An example duty cycle correction process is now described. At the start or in an initial period of a duty cycle correction process, before an initial iteration of the duty cycle correction process begins, the controller 102, such as with the decoder circuit 118, may output the drive strength signals DS, including each of the drive strength sub-signals SELp, SELn, BSELp, BSELn, at respective initial, predetermined amounts or levels to the branches of the pull-up and push down portions 402, 404, 406, 408 of the RE and BRE stages 306, 308. The output of the drive strength signals DS at the initial levels may set initial drive strength amounts for the pull-up and push-down portions 402, 404, 406, 408 to cause the pull-up and push-down portions 402, 404, 406, 408 to generate the RE and BRE intermediate signals REI, BREI with maximum slopes. Those pull-up and push-down portions 402, 404, 406, 408 that are to be unselected portions for the duty cycle correction process may participate in generating their respective RE and BRE intermediate signals REI, BREI with the initial drive strength amounts for the duration of the duty cycle correction process. In addition, the initial drive strength amounts may be maximum drive strength amounts that the pull-up and push-down portions 402, 404, 406, 408 can have or may be lower than the maximum drive strength amounts. In any event, during the course of the duty cycle correction process, the decoder circuit 118 may not output the drive strength signals DS to increase a drive strength for a given pull-up or push-down portion 402, 404, 406, 408 above the initial drive strength amount, such that the magnitudes of the rising and falling slopes of the RE and BRE intermediate signals REI, BREI that the RE and BRE stages 306, 308 generate during the initial period are maximum slope magnitudes, meaning that the RE and BRE stages 306, 308 may not generate their respective RE and BRE intermediate signals with rising or falling slopes with magnitudes greater than the magnitude value of the maximum slope.

At the end of or after the initial period, an initial or first iteration of the duty cycle correction process may start, in which the slope adjustment circuit 104 may receive the input signals REin, BREin, generate the RE and BRE intermediate signals REI, BREI with the initial drive strength amounts, and the data alignment circuit 106 may generate and output the output signals DQS, BDQS in response to receipt of the last intermediate signals REI(N), BREI(N) that the last RE and BRE stages 306(N), 308(N) generated with their RE and BRE pull-up and push-down portions 402, 404, 406, 408 each set to the initial drive strength amounts.

In response, the duty cycle identification circuit 108 may receive the output signals DQS, BDQS and in response, output duty cycle identification signals D_ID, BD_ID at levels to indicate the initial duty cycle levels of the output signals DQS, BDQS. In response, the duty cycle comparison circuit 114 may perform an initial measurement of the duty cycle distortion of the output signals DQS, BDQS by identifying which of the duty cycles is initially higher, and output the comparison result signal CR at an initial level to indicate which of the duty cycles is initially higher.

Based on the initial measurement of the duty cycle distortion, the decoder circuit 118 may be configured to identify which of the output signals DQS is to have its duty cycle decreased, and which of the output signals BDQS is to have its duty cycle increased to reduce duty cycle distortion. As previously described, the output signal with the initially higher duty cycle is to have its duty cycle decreased, and the output signal with the initially lower duty cycle is to have its duty cycle increased. The decoder circuit 118 may further be configured to identify the selected pull-up and push-down portions of the RE and BRE stages 306, 308 based on the initial measurement of the duty cycle distortion.

To do so, the decoder circuit 118 may be configured to receive the comparison result signal CR at its initial level from the duty cycle comparison circuit 116, and use the initial level of the comparison result signal CR to identify which of the RE and BRE pull-up and push down portions 402, 404, 406, 408 are to be selected portions and which are to be unselected portions for the duty cycle correction process. In particular, the decoder circuit 118 may be configured with the correspondence mapping that maps each of the RE and BRE stages 306, 308 to the first output signal DQS or to the second output signal BDQS. The decoder circuit 118 may further be configured to identify selected and unselected portions according to the DCC slope adjustment scheme. Accordingly, upon receipt of the comparison result signal CR at the initial level, the decoder circuit 118 may use the initial level of the comparison result signal CR to identify which of the duty cycles is to be increased and which of the duty cycles is to be decreased. The decoder circuit 118 may use that identification in combination with the correspondence mapping and in accordance with the DCC slope adjustment scheme to identify the selected pull-up and push down portions and the unselected pull-up and push-down portions.

In the duty cycle correction process, the selected pull-up and push-down portions may be a first set of pull-up and push-down portions, and the unselected pull-up and push-down portions may be a second set of pull-up and push-down portions. The drive strengths of the pull-up and push-down portions of the first set may be a first set of drive strengths, and the drive strengths of the pull-up and push-down portions of the second set may be a second set of drive strengths. In the initial period of the duty cycle correction process, the controller 102 may set the first set of drive strengths and the second set of drive strengths to the initial drive strength amount or level. During the iterations, the controller 102 may output the drive strength signals DS to set and maintain the second set of drive strengths at the initial drive strength amount, and to set the first set of drive strengths to drive strength amounts lower than the initial drive strength amount.

Referring back specifically to the initial iteration, the search result circuit 116 may also receive the comparison result signal CR at its initial level and in response, select an initial target drive strength value corresponding to an initial target drive strength amount at which the selected portions are to initially reduce their drive strengths from the initial drive strength amounts. In some example configurations, such as with execution of a binary search algorithm, the initial target drive strength value may be a middle drive strength value between a maximum drive strength value and a minimum drive strength value of an array of drive strength values, as previously described. Upon selecting the initial target drive strength value, the search circuit 116 may output the control code CC indicating the initial target drive strength value to the decoder circuit 118. The search circuit 116 may also identify that it is currently selecting target drive strength values in the decreasing selection direction.

In response to receipt of the control code CC indicating the initial target drive strength value, the decoder circuit 118 may perform an initial or first decoding process to set the levels of the pull-up and push-down drive strength sub-signals SELp, SELn, BSELp, BSELn. As previously described, the decoder circuit 118 may keep the levels of the drive-strength sub-signals output to branches of unselected portions unchanged. Additionally, the decoder circuit 118 may set the drive-strength sub-signals output to branches of selected portions to levels that either activate or deactivate the branches of the selected portions according to whether the corresponding portions (e.g., digits or bits) indicate whether to activate or deactivate the respective branches. Upon performing the initial decoding process, the decoder circuit 118 may output the drive strength sub-signals SELp, SELn, BSELp, BSELn to the branches of the pull-up and push-down portions 402, 404, 406, 408 of the RE and BRE stages 306, 308. In response, the selected portions may reduce their respective drive strengths to the initially reduced drive strength amounts. In turn, the RE and BRE stages 306, 308 may generate the RE and BRE intermediate signals REI, BREI with certain rising and falling slopes being reduced in accordance with the selected portions performing pull-up and push-down portions with the initially-reduced drive strengths.

The duty cycle correction process may then move into the second iterations, where the duty cycle comparison circuit 114 again identifies which of the duty cycles of the output signals DQS, BDQS is higher and outputs the comparison result signal CR at a second level (either a high level or a low level) to indicate which of the duty cycles is higher. The search circuit 116 responds to the second level of the comparison result signal CR by selecting a new, second target drive strength value based on the second level of the duty cycle comparison result signal CR, and outputs a control code CC indicating the second drive strength value to the decoder circuit 118. In response, the decoder circuit 118 performs a second decoding process based on the second drive strength value, and outputs the pull-up and push-down drive strength sub-signals SELp, SELn, BSELp, BSELn to the branches of the pull-up and push-down portions 402, 404, 406, 408 in response to the second decoding process. In response to receipt of the pull-up and push-down drive strength sub-signals SELp, SELn, the various selected pull-up and push-down portions may either correspondingly increase or decrease their respective drive strengths from the initially reduced drive strength amount. The duty cycle correction process may then proceed in the third through Qth iterations until the Qth iteration has ended.

Over the course of the iterations, the search circuit 116 will select the target drive strength values based in the levels of the comparison result signal CR so that with each iteration, the search circuit 116 selects a new target drive strength value that reduces the duty cycle distortion of the output signals DQS, BDQS compared to the target drive strength value the search circuit 116 selected in the last iteration. Or at least by the last, Qth iteration, the last, Qth target drive strength value that the search circuit 116 selects causes the selected pull-up and push-down portions to have optimally reduced drive strengths from the initial drive strength amounts so that the slopes of the rising and falling transitions of the RE and BRE intermediate signals REI, BREI have reduced slope magnitudes relative to the maximum slope magnitudes that provide for minimized duty cycle distortion in the output signals DQS, BDQS.

Referring to the RE and BRE pull-up and push-down portions 306, 308 of FIG. 3, while it may be desirable to adjust slopes of certain rising and falling transitions of the RE and BRE intermediate signals to reduce duty cycle distortion in the output signals DQS, BDQS, it may be undesirable to adjust the slopes in a way that increases distortion of other undesirable characteristics of the output signals DQS, BDQS. Example undesirable characteristics may include transition skew and delay skew. Transition skew is the difference in magnitude of slopes of rising and falling transitions or the difference between a rise time of a rising transition and a fall time of a falling transition. The greater the amount of transition skew in a signal, the more transition skew the signal has. Delay skew is a time difference or a time delay between corresponding rising and falling transitions of a pair of complementary signals. Ideally, a first signal of the pair performs a given rising transition and a second signal of the pair performs a given, corresponding falling transition at the same time or over the same time period. When the corresponding rising and falling transitions do not perform their respective transitions at the same time or over the same time period, delay skew is an amount of time difference or delay between the corresponding rising and falling transitions. In general, in order to maximize signal integrity, it may be desirable for the undesirable characteristics of the output signals DQS, BDQS, such as transition skew and delay skew, to be minimized or as small as possible.

Aspects of the duty cycle correction system 100—including the configurations of the RE and BRE stages 306, 308, the selection scheme that the search circuit 116 uses to select the target drive strength values, and the correspondence mapping that the decoder circuit 118 uses to identity the selected and unselected portions—may enable the RE and BRE stages 306, 308 to perform slope adjustment of certain rising and falling transitions of the intermediate signals REI, BREI to minimize duty cycle distortion while negligibly or minimally enhancing or increasing the other undesirable characteristics in the output signals DQS, BDQS. The duty cycle correction system 100 may accomplish by balancing or averaging the slope adjustment. One way the duty cycle correction system 100 balances or averages the slope adjustment is by setting the selected portions of respective jth RE and BRE stages 306(j), 308(j) to have the same drive strengths to perform their respective pull-up and push-down operations. The search and decoder circuits 116, 118 may enable this in that a target drive strength value that the search circuit 116 selects in a given iteration may include a portion that corresponds to both the jth RE stage 306(j) and the jth BRE stage 308(j). This way, when the decoder circuit 118 outputs the drive strength sub-signals SELp, SELn in the given iteration, to set the selected portions of the jth RE and BRE stages 306(j), 308(j) to have the same drive strength amounts.

A second way that the duty cycle correction system 100 balances or averages the slope adjustment is by optimally setting the selected portions of the stages of the same RE or BRE path to have the same drive strength amounts or as close to the same drive strength amounts as possible. To do so, the plurality of drive strength values from which the search circuit 116 selects the target drive strength values may include a first set of drive strength values and a second set of drive strength values. Each of the drive strength values in the first set may include respective portions that all indicate the same drive strength amount. Each of the drive strength values in the second set may include at least two respective portions that indicate different drive strength amounts. When the search circuit 116 selects a target drive strength value from the first set, the decoder circuit 118 may output the drive strength signals DS to set the selected portions of all of the RE and BRE stages 306, 308 to the same drive strength amount. In addition, when the search circuit 116 selects a target drive strength value from the second set, the decoder circuit 118 may output the drive strength signals DS to set the drive strengths of at least two different RE stages 306 and/or the drive strengths of at least two different BRE stages 308 to different drive strength amounts.

The search circuit 116 may select target drive strength values from the first set for as many iterations as possible. Additionally, for configurations where the search circuit 116 selects target drive strength values from the second set, the search circuit 116 may select from the second set so that the difference in drive strength is minimized. To do so, the search circuit 116, over the course of the iterations of a given duty cycle correction process, may select target drive strength values that cause the selected portions of the RE and BRE stages 306, 308 to adjust their drive strengths in increasingly smaller amounts. For a first, predetermined X-number of sequential iterations, each of the target drive strength values that is selected is selected from the first set (has all of its portions indicating the same drive strength amount), and for a second, predetermined Y-number of sequential iterations following, or that occur later in the duty cycle correction process than, the first X-number of iterations, each of the target drive strength values that is selected is selected from the second set (has at least two of its portions indicating different drive strength amounts). Here, Y is 0 or more, and X is Q-Y, where Q is the total number of iterations of the duty cycle correction process. In particular example configurations, the number X is greater than the number Y.

To illustrate this last example configuration, in an example duty cycle correction process, suppose the target drive strength values that the search circuit 116 selects are from an array of four-digit hexadecimal values, where for each of the four-digit hexadecimal values, each digit corresponds to and/or indicates a drive strength for a respective one of the RE stages 306 and for a respective one of the BRE stages 308. In the array, the maximum drive strength value is FFFF and the minimum drive strength value is 0000. Further suppose that the duty cycle correction process includes six iterations, and that the search circuit 116 selects target drive strength values according to a binary search algorithm. In executing the binary search algorithm, each selection of a new target drive strength value in a given iteration may cause a smaller change in drive strength compared to the change in drive strength a prior drive strength value selected in the immediately prior iteration caused. In a first iteration, the search circuit 116 may select the middle drive strength value 8888 as the target drive strength value. Since all of the digits have the same hexadecimal value of "8" the controller 102 will set the drive strengths of the selected portions of the RE stages 306 and the drive strengths of selected portions of the BRE stages 308 to have the same drive strength. Over the course of the next second through fourth iterations, the search circuit 116 may select target drive strength values, where for each target drive strength value, the hexadecimal digits are the same. Then in each of the fifth and sixth iterations, the search circuit 116 may select a target drive strength value where at least one of the hexadecimal digits is different than another of the hexadecimal digits, thus causing, in each of the fifth and sixth iterations, the controller 102 to set different drive strengths for selected portions of at least two different RE stages 306 and/or for selected portions of at least two different BRE stages 308. However, despite yielding different drive strengths, the target drive strength values selected in the fifth and sixth iterations provide smaller amounts of change in drive strength compared to the change in drive strength caused by selection of the target drive strength values in the first through fourth iterations.

Figure 13:
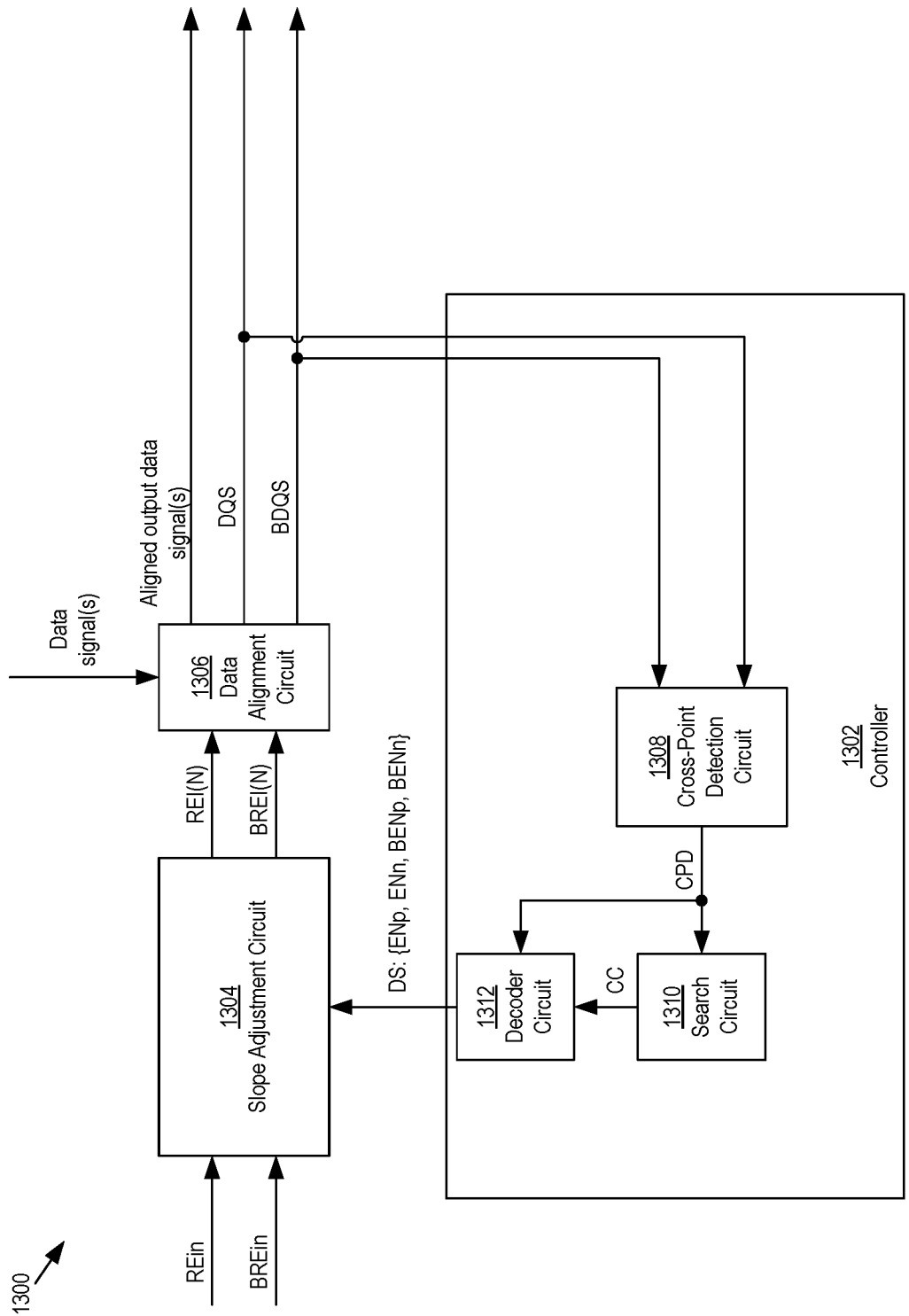
FIG. 13 is a block diagram of an example cross-point correction system.

FIG. 13 shows a block diagram of an example cross-point correction circuit 1300 in communication with and/or that includes a data alignment circuit 1306. The data alignment 1306 may be configured the same as or similar to the data alignment circuit 106 of FIG. 1. In addition, the cross-point correction circuit 1300 may include a controller 1302 and a slope adjustment circuit 1304. The slope adjustment circuit 1304 may be configured the same as or similar to the slope adjustment circuit 104 of FIG. 1, and may be configured with any of the example configurations shown and described with reference to FIGS. 3-9.

The cross-point correction circuit 1300 is configured to correct for, such as by reducing, minimizing, or eliminating, cross-point distortion in a pair of output signals DQS, BDQS output from the data alignment circuit 1306. In general, for a pair of complementary signals, a cross-point is a characteristic of the pair of complementary signals and is a point in time when the magnitude levels (e.g., voltage levels or current levels) of the complementary signals are the same. A cross-point typically occurs when a first signal of the pair is performing a rising transition and a second signal of the pair is performing a falling transition.

A given time period during which the pair of signals traverse several cycles may include a plurality of cross-points associated with the pair of signals. The magnitude level of the complementary signals at the time of the cross-points is referred to as an actual cross-point level. In addition, the complementary signals may have an associated target cross-point level. The target cross-point level is typically a middle or average level between a maximum level and a minimum level of the complementary signals, although other target cross-point levels may be possible.

Ideally, the actual cross-point level and the target cross-point level are the same. However, in the event that the actual and target cross-point levels are different, the complementary signals have cross-point distortion (otherwise referred to as vox distortion). Otherwise stated, cross-point distortion for a given pair of complementary signals is a measure of a difference between the target cross-point level and the actual cross-point level. A given amount of cross-point distortion may have both a magnitude component and a polarity component. The magnitude component is a difference in level between the target cross-point level and the actual cross-point level, and indicates how far away the actual cross-point level is from the target cross-point level. The polarity component, referred to as a cross-point distortion polarity, is either positive or negative, and indicates whether the actual cross-point level is above or higher than the target cross-point level or below or lower than the target cross-point level. In particular, when the actual cross-point level is higher than the target cross-point level, the cross-point distortion amount is positive or has a positive cross-point distortion polarity, and when the actual cross-point level is lower than the target cross-point level, the cross-point distortion amount is negative or has a negative cross-point distortion polarity.

In addition, positive cross-point distortion and negative cross-point distortion are opposite cross-point distortions from each other. Accordingly, for two pairs of complementary signals each having cross-point distortion, where one pair of complementary signals has a positive cross-point distortion polarity and the other of the pair has a negative cross-point distortion polarity, the two pairs of complementary signals have respective cross-point distortions that are opposite to each other.

Figure 14A:
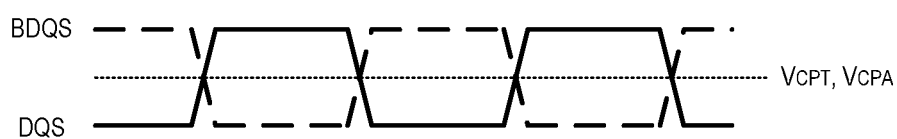
FIG. 14A is a timing diagram of a pair of output signals without cross-point distortion.
Figure 14B:
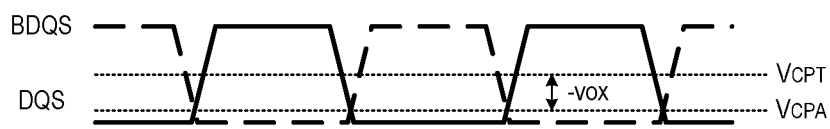
FIG. 14B is a timing diagram of a pair of output signals with cross-point distortion having a negative polarity.
Figure 14C:
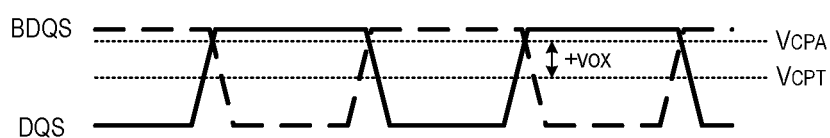
FIG. 14C is a timing diagram of a pair of output signals with cross-point distortion having a positive polarity.

FIGS. 14A-14C are timing diagrams of the output signals DQS, BDQS, illustrating the different types of cross-point distortion the output signals DQS, BDQS may have. Each of FIGS. 14A-14C indicate a target cross-point level (e.g., a target cross-point voltage level) $V_{CPT}$ of the output signals DQS, BDQS and an actual cross-point level (e.g., an actual cross-point voltage level) $V_{CPA}$ of the output signals DQS, BDQS. FIG. 14A shows an ideal situation, where the target cross-point level $V_{CPT}$ and the actual-cross point level $V_{CPA}$ are the same—i.e., the output signals DQS, BDQS do not have cross-point distortion. FIG. 14B shows a situation where the output signals DQS, BDQS have negative cross-point distortion (labeled "-vox" in FIG. 14B)—i.e., the actual cross-point level $V_{CPA}$ is lower than the target cross-point level $V_{CPT}$. FIG. 14C shows a situation where the output signals DQS, BDQS have positive cross-point distortion (labeled "+vox" in FIG. 14C)—i.e., the actual cross-point level $V_{CPA}$ is higher than the target cross-point level $V_{CPT}$.

Referring back to FIG. 13, in the event that the pair of output signal DQS, BDQS has cross-point distortion, the cross-point correction system 1300 may reduce the cross-point distortion by decreasing the actual cross-point level $V_{CPA}$ from an initial level where the output signals DQS, BDQS initially have positive cross-point distortion, or by increasing the actual cross-point level $V_{CPA}$ from an initial level where the output signals DQS, BDQS have negative cross-point distortion. To do so, the cross-point correction system 1300 may be configured to perform a cross-point correction process that includes a plurality or predetermined, Q-number of iterations.

Similar to the controller 102 of FIG. 1, the controller 1302 may be configured to set and/or adjust drive strengths of pull-up and push-down branches of RE and BRE stages of the slope adjustment circuit 1304. In particular, like the controller 102 of FIG. 1, the controller 1302 may be configured to output drive strength signals DS, including pull-up and push-down drive strength sub-signals SELp, SELn, to branches of pull-up and push-down portions of the RE and BRE stages to set and/or adjust the drive strengths of the pull-up and push-down portions, and in turn, adjust slopes of certain transitions of RE and BRE intermediate signals REI, BREI. However, instead of setting and/or adjusting the drive strengths, and in turn the slopes, to correct for duty cycle distortion, the controller 1302 sets and/or adjusts the drive strengths, and in turn the slopes, to correct for cross-point distortion.

In addition, in a given cross-point correction process, the cross-point correction system 1300 may be configured to reduce cross-point distortion according to a cross-point correction (CPC) slope adjustment scheme. Under the CPC slope adjustment scheme, the controller 102 may be configured to identify whether an initial polarity of the cross-point distortion in the output signals DQS, BDQS is positive or negative. In addition, under the CPC slope adjustment scheme, the slope adjustment circuit 1304 may be configured to reduce slopes of rising and falling transitions of pairs of RE and BRE intermediate signals REI, BREI based on the initial polarity of cross-point distortion of the output signals DQS, BDQS, and whether the pairs of RE and BRE intermediate signals REI, BREI have the same initial polarity as or opposite initial polarity from the initial polarity of the cross-point distortion of the output signals DQS, BDQS. Herein, an initial polarity of a cross-point distortion of a pair of complementary signals is the polarity of the cross-point distortion before the slope adjustment circuit 1304 reduces any slopes during a cross-point correction process.

In a particular example configuration of the CPC slope adjustment scheme, the slope adjustment circuit 1304 may reduce slopes differently for the pairs of RE and BRE intermediate signals REI, BREI for four different situations. In a first situation, under the CPC slope adjustment scheme, the slope adjustment circuit 1304 may be configured to reduce rising slopes of rising transitions of a given jth pair of intermediate signals REI(j), BREI(j) where the initial polarity of the cross-point distortion in the output signals DQS, BDQS is negative, and the initial polarity of the given jth pair of intermediate signals REI(j), BREI(j) is the opposite—i.e. positive. In a second situation, under the CPC slope adjustment scheme, the slope adjustment circuit 1304 may be configured to reduce falling slopes of falling transitions of a given jth pair of intermediate signals REI(j), BREI(j) where the initial polarity of the cross-point distortion in the output signals DQS, BDQS is negative, and the initial polarity of the given jth pair of intermediate signals REI(j), BREI(j) is the same—i.e., negative. In a third situation, under the CPC slope adjustment scheme, the slope adjustment circuit 1304 may be configured to reduce falling slopes of falling transitions of a given jth pair of intermediate signals REI(j), BREI(j) where the initial polarity of the cross-point distortion in the output signals DQS, BDQS is positive, and the initial polarity of the given jth pair of intermediate signals REI(j), BREI(j) is the opposite—i.e., negative. In a fourth situation, under the CPC slope adjustment scheme, the slope adjustment circuit 1304 may be configured to reduce rising slopes of rising transitions of a given jth pair of intermediate signals DQS, BDQS where the initial polarity of the cross-point distortion in the output signals DQS, BDQS is positive, and the initial polarity of the given jth pair of intermediate signals REI(j), BREI(j) is the same—i.e., positive.

Also, under the CPC slope adjustment scheme, the controller 1302 may be configured to output the drive strength signals DS to reduce drive strengths differently for the pairs of RE and BRE intermediate signals REI, BREI for the four different situations. In the first situation, under the CPC slope adjustment scheme, the controller 1302 may be configured to output the drive strength signals DS to reduce drive strengths in order to reduce rising slopes of rising transitions of a given jth pair of intermediate signals REI(j), BREI(j) where the initial polarity of the cross-point distortion in the output signals DQS, BDQS is negative, and the initial polarity of the given jth pair of intermediate signals REI(j), BREI(j) is the opposite—i.e. positive. In a second situation, under the CPC slope adjustment scheme, the controller 102 may be configured to output the drive strength signals DS to reduce drive strengths in order to reduce falling slopes of falling transitions of a given jth pair of intermediate signals REI(j), BREI(j) where the initial polarity of the cross-point distortion in the output signals DQS, BDQS is negative, and the initial polarity of the given jth pair of intermediate signals REI(j), BREI(j) is the same—i.e., negative. In a third situation, under the CPC slope adjustment scheme, the controller 1302 may be configured to output the drive strength signals DS to reduce drive strengths in order to reduce falling slopes of falling transitions of a given jth pair of intermediate signals REI(j), BREI(j) where the initial polarity of the cross-point distortion in the output signals DQS, BDQS is positive, and the initial polarity of the given jth pair of intermediate signals REI(j), BREI(j) is the opposite—i.e., negative. In a fourth situation, under the CPC slope adjustment scheme, the controller 1302 may be configured to output the drive strength signals DS to reduce drive strengths in order to reduce rising slopes of rising transitions of a given jth pair of intermediate signals DQS, BDQS where the initial polarity of the cross-point distortion in the output signals DQS, BDQS is positive, and the initial polarity of the given jth pair of intermediate signals REI(j), BREI(j) is the same—i.e., positive.

FIGS. 15A-15E and FIGS. 16A-16E show timing diagrams of example intermediate and output signals generated, illustrating cross-point distortion being eliminated when slope reduction is performed. FIGS. 15A-15E illustrate a situation where the cross-point distortion has a negative polarity, and FIGS. 16A-16E illustrate a situation where the cross-point distortion has a positive polarity.

Figure 15A:
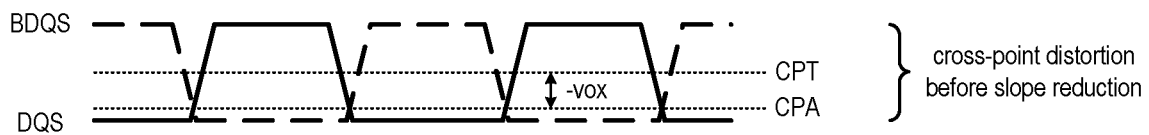
FIG. 15A is a timing diagram of a pair of output signals with cross-point distortion having a negative polarity before slope reduction is performed.
Figure 15B:
FIG. 15B is a timing diagram of a pair of intermediate signals having their rising slopes reduced.

Referring to FIGS. 15A-15E, FIG. 15A shows the output signals DQS, BDQS with negative cross-point distortion before cross-point correction using slope reduction is performed. FIG. 15B shows a pth pair of intermediate signals REI(p), BREI(p) generated with a pth pair of RE and BRE stages 306(*p*), 308(*p*) that are configured to generate the pth pair of intermediate signals REI(p), BREI(p) with an initially positive cross-point distortion. Because the cross-point distortion of the pth pair of intermediate signals REI(p), BREI(p) has an initial polarity opposite to the initial cross-point distortion polarity of the output signals DQS, BDQS, the pth RE and BRE stages 306(*p*), 308(*p*) may reduce the rising slopes of the rising transitions during an associated cross-point correction process, as shown in FIG. 15B.

Figure 15C:
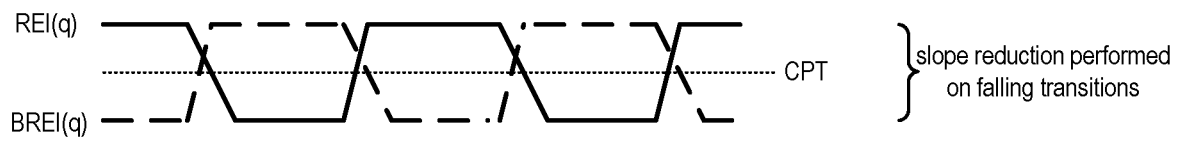
FIG. 15C is a timing diagram of a pair of intermediate signals having their falling slopes reduced.
Figure 15D:
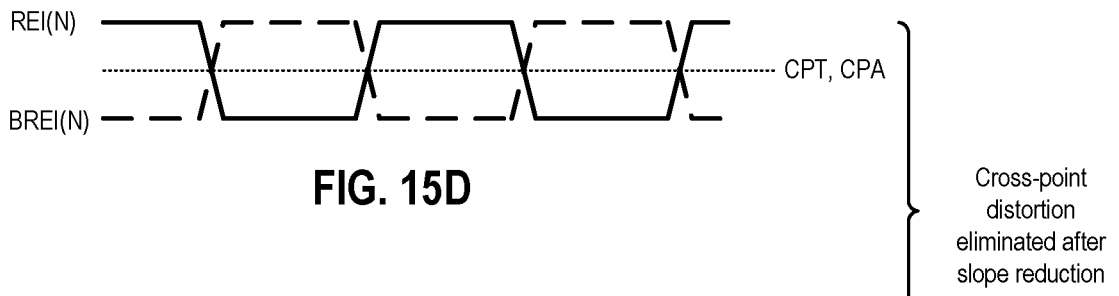
FIG. 15D is a timing diagram of a last pair of intermediate signals with cross-point distortion eliminated.
Figure 15E:
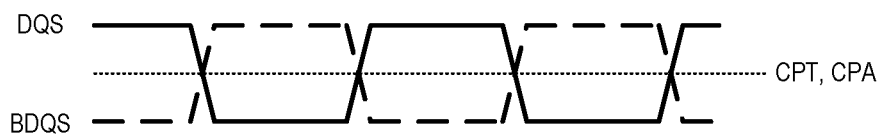
FIG. 15E is a timing diagram of the output signals of FIG. 16A with the cross-point distortion eliminated.

FIG. 15C shows a qth pair of intermediate signals REI(q), BREI(q) generated with a qth pair of RE and BRE stages 306(*q*), 308(*q*) that are configured to generate the qth pair of intermediate signals REI(q), BREI(q) with an initially negative cross-point distortion. Because the cross-point distortion of the qth pair of intermediate signals REI(p), BREI(p) has an initial polarity that is the same as the initial cross-point distortion polarity of the output signals DQS, BDQS, the qth RE and BRE stages 306(*q*), 308(*q*) may reduce the falling slopes of the falling transitions during the associated cross-point correction process, as shown in FIG. 15C. FIGS. 15D and 15E show associated cross-point distortion in the Nth intermediate signals REI(N), BREI(N) and in the output signals DQS, BDQS having been eliminated in response to the slope reduction performed with the slope adjustment circuit 1304.

Figure 16A:
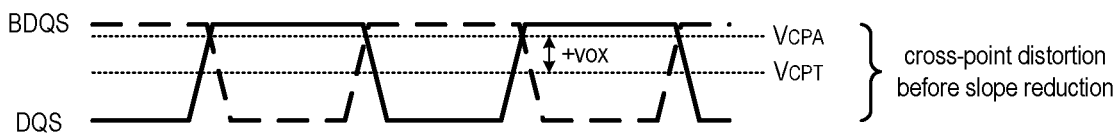
FIG. 16A is a timing diagram of a pair of output signals with cross-point distortion having a positive polarity before slope reduction is performed.
Figure 16B:
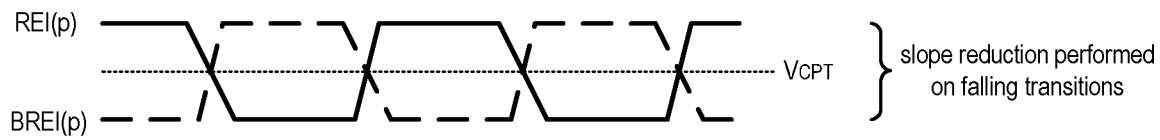
FIG. 16B is a timing diagram of a pair of intermediate signals having their falling slopes reduced.

Referring to FIGS. 16A-16E, FIG. 16A shows the output signals DQS, BDQS with positive cross-point distortion before cross-point correction using slope reduction is performed. FIG. 16B shows a pth pair of intermediate signals REI(p), BREI(p) generated with a pth pair of RE and BRE stages 306(*p*), 308(*p*) that are configured to generate the pth pair of intermediate signals REI(p), BREI(p) with an initially negative cross-point distortion. Because the cross-point distortion of the pth pair of intermediate signals REI(p), BREI(p) has an initial polarity opposite to the initial cross-point distortion polarity of the output signals DQS, BDQS, the pth RE and BRE stages 306(*p*), 308(*p*) may reduce the falling slopes of the falling transitions during an associated cross-point correction process, as shown in FIG. 16B.

Figure 16C:
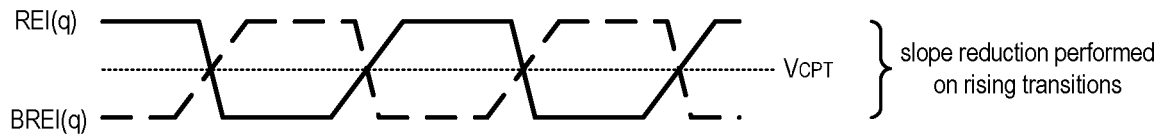
FIG. 16C is a timing diagram of a pair of intermediate signals having their rising slopes reduced.
Figure 16D:
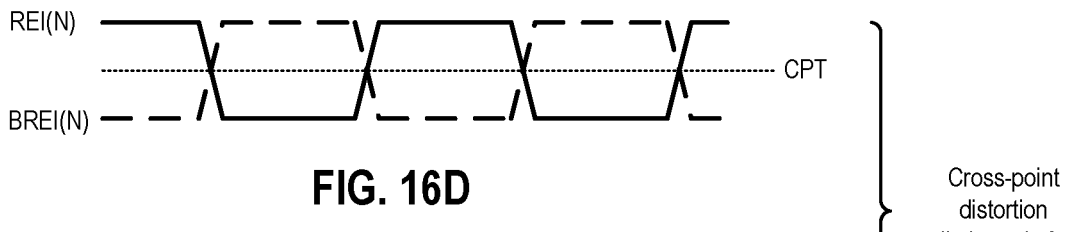
FIG. 16D is a timing diagram of a last pair of intermediate signals with cross-point distortion eliminated.
Figure 16E:
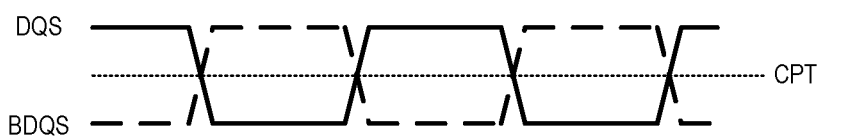
FIG. 16E is a timing diagram of the output signals of FIG. 16A with the cross-point distortion eliminated.

FIG. 16C shows a qth pair of intermediate signals REI(q), BREI(q) generated with a qth pair of RE and BRE stages 306(*q*), 308(*q*) that are configured to generate the qth pair of intermediate signals REI(q), BREI(q) with an initially positive cross-point distortion. Because the cross-point distortion of the qth pair of intermediate signals REI(p), BREI(p) has an initial polarity that is the same as the initial cross-point distortion polarity of the output signals DQS, BDQS, the qth RE and BRE stages 306(*q*), 308(*q*) may reduce the rising slopes of the rising transitions during the associated cross-point correction process, as shown in FIG. 15C. FIGS.

16D and 16E show associated cross-point distortion in the Nth intermediate signals REI(N), BREI(N) and in the output signals DQS, BDQS having been eliminated in response to the slope reduction performed with the slope adjustment circuit 1304.

Referring back to FIGS. 14A-14C, whether a pair of complementary signals has positive cross-point distortion or negative cross-point distortion may depend on relative timings of the rising and falling transitions of the complementary signals. For example, with reference to FIG. 14B, the output signals DQS, BDQS have negative cross-point distortion due to the ends of the falling transitions of the second output signal BDQS and the beginnings of the rising transitions of the first output signal DQS occurring relatively close in time, and the ends of the falling transitions of the first output signal DQS and the beginnings of the rising transitions of the second output signal BDQS occurring relatively close in time, compared to their respective timings when the output signals DQS, BDQS do not have cross-point distortion. In addition, with reference to FIG. 14C, the output signals DQS, BDQS have positive cross-point distortion due to the beginnings of the falling transitions of the second output signal BDQS and the ends of the rising transitions of the first output signal DQS occurring relatively close in time, and the ends of the rising transitions of the second output signal BDQS and the beginnings of the falling transitions of the first output signal DQS occurring relative close in time, compared to their respective timings when the output signals DQS, BDQS do not have cross-point distortion. With reference to both FIGS. 14B and 14C, the pair of complementary output signals DQS, BDQS with negative cross-point distortion shown in FIG. 14B and the pair of complementary output signals DQS, BDQS with positive cross-point distortion in FIG. 14C are generally inverted versions of each other.

Accordingly, whether a given jth pair of RE and BRE stages 306($j$), 308($j$) generates the jth pair of intermediate signals REI(j), BREI(j) with cross-point distortion having the same initial polarity as, or opposite initial polarity to, the initial polarity of the cross-point distortion of the output signals DQS, BDQS may depend on the polarity of the cross-point distortion of the complementary signals input to the jth RE and BRE stages 306($j$), 308($j$) and whether the jth RE and BRE stages 306($j$), 308($j$) are configured as inverters or non-inverters. That is, in the event that complementary input signals to the jth RE and BRE stages 306($j$), 308($j$) have the same initial cross-point distortion polarity as the cross-point distortion polarity of the output signals DQS, BDQS, and the jth RE and BRE stages 306($j$), 308($j$) are configured as inverters, the jth RE and BRE stages 306($j$), 308($j$) may generate the jth intermediate signals REI(j), BREI(j) with cross-point distortion having an initial polarity that is opposite to the initial polarity of the output signals DQS, BDQS. In addition, in the event that the complementary input signals to the jth RE and BRE stages 306($j$), 308($j$) have the opposite cross-point polarity from the polarity of cross-point distortion of the output signals DQS, BDQS, and the jth RE and BRE stages 306($j$), 308($j$) are configured as inverters, the jth RE and BRE stages 306($j$), 308($j$) may generate the jth intermediate signals REI(j), BREI(j) with cross-point distortion having an initial polarity that is the same as the initial polarity of the output signals DQS, BDQS. Also, in the event that the complementary input signals to the jth RE and BRE stages 306($j$), 308($j$) have the same initial cross-point distortion polarity as the cross-point distortion polarity of the output signals DQS, BDQS, and the jth RE and BRE stages 306($j$), 308($j$) are configured as non-inverters, the jth RE and BRE stages 306($j$), 308($j$) may generate the jth intermediate signals REI(j), BREI(j) with cross-point distortion having an initial polarity that is the same as the initial polarity of the output signals DQS, BDQS. In addition, in the event that the complementary input signals to the jth RE and BRE stages 306($j$), 308($j$) have the opposite cross-point polarity from the polarity of cross-point distortion of the output signals DQS, BDQS, and the jth RE and BRE stages 306($j$), 308($j$) are configured as non-inverters, the jth RE and BRE stages 306($j$), 308($j$) may generate the jth intermediate signals REI(j), BREI(j) with cross-point distortion having an initial polarity that is opposite to the initial polarity of the output signals DQS, BDQS.

Referring back to FIG. 13, the controller 1302 may be configured with a correspondence mapping that maps each of the pairs RE and BRE stages 306, 308 to a first indication that indicates that a given jth pair of RE and BRE stages 306($j$), 308($j$) generates the jth pair of intermediate signals REI(j), BREI(j) with a cross-point distortion having an initial polarity that is the same as the initial polarity of the cross-point distortion of the output signals DQS, BDQS, or to a second indication that indicates that the given jth pair of RE and BRE stages 306($j$), 308($j$) generates the jth pair of intermediate signals REI(j), BREI(j) with a cross-point distortion having an initial polarity that is opposite to (or different than) the initial polarity of the cross-point distortion of the output signals DQS, BDQS. Accordingly, the pairs of RE and BRE stages 306, 308 that the correspondence mapping maps to the first indication may form or be part of a first set of pairs of circuit stages, and the pairs of RE and BRE stages 306, 308 that the correspondence mapping maps to the second indication may form or be part of a second set of pairs of circuit stages.

In addition, in performing a cross-point correction process, the controller 1302 may be configured to identify selected and unselected pull-up and push-down portions that are respectively eligible and ineligible for drive strength adjustment. The controller 1302 may be configured to identify the selected and unselected portions based on a combination of the correspondence mapping and a determination or identification of whether the pair of output signals DQS, BDQS has a cross-point distortion with an initially positive or an initially negative polarity. In particular, during a first iteration of a cross-point correction process, the controller 1302 may identify whether the output signals DQS, BDQS has an initially positive cross-point distortion or an initially negative cross-point distortion. Based on this identification, the controller 102 may determine whether to reduce the pull-up drive strengths or the push-down drive strengths for pairs of stages 306, 308 configured to generate their respective intermediate signals with the same initial cross-point distortion polarity as the initial cross-point distortion polarity of the output signals DQS, BDQS, and whether to reduce the pull-up drive strengths or push-down drive strengths for pairs of stages 306, 308 configured to generate their respective intermediate signals with the opposite initial cross-point distortion polarity from the initial cross-point distortion polarity of the output signals DQS, BDQS.

During the first iteration of a given cross-point correction process, upon identifying whether the output signals have cross-point distortion with an initially positive or an initially negative polarity, the controller 102 may then use the correspondence mapping in combination with the identification, and in accordance with the CPC slope adjustment scheme, to identify the selected and unselected portions in the RE and BRE stages 306, 308. For example, suppose in a first iteration that the controller 1302 determines that the output signals DQS, BDQS have a cross-point distortion with an initially negative polarity. In response, for each of the RE and BRE stages 306, 308, where the controller 1302 identifies, through use of the correspondence mapping, that a given pair of jth RE and BRE stages 306(j), 308(j) is mapped to the first indication indicating that the jth pair of RE and BRE stages 306(j), 308(j) generates the jth pair of intermediate signals REI(j), BREI(j) with a cross-point distortion having the same polarity as the initial cross-point distortion polarity of the output signals DQS, BDQS, the controller 1302 may identify the push-down portion for each of the jth RE and BRE stages 306(j), 308(j) as selected portions, and may identify the pull-up portion for each of the jth RE and BRE stages 306(j), 308(j) as unselected portions. In addition, where the controller 1302 identifies, through use of the correspondence mapping, that a given pair of jth RE and BRE stages 306(j), 308(j) is mapped to the second indication indicating that the jth pair of RE and BRE stages 306(j), 308(j) generates the jth pair of intermediate signals REI(j), BREI(j) with a cross-point distortion having the opposite polarity from the initial cross-point distortion polarity of the output signals DQS, BDQS, the controller 1302 may identify the pull-up portion for each of the jth RE and BRE stages 306(j), 308(j) as selected portions, and may identify the push-down portion for each of the jth RE and BRE stages 306(j), 308(j) as unselected portions.

As another example, suppose in a first iteration that the controller 1302 determines that the output signals DQS, BDQS have a cross-point distortion with an initially positive polarity. In response, for each of the RE and BRE stages 306, 308, where the controller 1302 identifies, through use of the correspondence mapping, that a given pair of jth RE and BRE stages 306(j), 308(j) is mapped to the first indication indicating that the jth pair of RE and BRE stages 306(j), 308(j) generates the jth pair of intermediate signals REI(j), BREI(j) with a cross-point distortion having the same polarity as the initial cross-point distortion polarity of the output signals DQS, BDQS, the controller 1302 may identify the pull-up portion for each of the jth RE and BRE stages 306(j), 308(j) as selected portions, and may identify the push-down portion for each of the jth RE and BRE stages 306(j), 308(j) as unselected portions. In addition, where the controller 1302 identifies, through use of the correspondence mapping, that a given pair of jth RE and BRE stages 306(j), 308(j) is mapped to the second indication indicating that the jth pair of RE and BRE stages 306(j), 308(j) generates the jth pair of intermediate signals REI(j), BREI(j) with a cross-point distortion having the opposite polarity from the initial cross-point distortion polarity of the output signals DQS, BDQS, the controller 1302 may identify the push-down portion for each of the jth RE and BRE stages 306(j), 308(j) as selected portions, and may identify the pull-up portion for each of the jth RE and BRE stages 306(j), 308(j) as unselected portions.

Figure 17:
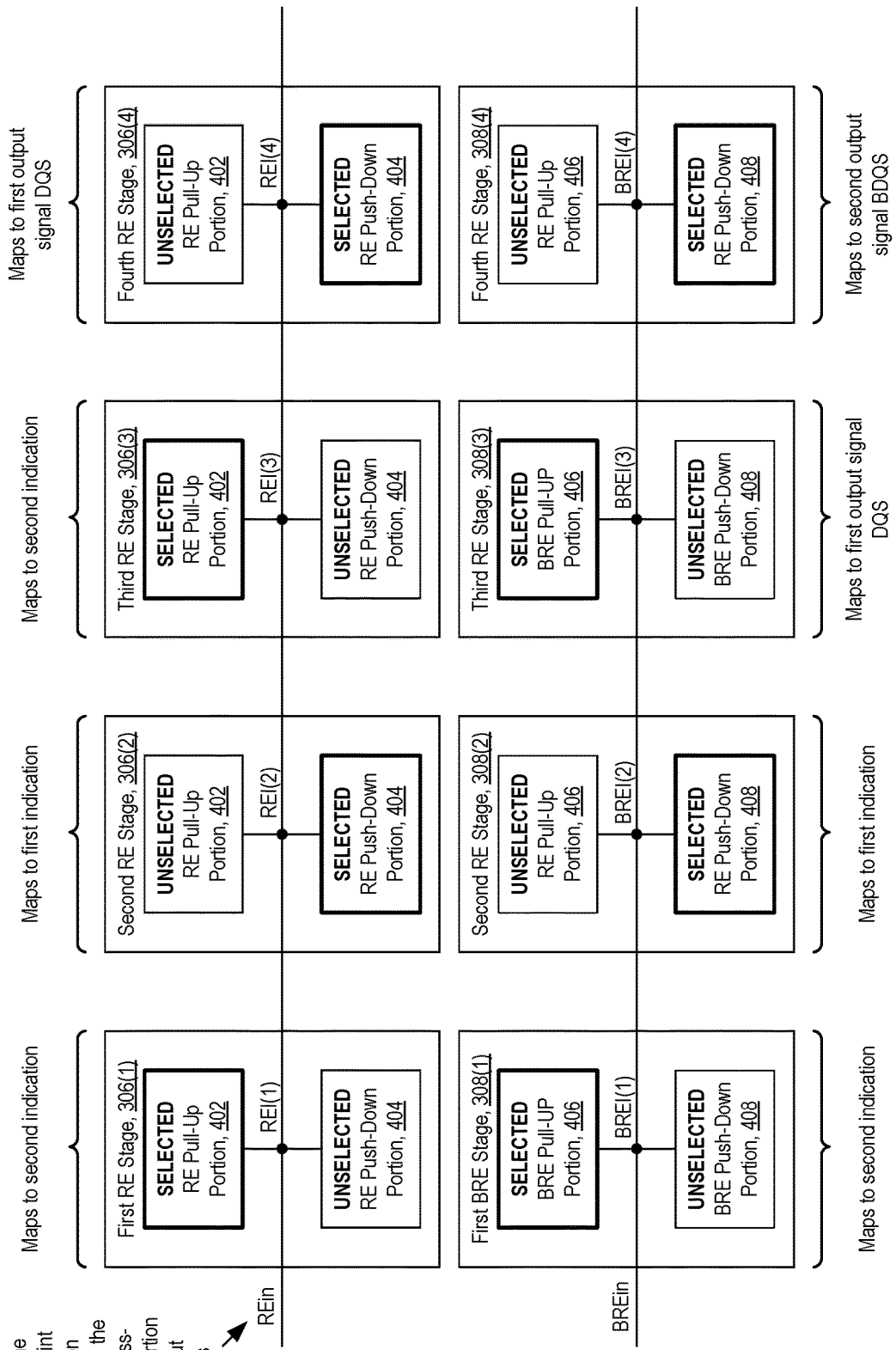
FIG. 17 is a block diagram of the RE and BRE stages of FIG. 3, with their respective pull-up and push-down portions identified as selected or unselected in response to an identification that a cross-point distortion has an initially negative polarity.
Figure 18:
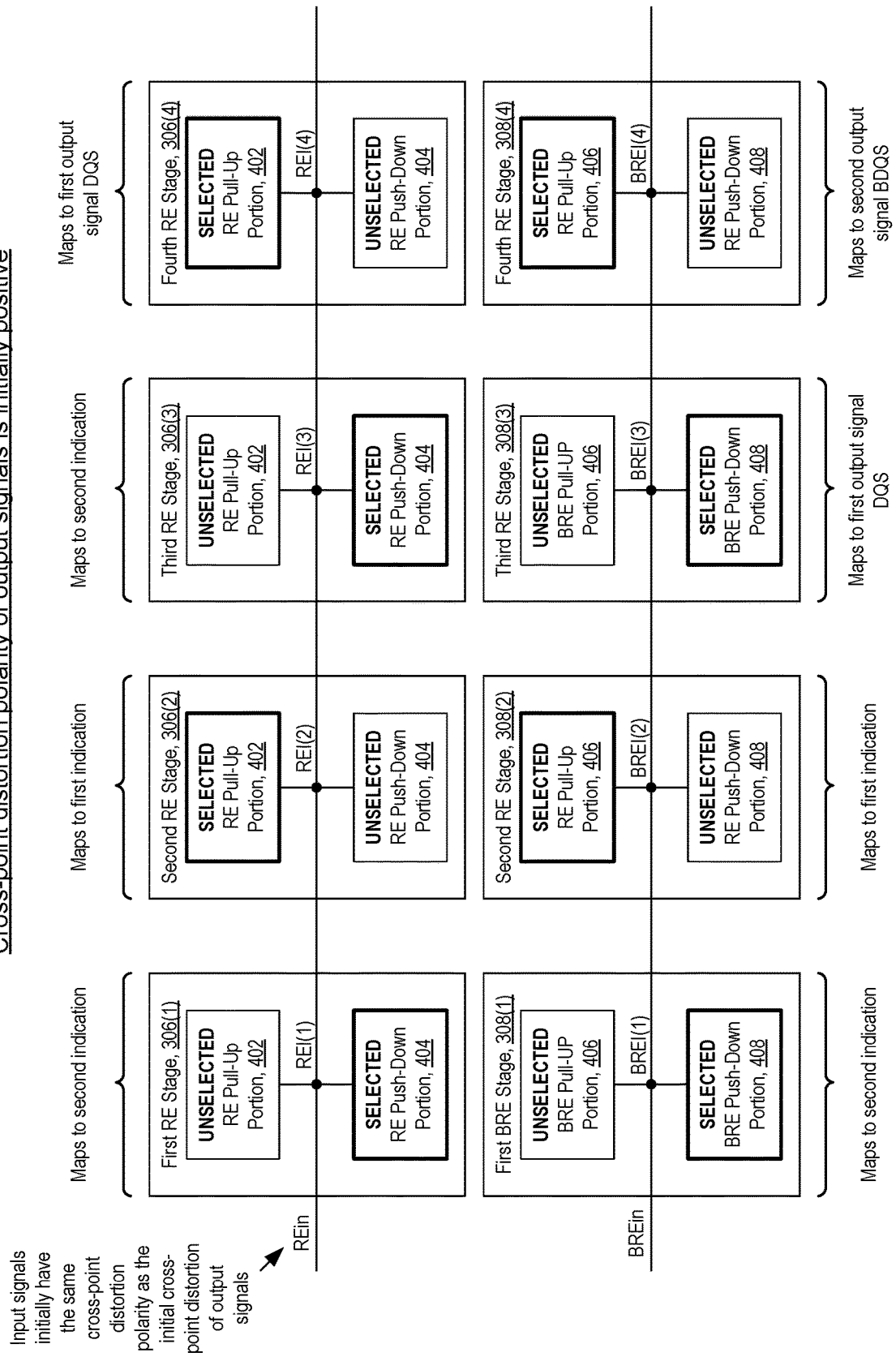
FIG. 18 is a block diagram of the RE and BRE stages of FIG. 3, with their respective pull-up and push-down portions identified as selected or unselected in response to an identification that a cross-point distortion has an initially positive polarity.

FIGS. 17 and 18 show block diagrams of the example configuration of the four RE stages 306 and the four BRE stages 308 of FIGS. 3 and 6, and further with each of the pull-up and push-down portions being identified as selected or unselected. Those pull-up and push-down portions that the controller 102 identifies as unselected and that pull-up and push-down voltage levels of associated RE and BRE intermediate signals REI, BREI with an initial drive strength amount may be part of a first set of pull-up and push-down portions. In addition, those pull-up and push-down portions that the controller 102 identifies as selected and pull-up and push-down voltage levels of associated RE and BRE intermediate signals with reduced drive strength amounts lower than the initial drive strength amount may be part of a second set of pull-up and push-down portions. The controller 102 may be configured to identify a configuration of the pull-up and push-down portions in the first set and the second set—e.g., which of the pull-up and push-down portions 402, 404, 406, 408 are identified by the controller 102 as unselected and in the first set and which of the pull-up and push-down portions 402, 404, 406, 408 are identified as selected and in the second set—dependent on a measurement or identification of an initial polarity of the cross-point distortion in the output signals DQS, BDQS, that is, whether the initial polarity of the cross-point distortion is positive or negative. FIG. 17 shows a case where the initial polarity of the cross-point distortion is negative. FIG. 18 shows a case where the initial polarity of the cross-point distortion is positive. The dependency of the selected and unselected portions on whether the initial polarity is positive or negative may yield different configurations of the pull-up and push-down in the first set and in the second set, as demonstrated when comparing the selected and unselected portions between FIGS. 17 and 18.

In accordance with the CPC slope adjustment scheme, when the initial polarity of the cross-point distortion of the output signals DQS, BDQS is a negative polarity, the controller 102 may be configured to identify the second set of portions to have reduced drive strengths as including those pull-up portions that are part of a first set of circuit stages, where each circuit stage of the first set is configured to generate an associated one of the intermediate signals REI, BREI with an initially positive cross-point distortion. In addition, the controller 102 may be configured to identify the second set of portions to have reduced drive strengths as including those push-down portions that are part of a second set of circuit stages, where each circuit stage of the second set is configured to generate an associated one of the intermediate signals REI, BREI with an initially negative cross-point distortion.

In addition, as described in further below with respect to FIGS. 17 and 18, each pair of RE and BRE stages 306, 308 may be considered to have a pair of pull-up portions 402, 406 and a pair of push-down portions 404, 408. For each pair of RE and BRE stages 306, 308, in accordance with the CPC slope adjustment scheme and the correspondence mapping, the controller 1302 may be configured to identify, for each pair of RE and BRE stages 306, 308, that the associated pair of pull-up portions 402, 406 is part of the first set of unselected portions and the pair push-down portions 404, 408 is part of the second set of selected portions, or that the associated pair of pull-up portions 402, 406 is part of the second set of selected portions and the pair of push-down portions 404, 408 is part of the first set of unselected portions.

Referring specifically to FIG. 17, a block diagram of the example configuration of the four RE and BRE stages 306, 308 of FIGS. 3 and 6 is shown, further with each of the pull-up and push-down portions being identified as unselected and part of the first set of portions or selected and part of the second set of portions in response to an identification that the output signals DQS, BDQS have a cross-point distortion with an initially negative polarity. In the example configuration shown in FIG. 17, each of the RE and BRE stages 306, 308 may be configured as inverters. Accordingly, the correspondence mapping may alternatingly map consecutive RE stages 306 in the RE path 302 and BRE stages 308 in the BRE path 304 according to the first and second indications. Given that the input signals REin, BREin may have cross-point distortion with the same polarity as the cross-point distortion polarity of the output signals DQS, BDQS, the correspondence mapping may map: the first RE and BRE stages 306(1), 308(1) to the second indication, the second RE and BRE stages 306(2), 308(2) to the first indication, the third RE and BRE stages 306(3), 308(3) to the second indication, and the fourth RE and BRE stages 306(4), 308(4) to the first indication.

In response to determining that the output signals DQS, BDQS have a cross-point distortion with an initially negative polarity, and in accordance with the correspondence mapping and the CPC slope adjustment scheme as previously described, the controller 1302 may be configured to identify: for the first pair of RE and BRE stages 306(1), 308(1), the pull-up portions as selected portions and the push-down portions as unselected portions; for the second pair of RE and BRE stages 306(2), 308(2), the push-down portions as selected portions and the pull-up portions as unselected portions; for the third pair of RE and BRE stages 306(3), 308(3), the pull-up portions as selected portions and the push-down portions as unselected portions; and for the fourth pair of RE and BRE stages 306(4), 308(4), the push-down portions as selected portions and the pull-up portions as unselected portions.

Turning to FIG. 18, in accordance with the CPC slope adjustment scheme, when the initial polarity of the cross-point distortion of the output signals DQS, BDQS is a positive polarity, the controller 102 may be configured to identify the second set of portions to have reduced drive strengths as including those push-down portions that are part of a first set of circuit stages, where each circuit stage of the first set is configured to generate an associated one of the intermediate signals REI, BREI with an initially negative cross-point distortion. In addition, the controller 102 may be configured to identify the second set of portions to have reduced drive strengths as including those pull-up portions that are part of a second set of circuit stages, where each circuit stage of the second set is configured to generate an associated one of the intermediate signals REI, BREI with an initially positive cross-point distortion.

FIG. 18 shows a block diagram of the example configuration of the four RE and BRE stages 306, 308 of FIGS. 3 and 6, and further with each of the pull-up and push-down portions being identified as selected or unselected in response to an identification that the output signals DQS, BDQS have a cross-point distortion with an initially positive polarity. Like the configuration of FIG. 17, in the configuration in FIG. 18, each of the RE and BRE stages 306, 308 may be configured as inverters. Accordingly, the RE and BRE stages 306, 308 have the same correspondence mapping as that in FIG. 17.

In response to determining that the output signals DQS, BDQS have a cross-point distortion with an initially positive polarity, and in accordance with the correspondence mapping and the CPC slope adjustment scheme as previously described, the controller 1302 may be configured to identify: for the first pair of RE and BRE stages 306(1), 308(1), the push-down portions as selected portions and the pull-up portions as unselected portions; for the second pair of RE and BRE stages 306(2), 308(2), the pull-up portions as selected portions and the push-down portions as unselected portions; for the third pair of RE and BRE stages 306(3), 308(3), the push-down portions as selected portions and the pull-up portions as unselected portions; and for the fourth pair of RE and BRE stages 306(4), 308(4), the pull-up portions as selected portions and the push-down portions as unselected portions.

Referring back to FIG. 13, in addition to identifying selected and unselected portions of the RE and BRE stages 306, 308, the controller 1302 may be configured to set and/or adjust drive strength levels for the selected portions over a plurality of iterations of a cross-point correction process so that by the last iteration, the controller 1302 has identified optimum drive strength levels for the selected portions that yield minimum cross-point distortion in the output signals DQS, BDQS, and has set the drive strengths of the selected portions to their respective optimum drive strength levels. To do so, the controller 1302 may continually detect, measure or monitor for cross-point distortion of the pair of output signals DQS, BDQS over a predetermined, Q-number of iterations. In each iteration, the controller 1302 may set or adjust a value of a control code CC in response to detecting the cross-point distortion. The controller 1302 may search for and/or select control code values CC corresponding to drive strength amounts for the selected portions in the slope adjustment circuit 1304 to have when generating the intermediate signals REI, BREI. The control code values the controller 1302 searches for and/or selects may be to compensate or correct for the cross-point distortion as initially indicated by the output signals DQS, BDQS. The controller 1302 may do so by identifying, in each iteration, whether the cross-point distortion in the output signals DQS, BDQS has a positive polarity or a negative polarity, and select a control code value CC to set drive strengths for the slope adjustment circuit 1304 that reduces, minimizes, and/or eliminates the cross-point distortion in the output signals DQS, BDQS.

The controller 1302 may include a cross-point detection circuit 1308, a search circuit 1310, and a decoder circuit 1312. The cross-point detection circuit 1308 may be configured to measure cross-point distortion in the plurality of output signals DQS, BDQS, such as by detecting an actual cross-point level $V_{CPA}$ of the output signals DQS, BDQS and determining whether cross-point distortion in the output signals is positive (the actual cross-point level $V_{CPA}$ is higher than a target cross-point level $V_{CPT}$) or negative (the actual cross-point level $V_{CPA}$ is lower than the target cross-point level $V_{CPT}$). The cross-point detection circuit 1308 may be configured to output a cross-point detection signal CPD that indicates whether the cross-point distortion is positive or negative.

The search circuit 1310 may be configured to search for and/or select target drive strength values from among a plurality of drive strength values in accordance with a selection scheme and/or based on the measured cross-point distortion, such as through receipt of the cross-point detection signal CDP from the cross-point detection circuit 1308. The search circuit 1310 may be configured in the same way or similarly to the configuration of the search circuit 116 of FIG. 1. For example, the search 1310 may be configured to search for and select target drive strength values in each of a plurality of iterations in accordance with a search algorithm, such as a binary search algorithm, as previously described. However, in each iteration, instead of selecting target drive strength values based on a comparison result signal CR indicating which of the output signals DQS, BDQS has the higher duty cycle, the search circuit 1310 may select target drive strength values based on the cross-point detection signal CDP indicating, in each of the iterations, whether the polarity of the cross-point distortion in the output signals DQS, BDQS is positive or negative. For example, a change in polarity as indicated by the cross-point detection signal CPD may indicate to the search circuit 1310 to change a selection direction in which it is selecting target drive strength values.

In a given iteration, upon selecting a new drive strength value, the search circuit 116 may be configured to output, send, or pass the new target drive strength value it selects in the form of a control code CC to the decoder circuit 1312. The decoder circuit 1312 may be configured similarly to the decoder circuit 118 of FIG. 1, in that the decoder circuit 1312 is configured to output the drive strength signals DS to the slope adjustment circuit 1304 based on the control code CC it receives from the search circuit 1310. In a given iteration, the decoder circuit 1312 may receive the control code CC, perform a decoding process in response to the control code CC, and output the drive strength signals DS at levels corresponding to the decoding process. Further, in a given iteration where the decoder circuit 1312 receives a control code CC from the search circuit 1310, the decoder circuit 118 may perform a decoding process in which the decoder circuit 1312 sets the levels of each of the RE and BRE pull-up and push down drive strength signals ENp, ENn, BENp, BENn, or more particularly, in which the decoder circuit 1312 sets the levels of each of the RE and BRE push-up and push-down drive strength sub-signals SELp, SELn, BSELp, BSELn that are input to the pull-up and push-down branches, as illustrated in FIGS. 5 and 7-9. In the given iteration, the decoder circuit 1312 may be configured to set a level of a given drive strength sub-signal by keeping the level at a current level, or by changing the level from the current level to a new level. To do so, the decoder circuit 1312 may be configured to determine whether the given drive-strength sub-signal is output to a branch of a selected portion or an unselected portion.

Similar to the decoder circuit 118 of FIG. 1, in the event that the decoder circuit 1312 outputs the given drive strength sub-signal to a branch of an unselected portion, then in the given iteration, the decoder circuit 1312 may keep the level of the given drive strength sub-signal unchanged. Alternatively, in the event that the decoder circuit 1312 outputs the given drive strength sub-signal to a branch of a selected portion, then in the given iteration, the decoder circuit 1312 may be configured to identify a portion (e.g., a bit or digit) of the control code CC (or a portion of the target drive strength amount indicated by the control code CC) that corresponds to the given drive strength sub-signal, and in response determine whether the branch receiving the given drive strength sub-signal is to be activated or deactivated. If the portion indicates that the branch is to be activated, then the decoder circuit 1312 may set the given drive strength sub-signal to a level that activates the branch. Alternatively, if the portion indicates that the branch is to be deactivated, then the decoder circuit 1312 may set the given drive strength sub-signal to a level that deactivates the branch.

An example cross-point correction process is now described. At the start or in an initial period of a cross-point correction process, before an initial iteration of the cross-point correction process begins, the controller 1302, such as with the decoder circuit 1312, may output the drive strength signals DS, including each of the drive strength sub-signals SELp, SELn, BSELp, BSELn at respective initial, predetermined levels to the branches of the pull-up and push down portions 402, 404, 406, 408 of the RE and BRE stages 306, 308. The output of the drive strength signals DS at the initial levels may set initial drive strength amounts for the pull-up and push-down portions 402, 404, 406, 408 to cause the pull-up and push-down portions 402, 404, 406, 408 to generate the RE and BRE intermediate signals REI, BREI with maximum slopes. Those pull-up and push-down portions 402, 404, 406, 408 that are to be unselected portions for the duty cycle correction process may participate in generating their respective RE and BRE intermediate signals REI, BREI with the initial drive strength amounts for the duration of the cross-point correction process. In addition, the initial drive strength amounts may be maximum drive strength amounts that the pull-up and push-down portions 402, 404, 406, 408 can have or may be lower than the maximum drive strength amounts. In any event, during the course of the cross-point correction process, the decoder circuit 1312 may not output the drive strength signals DS to increase a drive strength for a given pull-up or push-down portion 402, 404, 406, 408 above the initial drive strength amount, such that the magnitudes of the rising and falling slopes of the RE and BRE intermediate signals REI, BREI that the RE and BRE stages 306, 308 generate during the initial period are maximum slope magnitudes, meaning that the RE and BRE stages 306, 308 may not generate their respective RE and BRE intermediate signals with rising or falling slopes with magnitudes greater than the magnitude value of the maximum slope.

At the end of or after the initial period, an initial or first iteration of the cross-point correction process may start, in which the slope adjustment circuit 1304 may receive the input signals REin, BREin, generate the RE and BRE intermediate signals REI, BREI with the initial drive strength amounts, and the data alignment circuit 106 may generate and output the output signals DQS, BDQS in response to receipt of the last intermediate signals REI(N), BREI(N) that the last RE and BRE stages 306(N), 308(N) generated with their RE and BRE pull-up and push-down portions 402, 404, 406, 408 each set to the initial drive strength amounts.

In response, the cross-point detection circuit 1308 may receive the output signals DQS, BDQS and in response, may perform an initial measurement of the cross-point distortion by identifying whether the cross-point distortion has an initial polarity that is positive or negative. The cross-point detection circuit 1308 may output a cross-point detection signal CDP at an initial level that indicates whether the cross-point distortion in the output signals DQS, BDQS has an initial polarity that is positive or negative.

Based on the initial measurement of the cross-point distortion, the decoder circuit 1312 may be configured to identify whether the cross-point distortion as an initial polarity that is positive or negative, and identify the selected pull-up and push-down portions of the RE and BRE stages 306, 308 based on the initial measurement of the cross-point distortion. In particular, as shown in FIG. 1, the decoder circuit 1312 may be configured to receive the cross-point detection signal CPD from the cross-point detection circuit 1308, and use the initial level of the cross-point detection signal CPD to identify which of the RE and BRE pull-up and push down portions 402, 404, 406, 408 are to be selected portions and which are to be unselected portions for the cross-point correction process. Similar to the decoder circuit 118 of FIG. 1, the decoder circuit 1312 may be configured with the correspondence mapping that maps each of the RE and BRE stages 306, 308 to the first indication or the second indication. The decoder circuit 1312 may further be configured to identify selected and unselected portions according to the CPC slope adjustment scheme. Upon receipt of the cross-point detection signal CPD at the initial level, the decoder circuit 1312 may use the initial level of the cross-point detection signal CPD in combination with the correspondence mapping and in accordance with the CPC slope adjustment scheme to identify the selected pull-up and push down portions and the unselected pull-up and push-down portions.

In the cross-point correction process, the selected pull-up and push-down portions may be a first set of pull-up and push-down portions, and the unselected pull-up and push-down portions may be a second set of pull-up and push-down portions. The drive strengths of the pull-up and push-down portions of the first set may be a first set of drive strengths, and the drive strengths of the pull-up and push-down portions of the second set may be a second set of drive strengths. In the initial period of the cross-point correction process, the controller 1302 may set the first set of drive strengths and the second set of drive strengths to the initial drive strength amount or level. During the iterations, the controller 1302 may output the drive strength signals DS to set and maintain the second set of drive strengths at the initial drive strength amount, and to set the first set of drive strengths to drive strength amounts lower than the initial drive strength amount.

Referring back specifically to the initial iteration, the search result circuit 1310 may also receive the cross-point detection signal CPD at the initial level and in response, select an initial target drive strength value corresponding to an initial target drive strength amount at which the selected portions are to initially reduce their drive strengths from the initial drive strength amounts. In some example configurations, such as with execution of a binary search algorithm, the initial target drive strength value may be a middle drive strength value between a maximum drive strength value and a minimum drive strength value of an array of drive strength values, as previously described. Upon selecting the initial target drive strength value, the search circuit 1310 may output the control code CC indicating the initial target drive strength value to the decoder circuit 1312. The search circuit 1310 may also identify that it is currently selecting target drive strength values in the decreasing selection direction.

In response to receipt of the control code CC indicating the initial target drive strength value, the decoder circuit 1312 may perform an initial or first decoding process to set the levels of the pull-up and push-down drive strength sub-signals SELp, SELn, BSELp, BSELn. As previously described, the decoder circuit 1312 may keep the levels of the drive-strength sub-signals output to branches of unselected portions unchanged. Additionally, the decoder circuit 1312 may set the drive-strength sub-signals output to branches of selected portions to levels that either activate or deactivate the branches of the selected portions according to whether the corresponding portions (e.g., digits or bits) indicate whether to activate or deactivate the respective branches. Upon performing the initial decoding process, the decoder circuit 1312 may output the drive strength sub-signals SELp, SELn, BSELp, BSELn to the branches of the pull-up and push-down portions 402, 404, 406, 408 of the RE and BRE stages 306, 308. In response, the selected portions may reduce their respective drive strengths to the initially reduced drive strength amounts. In turn, the RE and BRE stages 306, 308 may generate the RE and BRE intermediate signals REI, BREI with certain rising and falling slopes being reduced in accordance with the selected portions performing pull-up and push-down portions with the initially-reduced drive strengths.

The cross-point correction process may then move into the second iterations, where the cross-point detection circuit 1308 again identifies whether the cross-point distortion of the output signals DQS, BDQS has a positive or a negative polarity and outputs the cross-point detection signal CPD at a second level (either a high level or a low level) to indicate whether the polarity is positive or negative. The search circuit 1310 responds to the second level of the cross-point detection signal CPD by selecting a new, second target drive strength value based on the second level of the cross-point detection signal CPD, and outputs a control code CC indicating the second drive strength value to the decoder circuit 1312. In response, the decoder circuit 1312 performs a second decoding process based on the second drive strength value, and outputs the pull-up and push-down drive strength sub-signals SELp, SELn, BSELp, BSELn to the branches of the pull-up and push-down portions 402, 404, 406, 408 in response to the second decoding process. In response to receipt of the pull-up and push-down drive strength sub-signals SELp, SELn, BSELp, BSELn, the various selected pull-up and push-down portions may either correspondingly increase or decrease their respective drive strengths from the initially reduced drive strength amount. The cross-point correction process may then proceed in the third through Qth iterations until the Qth iteration has ended.

Over the course of the iterations, the search circuit 1310 will select the target drive strength values based in the levels of the cross-point detection signal CPD so that with each iteration, the search circuit 1310 selects a new target drive strength value that reduces the cross-point distortion of the output signals DQS, BDQS compared to the target drive strength value the search circuit 1310 selected in the last iteration. Or at least by the last, Qth iteration, the last, Qth target drive strength value that the search circuit 1310 selects causes the selected pull-up and push-down portions to have optimally reduced drive strengths from the initial drive strength amounts so that the slopes of the rising and falling transitions of the RE and BRE intermediate signals REI, BREI have reduced slope magnitudes relative to the maximum slope magnitudes that provide for minimized cross-point distortion in the output signals DQS, BDQS.

Figure 19:
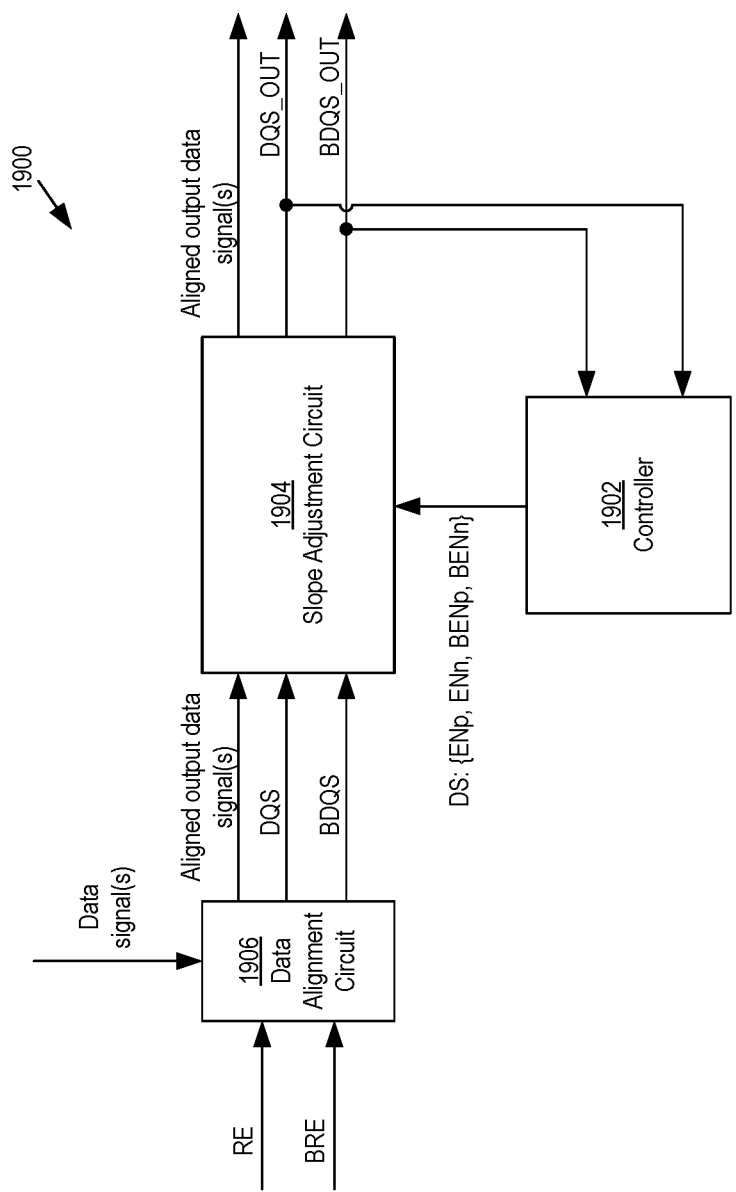
FIG. 19 is a block diagram on an example correction system with a slope adjustment circuit configured downstream from a data alignment circuit.

FIG. 19 shows an example correction system 1900, which may be either a duty cycle correction system like the duty cycle correction system 100 of FIG. 1, or a cross-point correction system like the cross-point correction system 1300 of FIG. 13. The example system 1900 may include a controller 1902 and a slope adjustment circuit 1904. The controller 1902 may be configured the same as or similar to the controller 102 of FIG. 1 or the controller 1302 of FIG. 13 and the slope adjustment circuit 1904 may be configured similar to the slope adjustment circuit 104 of FIG. 1 or the slope adjustment circuit 1304 of FIG. 13, depending on whether the correction system 1900 is configured to perform duty cycle correction or cross-point correction.

As shown in FIG. 19, the slope adjustment circuit 1904 is configured in the complementary signal path downstream relative to a data alignment circuit 1906, instead of upstream to the data alignment circuit 1906, in contrast to the configurations of FIGS. 1 and 13. For this example configuration, the slope adjustment circuit 1904 may be configured to receive, as its input signals, the output signals DQS, BDQS from the data alignment circuit 1906, and may generate and a second pair of output signals DQS_OUT, BDQS_OUT with corrected duty cycle or cross-point distortion. In this context, the second pair of output signals DQS_OUT, BDQS_OUT is a last pair of complementary signals that a last stage of the slope adjustment circuit 1904 generates. The slope adjustment circuit 1904 may feed back the second pair of output signals DQS_OUT, BDQS_OUT to the controller 1902 for performance of a cross-point correction process.

Figure 20:
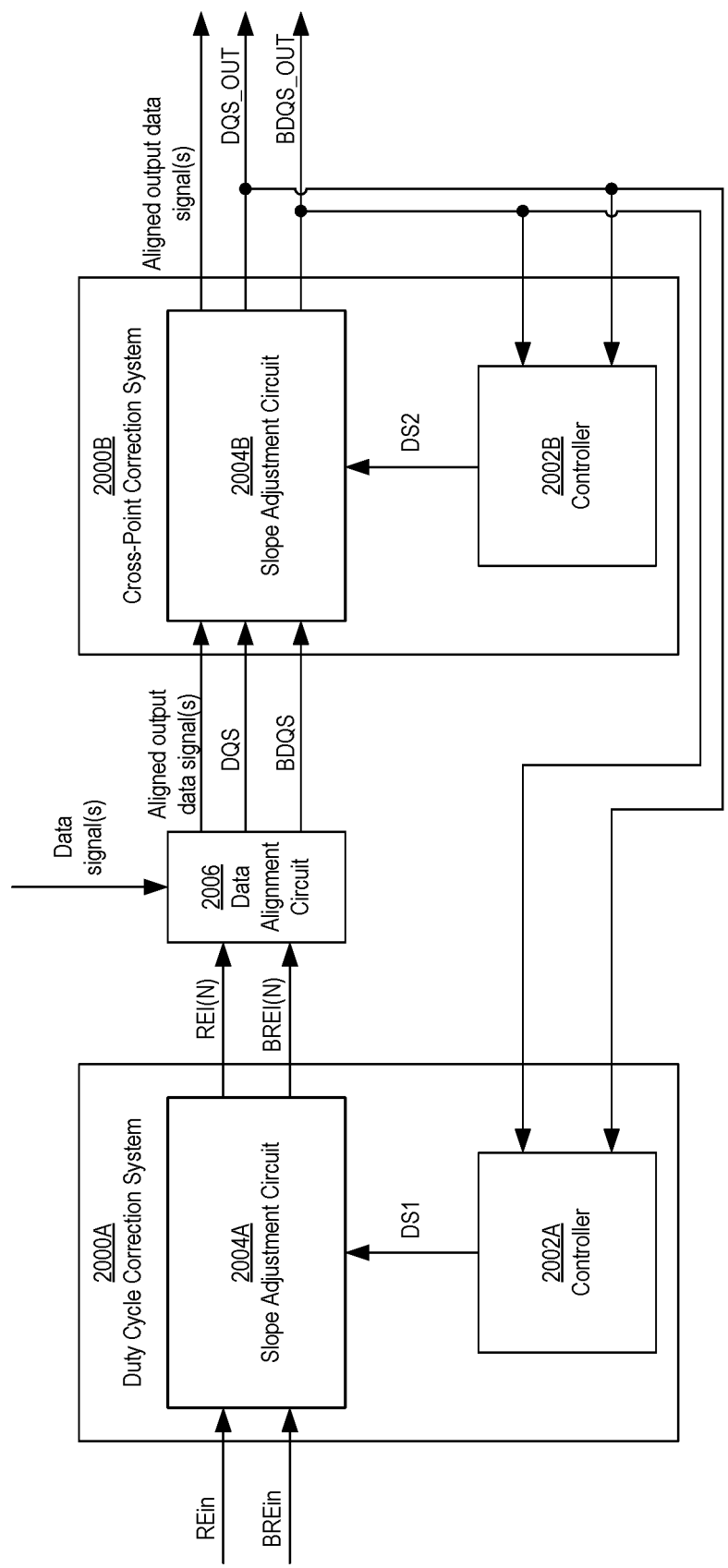
FIG. 20 is a block diagram of another example correction system with a slope adjustment circuit of a duty cycle correction system configured upstream from a data alignment circuit and a slope adjustment circuit of a cross-point correction system configured downstream from the data alignment circuit.

FIG. 20 shows another example correction system that includes both a duty cycle correction system 2000A and a cross-point correction 2000B. The duty cycle correction 2000A may include a controller 2002A and a slope adjustment circuit 2004A, which may be configured the same as or similar to the controller 102 and the slope adjustment circuit 104 of the example duty cycle correction system 100 of FIG. 1. Additionally, the cross-point correction system 2000B may include a controller 2002B and a slope adjustment circuit 2004B, which may be configured the same as or similar to the controller 1302 and the slope adjustment circuit 1304 of the example cross-point correction system 1300 of FIG. 13. As shown in FIG. 20, the controller 2002A of the duty cycle correction system 2000A may be configured to generate and output a first set of drive strength signals DS1 to the slope adjustment circuit 2004A, and the controller 2002B of the cross-point correction system 2000B may be configured to generate and output a second set of drive strength signals DS2 to the slope adjustment circuit 2004B.

In the example correction system of FIG. 20, the duty cycle correction system 2000A is configured upstream from a data alignment circuit 2006, similar to the configuration of FIG. 1, and the cross-point correction system 2000B is positioned downstream from the data alignment circuit 2006, similar to the configuration of FIG. 19. The slope adjustment circuit 2004B of the cross-point correction system 2000B may feed back the second pair of output signals DQS_OUT, BDQS_OUT to the each of the controllers 2002A, 2002B of the duty cycle and cross-point correction systems 2000A, 2000B for performance of their respective duty cycle and cross-point correction processes.

Figure 21:
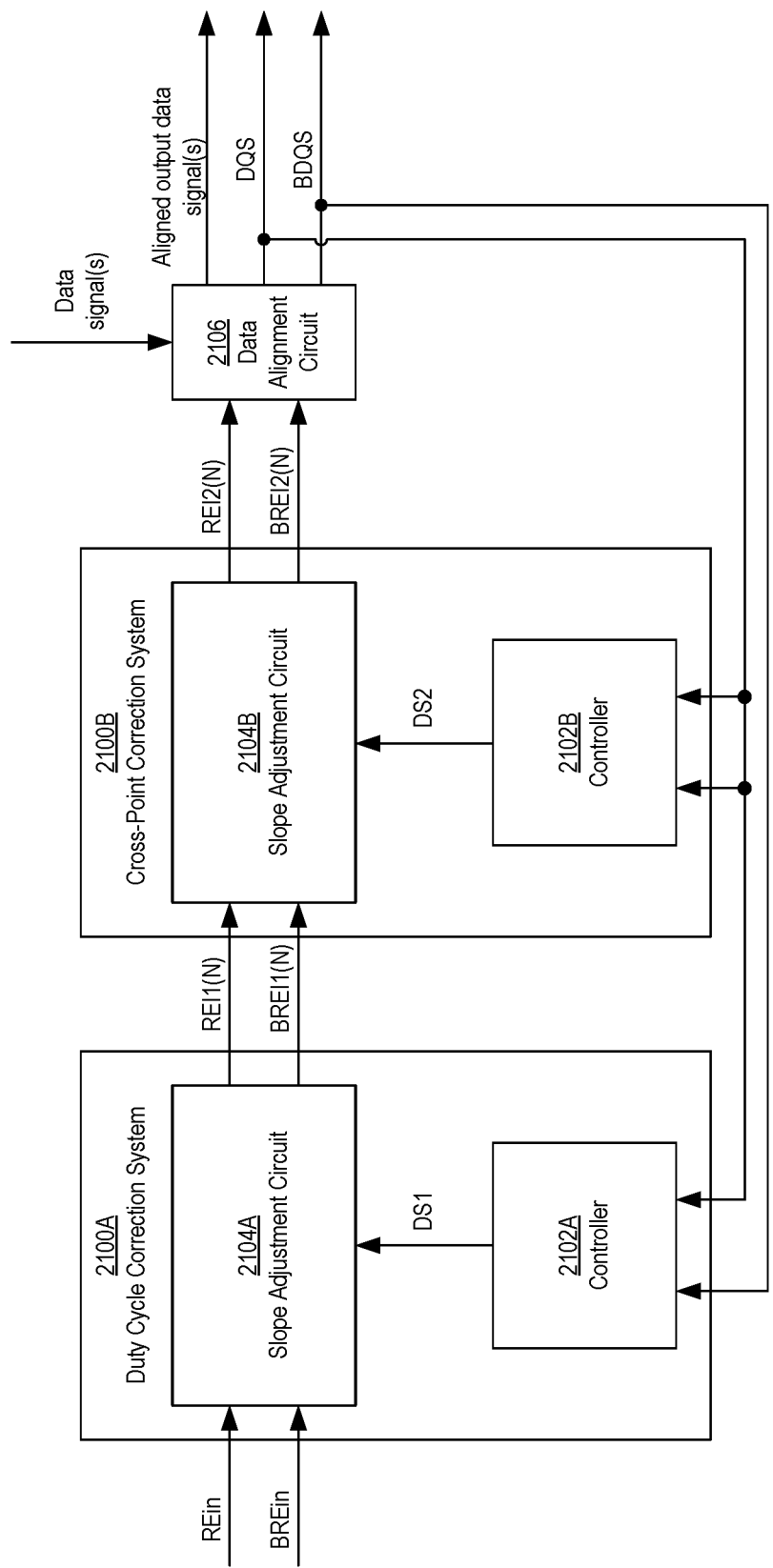
FIG. 21 is block diagram of another example correction system with slope adjustment circuits of both a duty cycle correction system and a cross-point correction system configured upstream from a data alignment circuit.

FIG. 21 includes another example correction system that includes both a duty cycle correction system 2100A and a cross-point correction system 2100B. The duty cycle correction 2000A may include a controller 2002A and a slope adjustment circuit 2004A, which may be configured the same as or similar to the controller 102 and the slope adjustment circuit 104 of the example duty cycle correction system 100 of FIG. 1. Additionally, the cross-point correction system 2000B may include a controller 2002B and a slope adjustment circuit 2004B, which may be configured the same as or similar to the controller 1302 and the slope adjustment circuit 1304 of the example cross-point correction system 1300 of FIG. 13.

In the example system of FIG. 21, both the duty cycle correction system 2100A and the cross-point correction system 2100B are configured upstream from a data alignment circuit 2106. The slope adjustment circuit 2104A may generate a first set of RE and BRE intermediate signals REI1, BREI1, and the slope adjustment circuit 2104B may generate a second set of RE and BRE intermediate signals REI2, BREI2. As shown in FIG. 21, the slope adjustment circuit 2104A may output a last or Nth pair of intermediate signals REI1(N), BREI1(N) to the slope adjustment circuit 2104B. The slope adjustment circuit 2104B may use the last pair of intermediate signals REI1(N), BREI1(N) as its input signals, generate a last pair of intermediate signals REI2(N), BREI2(N), and output the last pair of intermediate signals REI2(N), BREI2(N) to the data alignment circuit 2106. The data alignment circuit 2106 may feed back output signals DQS, BDQS to each of the controllers 2102A, 2102B of the duty cycle and cross-point correction systems 2100A, 2100B for performance of their respective duty cycle and cross-point correction processes.

The example systems of FIGS. 20 and 21 show the slope adjustment circuit of the duty cycle correction system configured or positioned upstream from the slope adjustment circuit of the cross-point correction system in their respective complementary signal path, or otherwise stated, the slope adjustment circuit of the cross-point correction system is configured or positioned downstream from the slope adjustment circuit of the duty cycle correction system. In other example systems, although not shown, the slope adjustment circuit of the cross-point correction system may be configured or positioned upstream from slope adjustment circuit of the duty cycle correction system, or otherwise stated, the slope adjustment circuit of the duty cycle correction system may be configured or positioned downstream from the cross-point correction system.

Also, the example systems of FIGS. 20 and 21 show at least one of the correction systems positioned upstream from a data alignment circuit. In other example systems, although not shown, both the slope adjustment circuit of the duty cycle correction system and the slope adjustment circuit of the cross-point correction system may be positioned downstream from the data alignment circuit.

Figure 22:
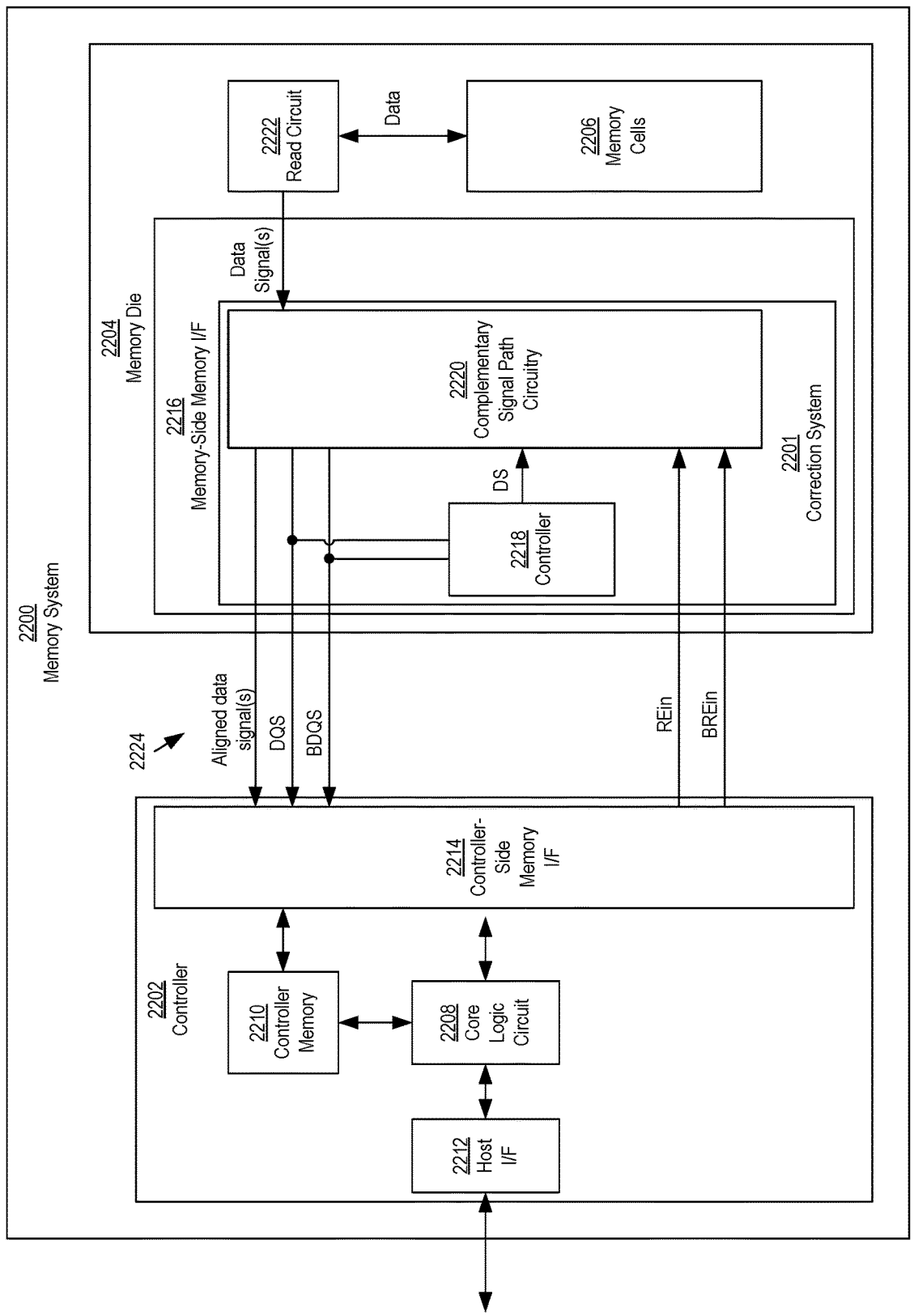
FIG. 22 is a block diagram of an example memory system configured with a correction system.

FIG. 22 shows a block diagram of an example memory system 2200 that may include a correction system 2201, which may have any of the various configurations of the duty cycle correction and/or cross-point correction systems as previously described. The memory system 2200 may be configured to be connected to and/or in communication with a host system (not shown). The host system may be any electronic system or device that is configured to communicate and/or operate with the memory system 2200.

The memory system 2200 may include a controller 2202 and a memory die 2204. The memory die 2204 may include memory cells or elements 2206, with each memory cell or element being configured to store one or more bits of data. Any suitable type of memory cells can be used. As examples, the memory cells may be volatile memory such as dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory cells can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

The controller 2202 may include a core logic circuit 2208. The core logic circuit 2208 may be configured to perform memory management functions, non-limiting examples of which may include, but not limited to, communicating with the host system, including receiving, handling, and responding to host requests or commands, such as read, write, erase, and status requests/commands received from the host system; error detection and correction (which may be part of handling host requests/commands); formatting the memory cells 2206 to ensure it is operating properly; mapping out bad memory cells; allocating spare cells to be substituted for future failed cells; wear leveling (distributing writes to avoid wearing out specific blocks of memory that would otherwise be repeatedly written to); garbage collection (after a block is full, moving only the valid pages of data to a new block, so the full block can be erased and reused); folding operations (moving data from a lower density memory area to a higher density memory area of the memory 2206); and transitioning the memory system 2200 between different states, operation modes, and/or power consumption modes. In operation, when the host system needs to read data from or write data to the memory 2206, it may communicate with the core logic circuit 2208. The core logic circuit 2208 may include hardware or a combination of hardware and software. For example, the core logic circuit 2208 may include a central processing unit, an application specific integrated circuit (ASIC), a field programmable gate array (FPGA), a digital logic circuit, an analog circuit, a combination of discrete circuits, gates, or any other type of hardware, or a combination thereof.

The controller 2202 may also include controller memory 2210, which may include volatile memory (e.g., random access memory (RAM)), non-volatile memory (e.g., read-only memory (ROM)), or a combination thereof. The controller memory 2210 may store software or firmware instructions and/or certain data structures, such as address translation data structures, that the core logic circuit 2208 may access and/or and execute to perform at least some of its memory management functions. Additionally, the core logic circuit 2208 may temporarily store data that is to be transferred to and stored in the memory cells 2206 such as in response to a host write command, and/or that was retrieved from the memory cells 2206 and is to be sent to the host system, such as in response to a host read command. FIG. 22 shows the controller memory 2210 as a component of the controller 2202, although in other example configurations, at least some of the controller memory 2210 may be a component of the memory system 2200 that is separate from the controller 2202. For example, the controller 2202 may be an integrated circuit, and depending on the configuration of the memory system 2200, the controller memory 2210 may be located on the integrated circuit, partially on the integrated circuit and partially separate from the integrated, or completely separate from the integrated circuit.

The controller 2202 may further include a host interface (I/F) 2212. The core logic circuit 2208 may be configured to communicate with a host system via a host interface 2212. In addition, the controller 2202 may include a controller-side memory interface (I/F) 2214 through which the controller 2202 is configured to communicate with the memory die 2204. Similarly, the memory die 2204 may include a memory-side memory interface (I/F) 2216 through which the memory die 2204 is configured to communicate with the controller 2202.

As shown in FIG. 22, the memory-side memory interface 2216 may include the correction system 2201, which may include a controller 2218 and a complementary signal path 2220. The controller 2218 may be configured as any of the controllers of the duty cycle correction and/or the cross-point correction systems as previously described with reference to FIGS. 1, 13, and 19-21. The complementary signal path circuitry 2220 may include any of various configurations of one or more slope adjustment circuits and a data alignment circuit as previously described with reference to FIGS. 1, 13, and 19-21. Also, in the example configuration shown in FIG. 22, the controller 2218 receives output signals DQS, BDQS output from the complementary signal path 2220 to perform a duty cycle correction process and/or a cross-point correction process, as previously described. In other example configurations, as previously described, instead of the pair of output signals DQS, BDQS input to the controller 2218, the input signals REin, BREin, or intermediate signals generated with the complementary signal path circuitry 2220 may be input so the controller 2218 as the pair of sample signals used for the duty cycle correction process and/or the cross-point correction process.

When the controller 2202 wants to read data stored in the memory cells 2206, such as in response to receipt of a host read request from the host system, a read circuit 2222 may be configured to retrieve the data from the memory cells 2206 and output the data as one or more data signals to the data alignment circuit of the complementary signal path circuitry 2220. In order for the controller 2202 to know when to latch on to or sample the data pulses of the data signal(s), the controller 2202 may send a pair of complementary clock signals to the memory die 2204, and the memory die 2204 may use the pair of complementary clock signals to align the data pulses of the data signals. The memory die 2204 may then send the data aligned data signal(s) along with the complementary clock signals back to the controller 2202, and the controller 2202 may look to the rising and falling edges of the complementary clock signals it receives to determine when to latch onto, sample, or otherwise identify the levels of the data pulses.

In a particular example configuration, when the controller 2202 wants to read data from the memory cells 2206, the controller-side memory interface 2214 may output a complementary pair of clock signals REin, BREin on complementary clock lines of a communications bus 2224 to the memory-side memory interface 2216. The clock signals REin, BREin may be the pair of complementary pair of input signals received by the duty cycle and/or cross-point correction systems, as previously described. The data alignment circuit of the complementary signal path 2220 may use a second pair of intermediate signals generated with a RE path of stages and a BRE path of stages to align the data pulses of the data signal(s) received from the read circuit 2222, and output the aligned data signal(s) along with the pair of output clock signals DQS, BDQS over the communications bus 2224 back to the controller 2202.

Ideally, the data alignment circuit outputs the output clock signals DQS, BDQS with a matched, predetermined duty cycle of 50% and/or with an actual cross-point level at a target cross-point level. However, in actual implementation, the data alignment circuit 106 may output the output clock signals DQS, BDQS with some amount of duty cycle distortion and/or cross-point distortion. Having too much duty cycle distortion and/or cross-point distortion in the output clock signals DQS, BDQS may lead to too many errors when the controller 2202 is receiving the data signals. For example, too high of duty cycle distortion and/or cross-point distortion may cause the data pulses of the data signal(s) to not be sufficiently aligned with the pulses of the output clock signals DQS, BDQS, which in turn may cause the controller 2202 to sample the level of the same data pulse twice and/or to miss sampling a data pulse. In addition or alternatively, if a clock pulse of the output clock signals DQS, BDQS is too small, sampling circuitry of the controller 2202 may filter out or otherwise not recognize a falling or rising edge of the output clock signals DQS, BDQS, and in turn miss sampling a data pulse.

Two sources may be the cause of the duty cycle distortion and/or cross-point distortion in the output clock signals DQS, BDQS. First, the controller 2202 may generate and output the initial pair of complementary clock signals REin, BREin with distorted duty cycles. Second, the complementary signal path circuitry 2220 distort the duty cycles. Either or both of these sources may cause the data alignment circuit to output the output signals DQS, BDQS with too high of an amount of duty cycle distortion if duty cycle correction is not performed and/or with too high of an amount of cross-point distortion if cross-point distortion is not performed.

As shown in FIG. 22, the controller 2218 of the correction system 2201 may be coupled to the lines on which the complementary signal path circuitry 2220 outputs the output clock signals DQS, BDQS to the controller 2202, or is otherwise configured to receive the output clock signals DQS, BDQS. As previously described, the controller 102 may be configured to search for and/or select drive strength values and output drive strength signals DS to the RE and BRE stages with the complementary signal path circuitry 2220 in order to correct for duty cycle distortion and/or cross-point distortion.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
   a complementary signal path circuit configured to receive a pair of complementary input signals and generate a pair of complementary output signals, wherein the complementary signal path circuit comprises:
      a plurality of pairs of circuit stages, wherein each pair of circuit stages is configured to generate a respective one of a plurality of pairs of complementary intermediate signals; and
   a control circuit configured to:
      measure a cross-point distortion of a pair of complementary sample signals; and in response to the measurement, set drive strengths of the plurality of pairs of circuit stages.

2. The circuit of claim 1, wherein the control circuit is further configured to:
in response to the measurement of the cross-point distortion, select a target drive strength value from among a plurality of drive strength values, the target drive strength value indicating a plurality of drive strength amounts; and
set each pair of circuit stages of the plurality of pairs of circuit stages to a respective one of the plurality of drive strength amounts indicated by the drive strength value.

3. The circuit of claim 2, wherein the control circuit is further configured to:
set each pair of circuit stages of the plurality of pairs of circuit stages also to an initial drive strength amount, wherein each of the plurality of drive strength amounts indicated by the drive strength value is lower than the initial drive strength amount.

4. The circuit of claim 2, wherein the target drive strength value corresponds to a digital-to-analog converter (DAC) code indicating whether to activate or deactivate each of a plurality of branches of the set of circuit stages.

5. The circuit of claim 1, wherein branches of the circuit stages of the plurality of pairs of circuit stages comprise a binary-weighted configuration.

6. The circuit of claim 1, wherein a circuit stage of the plurality of pairs of circuit stages comprises a plurality of drive strength sub-branches and a plurality of stability sub-branches, wherein a respective stability sub-branch is configured to bias a respective drive strength sub-branch in response to an associated drive strength sub-signal output at a level to deactivate the drive strength sub-branch.

7. The circuit of claim 1, wherein a circuit stage of the plurality of pairs of circuit stages comprises:
a plurality of drive strength transistors configured to set a pull-up drive strength of a pull-up portion of the circuit stage or a push-down drive strength of a push-down portion of the circuit stage; and
a plurality of input transistors connected in parallel with each other, the plurality of input transistors configured to receive an input signal of the complementary input signals or an intermediate signal of the plurality of pairs of complementary intermediate signals,
wherein a length of a first physical connection that connects together terminals of the plurality of input transistors is shorter than a length of a second physical connection that connects together terminals of the plurality of drive strength transistors.

8. The circuit of claim 1, wherein the pair of complementary sample signals comprises the pair of complementary output signals.

9. A system comprising:
an output circuit configured to generate a pair of output signals based on a plurality of intermediate signals;
a measurement circuit configured to measure a cross-point distortion of a plurality of complementary sample signals during a predetermined number of iterations;
a search circuit configured to:
search through an array of digital-to-analog converter (DAC) codes in response to the cross-point distortion during the predetermined number of iterations; and
a plurality of pairs of DAC circuits configured to:
generate the plurality of intermediate signals; and
during the predetermined number of iterations, adjust slopes of rising and falling transitions of the plurality of intermediate signals in response to the searching through the array of DAC codes.

10. The circuit of claim 9, wherein the measurement circuit is further configured to measure the cross-point distortion of the pair of complementary sample signals a predetermined number of times over the predetermined number of iterations, and
wherein the search circuit is further configured to select a new one of a plurality of target DAC codes from the array of DAC codes in each of the predetermined number of iterations in response to a respective measurement of the cross-point distortion.

11. The circuit of claim 10, wherein the plurality of pairs of DAC circuits are configured to adjust the drive strengths in increasingly smaller amounts in response to each selection of the plurality of target DAC codes.

12. The circuit of claim 11, wherein each of the plurality of DAC codes comprises a respective plurality of portions, wherein each portion indicates a drive strength amount for a corresponding pair of DAC circuits,
wherein the plurality of DAC codes comprises a first set of DAC codes and a second set of DAC codes, wherein each of the DAC codes of the first set comprises respective portions that all indicate the same drive strength amount, and wherein each of the DAC codes of the second set comprises at least two respective portions that indicate different drive strength amounts, and
wherein the search circuit is further configured to:
select a first number of the plurality of target DAC codes from the first set of DAC codes in a first number of the predetermined number of iterations; and
select a second number of the plurality of DAC codes from the second set of DAC codes in a second number of the predetermined number of iterations.

13. The circuit of claim 12, wherein the first number of the predetermined number of iterations is greater than the second number of the predetermined number of iterations.

14. The circuit of claim 9, wherein the search circuit is further configured to:
in response to an initial measurement of the cross-point distortion, begin selecting target DAC codes from among the array of DAC codes in a selection direction corresponding to decreasing drive strength amounts.

15. A circuit comprising:
a slope adjustment circuit comprising a plurality of portions configured to generate a plurality of pairs of intermediate signals, each portion of the plurality of portions comprising a pull-up portion or a push-down portion,
wherein the plurality of portions comprises:
a first set of portions configured to pull up and push down voltage levels of the plurality of pairs of intermediate signals with an initial drive strength amount; and
a second set of portions configured to pull up and push down the voltage levels of the plurality of pairs of intermediate signals with associated reduced drive strength amounts relative to the initial drive strength amount, and
a control circuit configured to:
identify an initial polarity of a cross-point distortion in a pair of complementary sample signals;
identify a configuration of the first set of portions and the second set of portions dependent on the initial polarity of the cross-point distortion; and output drive strength signals to set drive strengths of the portions of the first set to the initial drive strength amount, and to set drive strengths of the portions of the second set to the associated reduced drive strength amounts.

16. The circuit of claim 15, wherein the control circuit is further configured to:
in response to an identification that the initial polarity of the cross-point distortion comprises a negative polarity:
identify the second set of portions as comprising:
pull-up portions that are part of a first set of circuit stages, each circuit stage of the first set of circuit stages configured to generate an associated one of a first set of intermediate signals with an initially positive cross-point distortion; and
push-down portions that are part of a second set of circuit stages, each circuit stage of the second set of circuit stages configured to generate an associated one of a second set of intermediate signals with an initially negative cross-point distortion.

17. The circuit of claim 15, wherein the control circuit is further configured to:
in response to an identification that the initial polarity of the cross-point distortion comprises a positive polarity:
identify the second set of portions as comprising:
push-down portions that are part of first set of circuit stages, each circuit stage of the first set of circuit stages configured to generate an associated one of a first set of intermediate signals with an initially negative cross-point distortion; and
pull-up portions that are part of a second set of circuit stages, each circuit stage of the second set of circuit stages configured to generate an associated one of a second set of intermediate signals with an initially positive cross-point distortion.

18. The circuit of claim 15, further comprising a plurality of pairs of circuit stages comprising the plurality of portions, and wherein the control circuit is configured to identify the first set of portions and the second set of portions further based on an identification of circuit stages configured to generate intermediate signals with cross-point distortion having a same initial polarity as the initial polarity of the cross-point distortion of the pair of complementary sample signals, and an identification of circuit stages configured to generate intermediate signals with cross-point distortion having an opposite initial polarity from the initial polarity of the cross-point distortion of the pair of complementary sample signals.

19. The circuit of claim 18, wherein each pair of circuit stages of the plurality of pairs of circuit stages comprises a pair of pull-up portions and a pair of push-down portions, and wherein the control circuit is configured to identify, for each pair of circuit stages, that an associated pair of pull-up portions is part of the first set of portions and an associated pair of push-down portions is part of the second set of portions, or an associated pair of push-down portions is part of the first set of portions and an associated set of pull-up portions is part of the second set of portions.

20. The circuit of claim 18, wherein the plurality of pairs of circuit stages comprises two consecutive circuit stages of a path, wherein one of the consecutive circuit stages comprises a pull-up portion that is part of the first set of portions and a push-down portion that is part of the second set of portions, and the other of the consecutive stages comprises a push-down portion that is part of the first set of portions and a pull-up portion that is part of the second set of portions.

21. A circuit comprising:
means for receiving a pair of complementary input signals;
means for generating a plurality of pairs of complementary intermediate signals according to a plurality of drive strengths in response to the pair of complementary input signals;
means for measuring cross-point distortion of a pair of complementary sample signals; and
means for setting the plurality of drive strengths in response to the means for measuring the cross-point distortion.

* * * * *